United States Patent
Tsai et al.

(10) Patent No.: US 12,132,024 B2
(45) Date of Patent: Oct. 29, 2024

(54) SEMICONDUCTOR PACKAGE AND METHOD OF MANUFACTURING THE SAME

(71) Applicant: Taiwan Semiconductor Manufacturing Company, Ltd., Hsinchu (TW)

(72) Inventors: Hao-Yi Tsai, Hsinchu (TW); Tzuan-Horng Liu, Taoyuan County (TW); Cheng-Chieh Hsieh, Tainan (TW); Tsung-Yuan Yu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 209 days.

(21) Appl. No.: 17/460,301

(22) Filed: Aug. 29, 2021

(65) Prior Publication Data

US 2023/0065941 A1 Mar. 2, 2023

(51) Int. Cl.
*H01L 23/00* (2006.01)
*H01L 21/56* (2006.01)
*H01L 23/538* (2006.01)

(52) U.S. Cl.
CPC ............ *H01L 24/19* (2013.01); *H01L 21/568* (2013.01); *H01L 23/5389* (2013.01); *H01L 24/13* (2013.01); *H01L 24/96* (2013.01); *H01L 2221/68345* (2013.01); *H01L 2224/04105* (2013.01); *H01L 2224/16238* (2013.01); *H01L 2224/2205* (2013.01); *H01L 2224/73265* (2013.01); *H01L 2924/1815* (2013.01)

(58) Field of Classification Search
None
See application file for complete search history.

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |

(Continued)

*Primary Examiner* — Jay C Chang
(74) *Attorney, Agent, or Firm* — JCIPRNET

(57) ABSTRACT

A semiconductor package includes a first semiconductor die, a second semiconductor die, an insulating encapsulation, and a plurality of conductive pillars. The second semiconductor die is located on and electrically communicates to the first semiconductor die through joints therebetween. The insulating encapsulation encapsulates the first semiconductor die and the second semiconductor die and covers the joints. The plurality of conductive pillars is next to and electrically connected to the first semiconductor die and the second semiconductor die, and is covered by the insulating encapsulation.

20 Claims, 37 Drawing Sheets

(56) References Cited

U.S. PATENT DOCUMENTS

| | | |
|---|---|---|
| 9,735,131 B2 | 8/2017 | Su et al. |
| 2015/0171006 A1* | 6/2015 | Hung ................... H01L 24/19 |
| | | 257/774 |
| 2018/0012865 A1* | 1/2018 | Schrock .............. H01L 23/4334 |
| 2019/0148276 A1* | 5/2019 | Chen ................... H01L 21/486 |
| | | 257/774 |
| 2020/0058622 A1* | 2/2020 | Chen .................. H01L 23/3114 |
| 2020/0105635 A1* | 4/2020 | Yu ...................... H01L 23/3677 |
| 2020/0185330 A1* | 6/2020 | Yu ......................... H01L 24/19 |
| 2020/0343184 A1* | 10/2020 | Fujishima ............ H01L 23/481 |
| 2022/0375817 A1* | 11/2022 | Berntson ............ H01L 23/3735 |

\* cited by examiner

SEMICONDUCTOR PACKAGE AND METHOD OF MANUFACTURING THE SAME

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
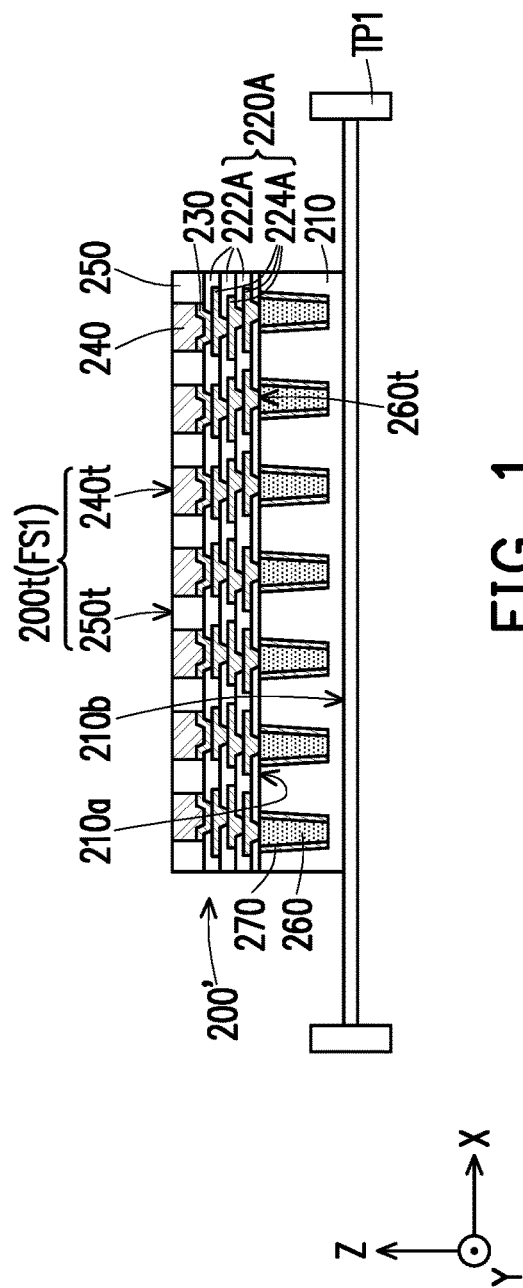
FIG. 1 through FIG. 14 are schematic cross-sectional views showing a method of manufacturing a semiconductor package in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 14:
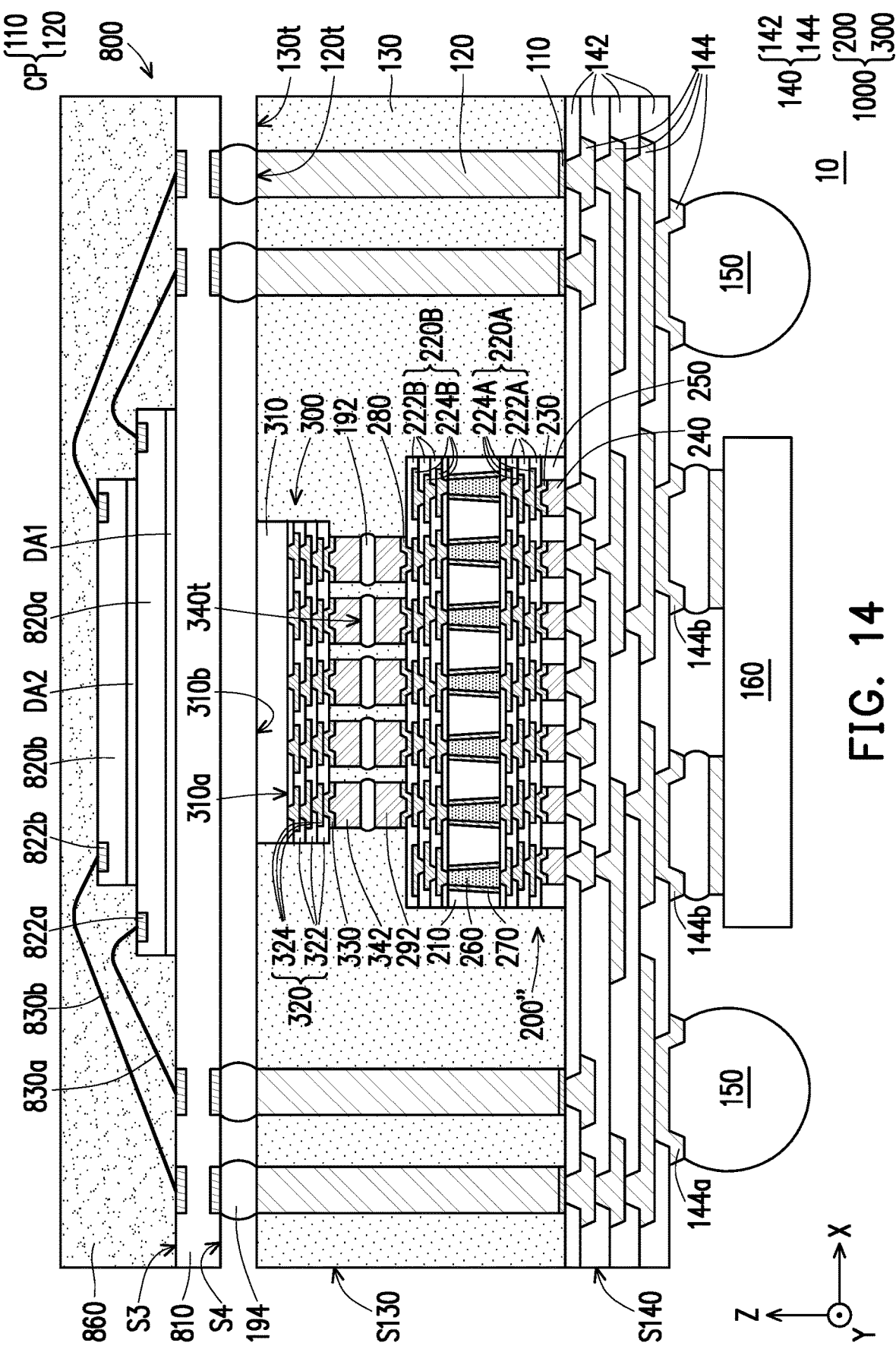
Figure 15:
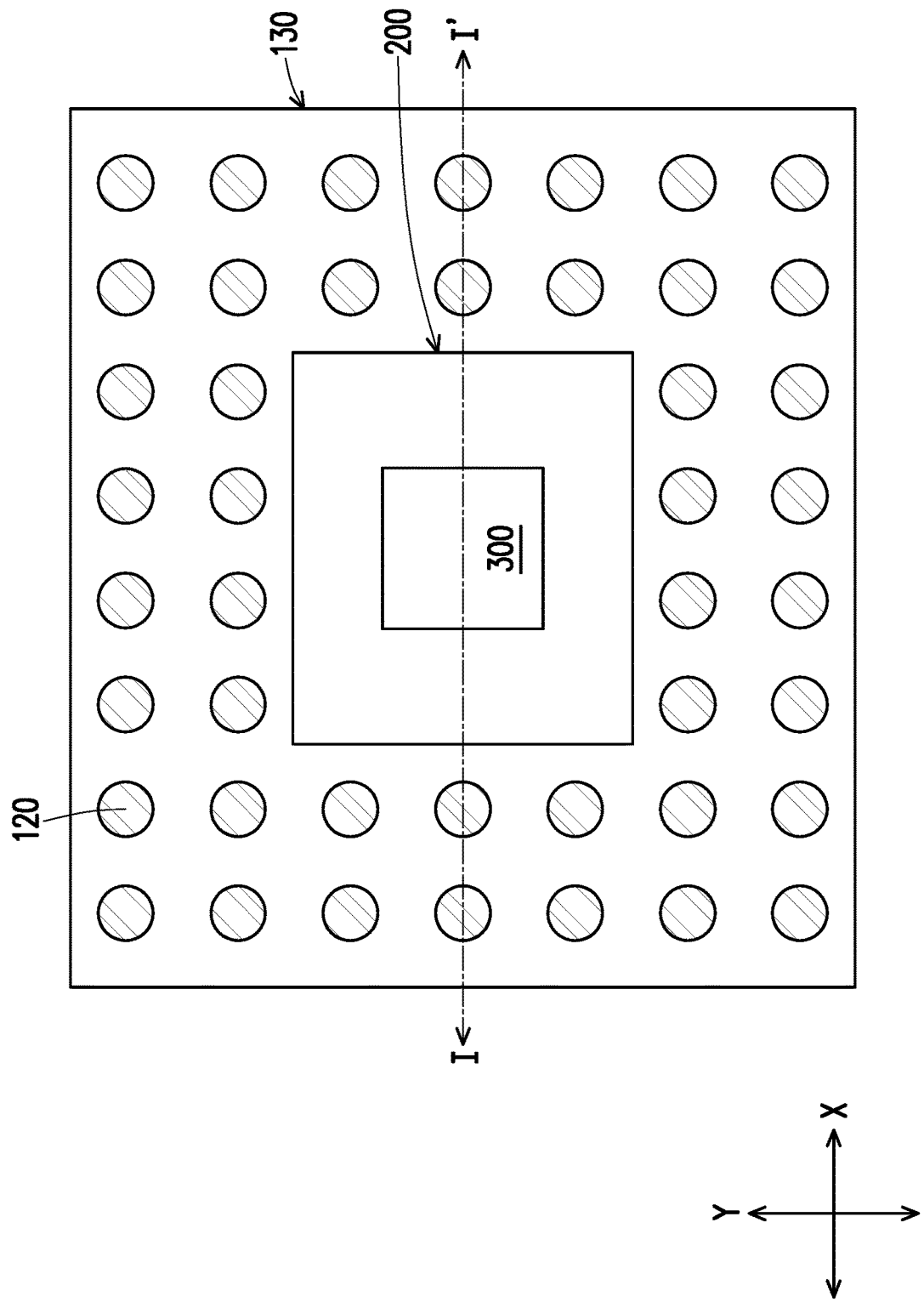
FIG. 15 is a schematic top view illustrating a relative position of semiconductor dies, conductive pillars and an insulating encapsulation in a semiconductor package in accordance with some embodiments of the disclosure.
Figure 16:
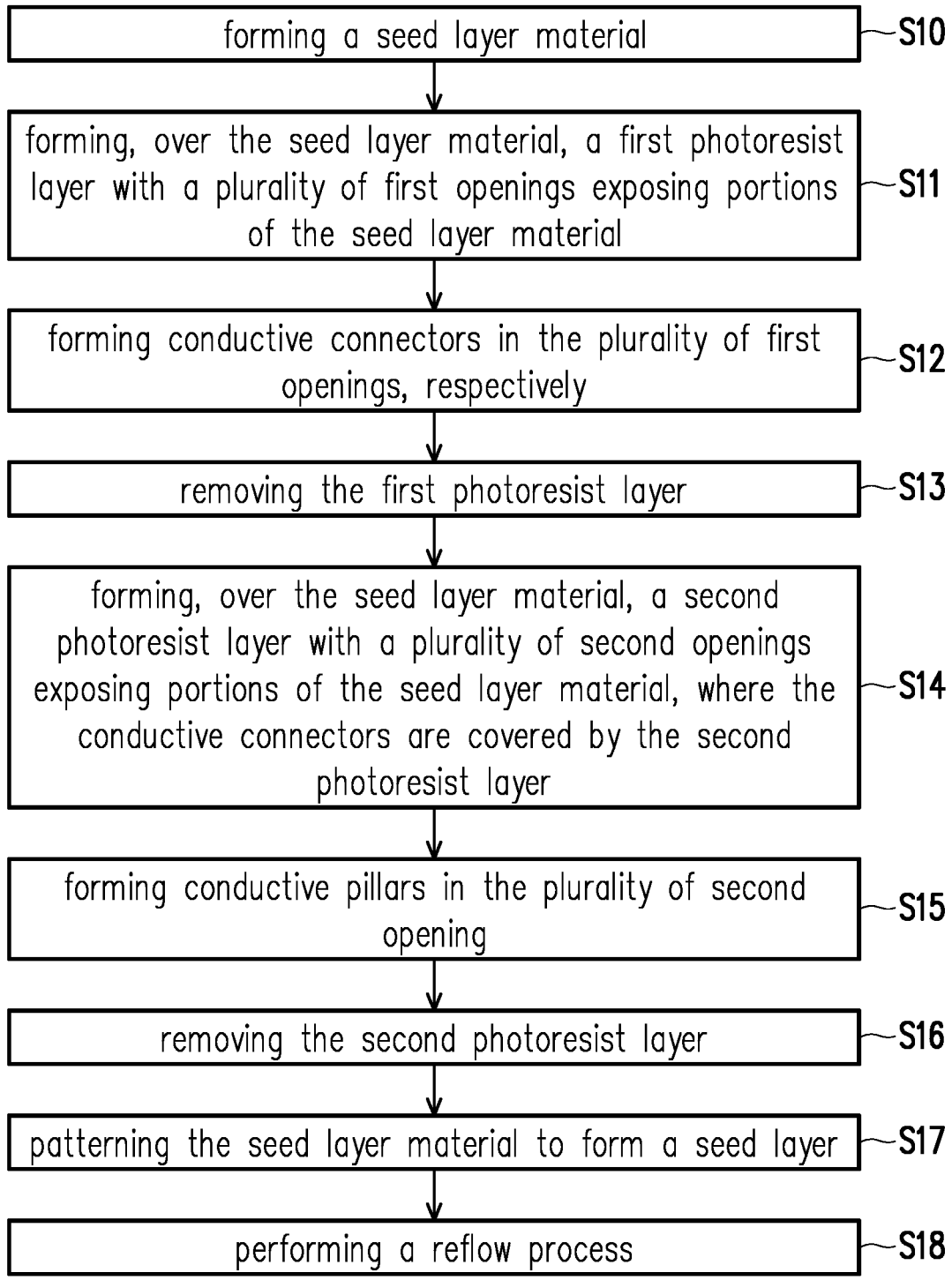
FIG. 16 is a flow chart illustrating a part of a method of manufacturing a semiconductor package in accordance with some embodiments of the disclosure.

FIG. 1 through FIG. 14 are schematic cross-sectional views showing a method of manufacturing a semiconductor package in accordance with some embodiments of the disclosure. FIG. 15 is a schematic top view illustrating a relative position of semiconductor dies, conductive pillars and an insulating encapsulation in a semiconductor package in accordance with some embodiments of the disclosure. FIG. 16 is a flow chart illustrating a portion of a method of manufacturing (conductive pillars and connecting terminals of) a semiconductor package in accordance with some embodiments of the disclosure. In FIG. 1 to FIG. 14, one (semiconductor) chip or die is shown to represent plural (semiconductor) chips or dies of the wafer, and one semiconductor package is shown to represent plural semiconductor packages obtained following the (semiconductor) manufacturing method, the disclosure is not limited thereto. In other embodiments, one or more (semiconductor) chips or dies are shown to represent plural (semiconductor) chips or dies of the wafer, and one or more semiconductor packages are shown to represent plural semiconductor packages obtained following the (semiconductor) manufacturing method. In embodiments, the manufacturing method is part of a wafer level packaging process. It is to be noted that the process steps described herein cover a portion of the manufacturing processes used to fabricate a semiconductor package. The embodiments are intended to provide further explanations, but are not used to limit the scope of the disclosure. For example, FIG. 14 is the schematic cross-sectional view of a semiconductor package 10 taken along a cross-sectional line I-I' depicted in FIG. 15.

Referring to FIG. 1, in some embodiments, a first wafer (not shown) including a plurality of semiconductor dies 200' is provided over a tape frame TP1, and a dicing process is performed to cut the first wafer along a cutting line (shown as the dotted line in FIG. 1) into individual and separated semiconductor dies 200'. Only one semiconductor die 200' is shown in FIG. 1 for illustrative purposes and for simplicity; the disclosure is not limited thereto. In one embodiment, the dicing process is a wafer dicing process including mechanical blade sawing or laser cutting. In some embodiments, before dicing/singulating, the semiconductor dies 200' included in the first wafer are tested for functionality and performance by probing, and only known good dies (KGDs) from the tested semiconductor dies 200' are selected and used for subsequently processing.

In addition, before dicing/singulating, the semiconductor dies 200' may be arranged in an array in the first wafer. In some embodiments, the semiconductor dies 200' are arranged in the form of a matrix, such as a N×N array or a N×M array (N, M>0, N may or may not be equal to M) along a direction X and a direction Y. The direction X and the direction Y are not the same to each other and are perpendicular to each other, for example. That is, before dicing/singulating, the semiconductor dies 200' of the first wafer are connected to one another, in some embodiments.

As shown in FIG. 1, the semiconductor die 200' may be referred to as a semiconductor die or chip including a digital chip, analog chip or mixed signal chip. In some embodiments, the semiconductor die 200' is a logic die such as a central processing unit (CPU), a graphics processing unit (GPU), a neural network processing unit (NPU), a deep learning processing unit (DPU), a tensor processing unit (TPU), a system-on-a-chip (SoC), an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA); a combination thereof; or the like. In alternative embodiments, the semiconductor die 200' is a memory die with a controller or without a controller, where the memory die includes a single-form die such as a dynamic random access memory (DRAM) die, a static random access memory (SRAM) die, a resistive random-access memory (RRAM), a magnetoresistive random-access memory (MRAM), a NAND flash memory, a wide I/O memory (WIO), a pre-stacked memory cube such as a hybrid memory cube (HMC) module, a high bandwidth memory (HBM) module; a combination thereof; or the like. In further alternative embodiments, the semiconductor die 200' is an artificial intelligence (AI) engine such as an AI accelerator; a computing system such as an AI server, a high-performance computing (HPC) system, a high power computing device, a cloud computing system, a networking system, an edge computing system, a immersive memory computing system (ImMC), a SoC system, etc.; a combination thereof; or the like. In some other embodiments, the semiconductor die 200' is an electrical and/or optical input/output (I/O) interface die, an integrated passives die (IPD), a voltage regulator die (VR), a local silicon interconnect die (LSI) with or without deep trench capacitor (DTC) features, a local silicon interconnect die with multi-tier functions such as electrical and/or optical network circuit interfaces, IPD, VR, DTC, or the like. The type of the semiconductor die 200' may be selected and designated based on the demand and design requirement, and thus is not specifically limited in the disclosure.

In some embodiments, the semiconductor die 200' includes a semiconductor substrate 210 having semiconductor devices (not shown) formed therein, an interconnect structure 220A formed on the semiconductor substrate 210, a plurality of connecting pads 230 formed on the interconnect structure 220A, a plurality of connecting vias 240 formed on the connecting pads 230, a protection layer 250 covering the interconnect structure 220A, the connecting pads 230 and the connecting vias 240, and a plurality of conductive pillars 260 formed (embedded) in the semiconductor substrate 210. In some embodiments, the semiconductor substrate 210 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 210 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. The compound semiconductor substrate may have a multilayer structure, or the substrate may include a multilayer compound semiconductor structure. The alloy SiGe may be formed over a silicon substrate. The SiGe substrate may be strained.

In some embodiments, the semiconductor substrate 210 includes the semiconductor devices formed therein or thereon, where the semiconductor devices include active devices (e.g., transistors, diodes, etc.) and/or passive devices (e.g., capacitors, resistors, inductors, etc.), or other suitable electrical components. In some embodiments, the semiconductor devices are formed at an active surface 210a of the semiconductor substrate 210 proximal to the interconnect structure 220A. In some embodiments, as shown in FIG. 1, the semiconductor substrate 210 has the active surface 210a and a bottom surface 210b opposite to the active surface 210a along a stacking direction Z of the interconnect structure 220A and the semiconductor substrate 210, and the interconnect structure 220A is disposed on and covers the active surface 210a of the semiconductor substrate 210. The stacking direction Z is different from and substantially perpendicular to the direction X and the direction Y, for example.

The semiconductor substrate 210 may include circuitry (not shown) formed in a front-end-of-line (FEOL), and the interconnect structure 220A may be formed in a back-end-of-line (BEOL). In some embodiments, the interconnect structure 220A includes an inter-layer dielectric (ILD) layer formed over the semiconductor substrate 210 and covering the semiconductor devices, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, borophosphosilicate glass (BPSG), phosphosilicate glass (PSG), fluorinated silicate glass (FSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 220A includes one or more dielectric layers 222A and one or more metallization layers 224A in alternation. The metallization layers 224A may be embedded in the dielectric layers 222A. In some embodiments, the interconnect structure 220A is electrically coupled to the semiconductor devices formed in and/or on the semiconductor substrate 210 to one another and to external components (e.g., test pads, bonding conductors, etc.) formed thereon. For example, the metallization layers 224A in the dielectric layers 222A route electrical signals between the semiconductor devices of the semiconductor substrate 210. The semiconductor devices and the metallization layers 224A are interconnected to perform one or more functions including memory structures (e.g., a memory cell), processing structures (e.g., a logic cell), input/output (I/O) circuitry (e.g. an I/O cell), or the like. The uppermost layer of the interconnect structure 220A may be a passivation layer made of one or more suitable dielectric materials such as silicon oxide, silicon nitride, low-k dielectrics, polyimide (PI), combinations of these, or the like. In some embodiments, as shown in FIG. 1, the passivation layer (e.g. the uppermost layer of the dielectric layers 222A) of the interconnect structure 220A has an opening exposing at least a portion of a topmost layer of the metallization layers 224A for further electrical connection.

The dielectric layers 222A may be PI, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process.

In some embodiments, the dielectric layers 222A are formed by suitable fabrication techniques such as spin-on coating, chemical vapor deposition (CVD), plasma-enhanced chemical vapor deposition (PECVD) or the like.

The metallization layers 224A may be made of conductive materials formed by electroplating or deposition, such as copper, copper alloy, aluminum, aluminum alloy, or combinations thereof, which may be patterned using a photolithography and etching process. In some embodiments, the metallization layers 224A are patterned copper layers or other suitable patterned metal layers. For example, may be metal lines, metal vias, metal pads, metal traces, etc. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The numbers of the dielectric layers 222A and the number of the metallization layers 224A are not limited in the disclosure, and may be selected and designated based on demand and design layout.

In some embodiments, as illustrated in FIG. 1, the connecting pads 230 are disposed over and electrically coupled to the topmost layer of the metallization layers 224A of the interconnect structure 220A exposed by the passivation layer (e.g. the uppermost layer of the dielectric layers 222A) of the interconnect structure 220A for testing and/or further electrical connection. The connecting pads 230 may be made of aluminum, copper, or alloys thereof or the like, and may be formed by an electroplating process. The disclosure is not limited thereto. Some of the connecting pads 230 may be testing pads, and some of the connecting pads 230 may be conductive pads for further electrical connection. In some embodiments, the connecting pads 230 may be optional for simple structure and cost benefits.

In some embodiments, the connecting vias 240 may directly connect to the uppermost metallization layers 224A.

In some embodiments, the connecting vias 240 are respectively disposed on and electrically connected to the connecting pads 230 for providing an external electrical connection to the circuitry and semiconductor devices. In one embodiment, the connecting vias 240 may be formed of conductive materials such as copper, gold, aluminum, the like, or combinations thereof, and may be formed by an electroplating process or the like. The connecting vias 240 may be bond vias, bond pads or bond bumps, or combinations thereof. The disclosure is not limited thereto. The connecting vias 240 may serve as bonding conductors for further electrical connection and may be formed over the connecting pads 230 (serving as the conductive pads for further electrical connection). The connecting vias 240 may be electrically coupled to the semiconductor devices of the semiconductor substrate 210 through the interconnect structure 220A and the connecting pads 230.

In some embodiments, the protection layer 250 is formed on the interconnect structure 220A to cover the interconnect structure 220A and the connecting pads 230 and to laterally cover the connecting vias 240. That is to say, the protection layer 250 prevents any possible damage(s) occurring on the connecting pads 230 and the connecting vias 240 during the transfer of the first wafer. In addition, in some embodiments, the protection layer 250 further acts as a passivation layer for providing better planarization and evenness. In some embodiments, top surfaces 240t of the connecting vias 240 are substantially leveled with a surface 250t of the protection layer 250 for further electrical connection, as shown in FIG. 1. In some embodiments, the top surface 250t of the protection layer 250 and the top surfaces 240t of the connecting vias 240 may be referred to as a top surface 200t of the semiconductor die 200'. For example, the top surface 200t of the semiconductor die 200' is a front-side surface FS1 of the semiconductor die 200'.

The protection layer 250 may include one or more layers of dielectric materials, such as silicon nitride, silicon oxide, high-density plasma (HDP) oxide, tetra-ethyl-ortho-silicate (TEOS), undoped silicate glass (USG), silicon oxynitride, PBO, PI, silicon carbon, silicon carbon oxynitride, diamond like carbon (DLC), and the like, or a combination thereof. It should be appreciated that the protection layer 250 may include etch stop material layer(s) (not shown) interposed between the dielectric material layers depending on the process requirements. For example, the etch stop material layer is different from the overlying or underlying dielectric material layer(s). The etch stop material layer may be formed of a material having a high etching selectivity relative to the overlying or underlying dielectric material layer(s) so as to be used to stop the etching of layers of dielectric materials.

In some embodiments, the conductive pillars 260 are embedded in the semiconductor substrate 210. For example, the conductive pillars 260 are formed in the semiconductor substrate 210 and extended from the active surface 210a towards the bottom surface 210b along the stacking direction Z. As shown in FIG. 1, top surfaces 260t of the conductive pillars 260 are substantially coplanar to the active surface 210a of the semiconductor substrate 210 to be in contact with a bottommost layer of the metallization layers 224A exposed by a lowest layer of the dielectric layers 222A of the interconnect structure 220A. In some embodiments, the conductive pillars 260 are not accessibly revealed by the bottom surface 210b of the semiconductor substrate 210. In some embodiments, the conductive pillars 260 may be tapered from the interconnect structure 220A to the bottom surface 210b. Alternatively, the conductive pillars 260 have substantially vertical sidewalls.

In a cross-sectional view along the stacking direction Z, the shape of the conductive pillars 260 may depend on the design requirements, and is not intended to be limiting in the disclosure. For example, in a top (plane) view on a X-Y plane perpendicular to the stacking direction Z, the shape of the conductive pillars 260 is circular shape. However, depending on the design requirements, and the shape of the conductive pillars 260 may be an oval shape, a rectangular shape, a polygonal shape, or combinations thereof; the disclosure is not limited thereto.

In some embodiments, the conductive pillars 260 are in physical contact with the bottommost layer of the metallization layers 224A of the interconnect structure 220A exposed by the lowest layer of the dielectric layers 222A of the interconnect structure 220A at the active surface 210a, as illustrated in FIG. 1. That is, the conductive pillars 260 are electrically connected to the semiconductor devices in the semiconductor substrate 210 through the interconnect structure 220A, and are electrically connected to the connecting vias 240 through the interconnect structure 220A and the connecting pads 230. The conductive pillars 260 may be formed of a conductive material, such as copper, tungsten, aluminum, silver, combinations thereof, or the like.

In some embodiments, each of the conductive pillars 260 is covered by a liner 270.

For example, the liners 270 are formed between the conductive pillars 260 and the semiconductor substrate 210. In some embodiments, a sidewall of each of the conductive pillars 260 may be covered by the respective one liner 270. In alternative embodiments, a bottom surface and the sidewall of each of the conductive pillars 260 may be covered by the respective one liner 270. The liners 270 may be formed of a barrier material, such as TiN, Ta, TaN, Ti, or the like. In alternative embodiments, a dielectric liner (not shown) (e.g., silicon nitride, an oxide, a polymer, a combination thereof, etc.) may be further optionally formed between the liners 270 and the semiconductor substrate 210. In some embodiments, the conductive pillars 260, the liners 270 and the optional dielectric liner are formed by forming recesses in the semiconductor substrate 210 and respectively depositing the dielectric material, the barrier material, and the conductive material in the recesses, removing excess materials on the semiconductor substrate 210. For example, the recesses of the semiconductor substrate 210 are lined with the dielectric liner so as to laterally separate the liners 270 lining sidewalls of the conductive pillars 260 from the semiconductor substrate 210. The conductive pillars 260 are formed by using a via-first approach, in certain embodiments. In such embodiments, the conductive pillars 260 are formed prior to the formation of the interconnect structure 220A. As shown in FIG. 1, in some embodiments, the conductive pillars 260 are separated from the semiconductor substrate 210 through at least the liners 270. Alternatively, the liners 270 may be omitted.

Alternatively, the conductive pillars 260 may be formed by using a via-last approach, and may be formed after the formation of interconnect structure 220A. The disclosure is not limited thereto. The number of the dielectric layers 222A and the numbers of the metallization layers 224A of the interconnect structure 220A, the number of the connecting pads 230, the number of the connecting vias 240 and the number of the conductive pillars 260 within each of the semiconductor die 200' are not limited to the disclosure, and may be selected and designated based on the demand and design layout.

Figure 2:
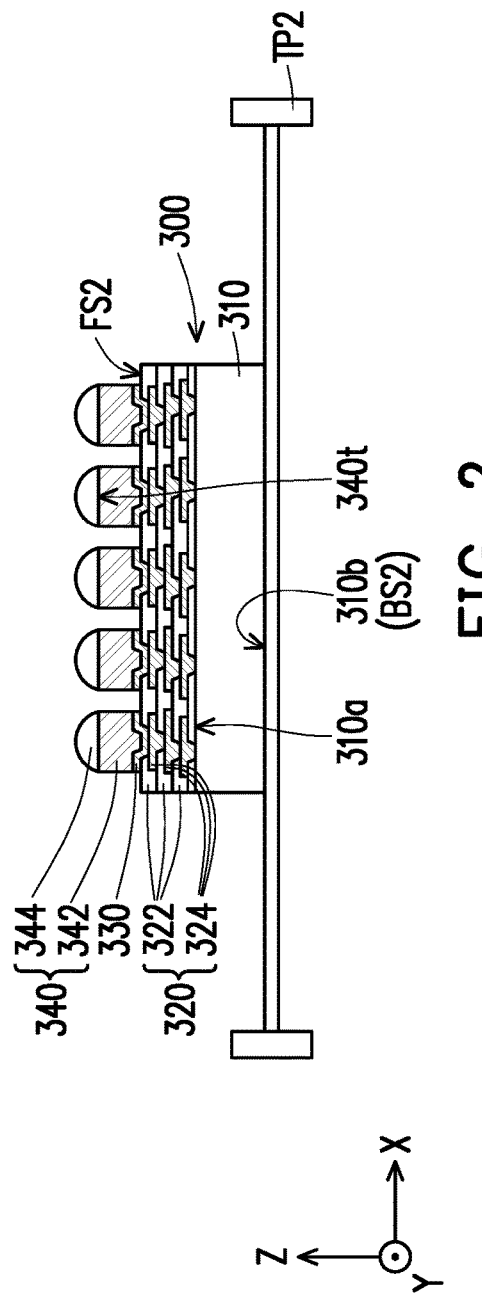

Referring to FIG. 2, in some embodiments, a second wafer (not shown) including a plurality of semiconductor dies 300 is provided over a tape frame TP2, and a dicing process is performed to cut the second wafer along a cutting line (shown as the dotted line in FIG. 2) into individual and separated semiconductor dies 300. Only one semiconductor die 300 is shown in FIG. 2 for illustrative purposes and for simplicity; the disclosure is not limited thereto. In one embodiment, the dicing process is a wafer dicing process including mechanical blade sawing or laser cutting. In some embodiments, before dicing/singulating, the semiconductor dies 300 included in the second wafer are tested for functionality and performance by probing, and only known good dies (KGDs) from the tested semiconductor dies 300 are selected and used for subsequently processing. The semiconductor dies 300 included in the second wafer may have an arrangement similar to or the same as the arrangement of the semiconductor dies 200' included in the first wafer as described in FIG. 1, and thus are not repeated herein.

In some embodiments, as shown in FIG. 2, the semiconductor die 300 includes a semiconductor substrate 310 having semiconductor devices (not shown) formed therein, an interconnect structure 320 formed on the semiconductor substrate 310, a plurality of connecting pads 330 formed on the interconnect structure 320, and a plurality of connecting connectors 340 formed on the connecting pads 330. In some embodiments, the semiconductor substrate 310 includes the semiconductor devices formed therein or thereon, where the semiconductor devices include active devices (e.g., transistors, diodes, etc.) and/or passive devices (e.g., capacitors, resistors, inductors, etc.), or other suitable electrical components. In some embodiments, the semiconductor devices are formed at an active surface 310a of the semiconductor substrate 310 proximal to the interconnect structure 320. In some embodiments, as shown in FIG. 2, the semiconductor substrate 310 has the active surface 310a and a bottom surface 310b opposite to the active surface 310a along the stacking direction Z of the interconnect structure 320 and the semiconductor substrate 310, and the interconnect structure 320 is disposed on and covers the active surface 310a of the semiconductor substrate 310. In some embodiments, the interconnect structure 320 includes one or more dielectric layers 322 and one or more metallization layers 324 in alternation. In some embodiments, the connecting pads 330 are disposed over and electrically coupled to the topmost layer of the metallization layers 324 of the interconnect structure 320 exposed by the passivation layer (e.g. the uppermost layer of the dielectric layers 322) of the interconnect structure 320 for testing and/or further electrical connection.

The formation and material of the semiconductor substrate 310 are similar to or identical to the formation and material of the semiconductor substrate 210 as described in FIG. 1, the formation and material of the interconnect structure 320 are similar to or identical to the formation and material of the interconnect structure 220A as described in FIG. 1, and the formation and material of the connecting pads 330 are similar to or identical to the formation and material of the connecting pads 230 as described in FIG. 1; thus are not repeated herein for brevity. In some embodiments, the bottom surface 310b may be referred to as a backside surface BS2 of the semiconductor die 300, and an outer surface of the topmost layer of the dielectric layers 322 and an outer surface of the topmost layer of the metallization layers 324 exposing by the connecting pads 330 and the connecting connectors 340 may be referred to as a front-side surface FS2 of the semiconductor die 300.

In some embodiments, as illustrated in FIG. 2, the connecting connectors 340 are respectively disposed on and electrically connected to the connecting pads 330 for providing an external electrical connection to the circuitry and semiconductor devices. In some embodiments, each of the connecting connectors 340 includes a connecting via 342 and a metal cap 344 disposed on a top surface 342t of the connecting via 342, where the metal cap 344 is electrically connected to the connecting via 342. In some embodiments, the metal caps 344 are respectively formed on the top surface 342t of the connecting via 342 by, for example, plating, printing, or the like and followed by a reflow process. For example, a material of the metal caps 344 includes nickel, tin, tin-lead, gold, silver, palladium, nickel-palladium-gold, nickel-gold, the like, or any combination of these. In addition, the formation and material of the connecting vias 342 are similar to or identical to the formation and material of the connecting via 240 as described in FIG. 1; thus, are not repeated herein for brevity. In some embodiments, the connecting connectors 340 are referred to as micro-bumps.

The semiconductor die 300 may be the same as the semiconductor die 200'. For example, the semiconductor dies 200' and 300 can both be a logic die. In alternative embodiments, the semiconductor die 300 is different from the semiconductor die 200'. For example, the semiconductor die 200' can a logic die while the semiconductor die 300 can be a memory die, an AI engine or the like, an electrical and/or optical I/O interface die, an integrated passive die or the like, and so on.

Figure 3:
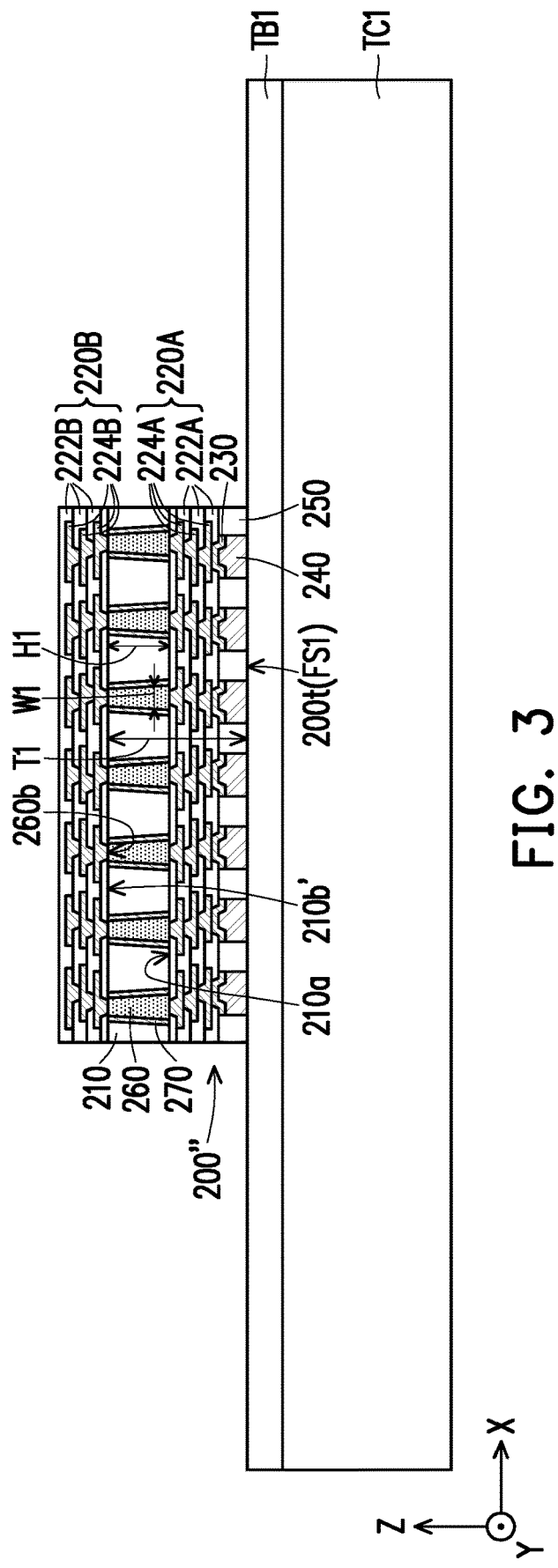

Referring to FIG. 3, in some embodiments, the semiconductor die 200' is placed on a temporary carrier TC1 by a temporary bonding layer TB1. For example, the semiconductor die 200', which is a known good die, is picked and placed on the temporary carrier TC1. In some embodiments, the top surface 200t of the semiconductor die 200' (e.g. the front-side surface FS1 the semiconductor die 200') is attached to the temporary carrier TC1 through the temporary bonding layer TB1, and a bottom surface of the semiconductor die 200' (e.g. the bottom surfaces 210b of the semiconductor substrate 210) faces upwardly for subsequent processing. In other words, the bottom surfaces 210b of the semiconductor substrate 210 is accessibly revealed.

A material of the temporary carrier TC1 may include glass, metal, ceramic, silicon, plastic, combinations thereof, multi-layers thereof, or other suitable material that can provide structural support for the semiconductor die 200' in subsequent processing. In some embodiments, the temporary carrier TC1 is made of glass, and the temporary bonding layer TB1 used to adhere the semiconductor die 200' to the temporary carrier TC1 includes a polymer adhesive layer (e.g., die attach film (DAF)), a ultra-violet (UV) cured layer, such as a light-to-heat conversion (LTHC) release coating, ultra-violet (UV) glue, which reduces or loses its adhesiveness when exposed to a radiation source (e.g., UV light or a laser).

Other suitable temporary adhesives may be used. In some embodiments, the temporary carrier TC1 is a silicon wafer, and the temporary bonding layer TB1 includes a silicon-containing dielectric material (e.g., silicon oxide, silicon nitride, etc.) or other suitable dielectric material(s) used for bonding. For example, the bonding includes oxide-to-oxide bonding, and the protection layer 250 of the semiconductor die 200' is bonded to the temporary bonding layer TB1. Alternatively, the temporary bonding layer TB1 may be omitted.

Continued on FIG. 3, in some embodiments, after placing the semiconductor die 200' over the temporary carrier TC1, the semiconductor die 200' is thinned to form the thinned semiconductor die 200'' having a bottom surface 210b' exposing bottom surface 260b of the conductive pillars 260 and the interconnect structure 220B being formed on the bottom surface 210b', where the interconnect structure 220B is electrically connected to the semiconductor devices formed in and/or on the semiconductor substrate 210 through the conductive pillars 260 and the interconnect structure 220A. In the thinned semiconductor die 200'', the conductive pillars 260, which penetrate through the semiconductor substrate 210, are referred to as through semiconductor vias (TSVs) or through silicon vias when the semiconductor substrate 210 is a silicon substrate. For example, as shown in FIG. 3, a thickness as measured from the top surface 200t to the bottom surface 210b' is approximately ranging from 5 μm to 25 μm. In some embodiments, a ratio of a width W1 to a height H1 is approximately ranging from 1 to 10.

In some embodiments, the interconnect structure 220B includes one or more dielectric layers 222B and one or more metallization layers 224B in alternation. The metallization layers 224B may be embedded in the dielectric layers 222B. As illustrated in in FIG. 3, the bottom surfaces 260b of the conductive pillars 260 are substantially coplanar to the bottom surface 210b' of the semiconductor substrate 210 to be in contact with a bottommost layer of the metallization layers 224B exposed by a lowest layer of the dielectric layers 222B of the interconnect structure 220B. In some embodiments, the formations and materials of the dielectric layers 222B and the metallization layers 224B of the interconnect structure 220B is identical to or similar to the formations and materials of the dielectric layers 222A and the metallization layers 224A of the interconnect structure 220A as described in FIG. 1; thus, are not repeated herein for brevity.

Figure 4:
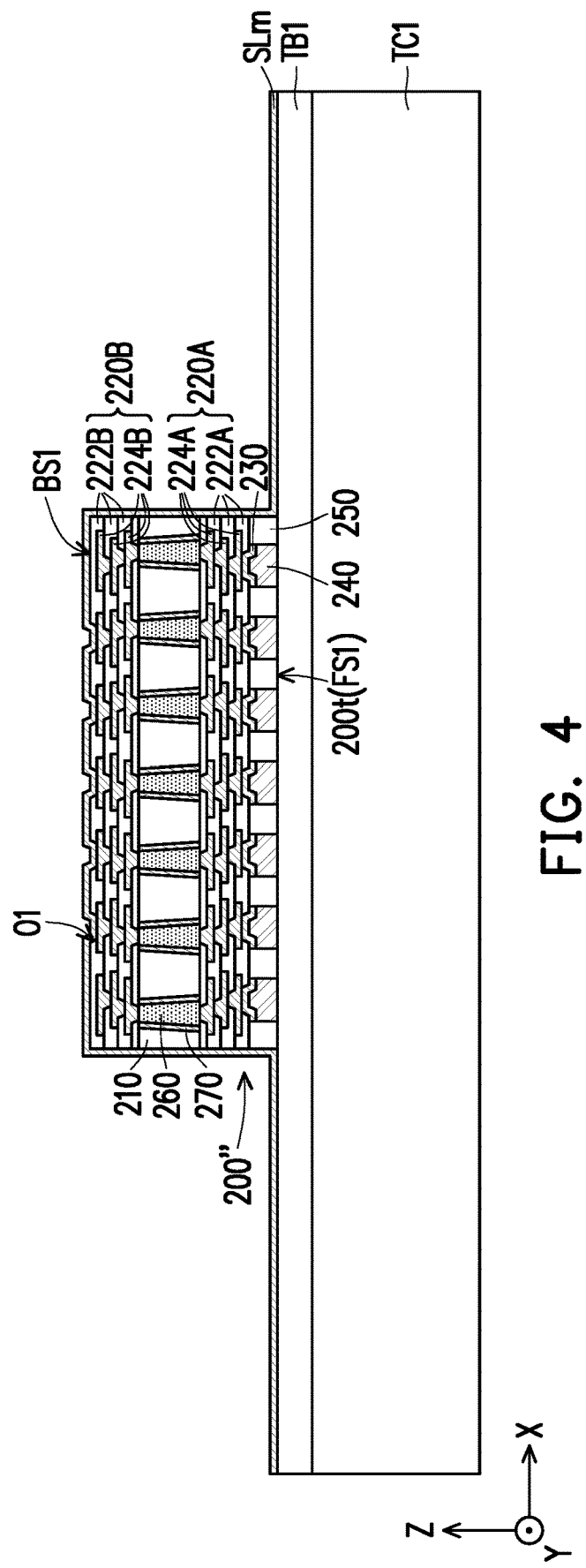

Referring to FIG. 4, in some embodiments, a seed layer material SLm is formed over the temporary carrier TC1 and on the thinned semiconductor die 200″, in accordance with step S10 of FIG. 16. For example, the seed layer material SLm is formed on the thinned semiconductor die 200″ and the temporary bonding layer TB1 in a form of a blanket layer made of metal or metal alloy materials to cover the thinned semiconductor die 200″ and the temporary bonding layer TB1 exposed by the thinned semiconductor die 200″. In some embodiments, the seed layer material SLm are referred as a metal layer, which may be a single layer or a composite layer comprising a plurality of sub-layers formed of different materials. In some embodiments, the seed layer material SLm may include titanium, copper, molybdenum, tungsten, titanium nitride, titanium tungsten, combinations thereof, or the like. For example, the seed layer material SLm may include a titanium layer and a copper layer over the titanium layer. The seed layer material SLm may be formed using, for example, sputtering, physical vapor deposition (PVD), or the like. In some embodiments, the seed layer material SLm may be conformally formed on the thinned semiconductor die 200″ and the temporary bonding layer TB1 by sputtering. In the disclosure, the seed layer material SLm is referred to as a metallic seed layer.

Before the formation of the seed layer material SLm, the topmost layer of the dielectric layers 222B is patterned to form a plurality of openings O1 to accessibly reveal portions of a topmost layer of the metallization 224B for further electrical connection. The patterning may be performed by photolithography and etching processes. The etching may include dry etching, wet etching, or a combination thereof. As shown in FIG. 4, in some embodiments, the seed layer material SLm is in physical contact with a sidewall and a backside surface BS1 (e.g., constituted by an outer surface of the topmost layer of the dielectric layers 222B and an outer surface of the topmost layer of the metallization layers 224A exposed therefrom of the interconnect structure 220B) of the thinned semiconductor die 200″ and an illustrated top surface of the temporary bonding layer TB1 exposed by the thinned semiconductor die 200″. In other words, the seed layer material SLm penetrates through the topmost layer of the dielectric layers 222B to be in physical and electrical contact with the topmost layer of the metallization layers 224 exposed therefrom, for example.

Figure 5:
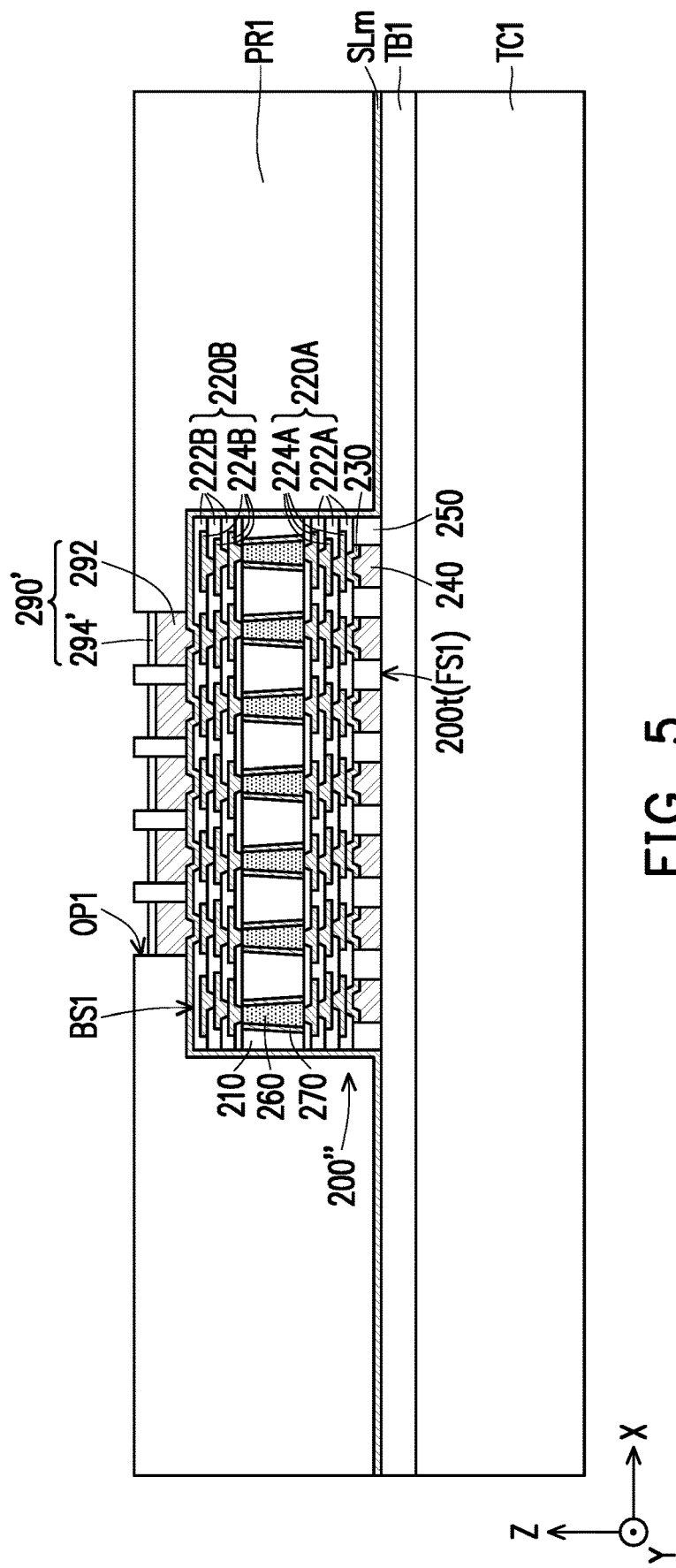
Figure 8:
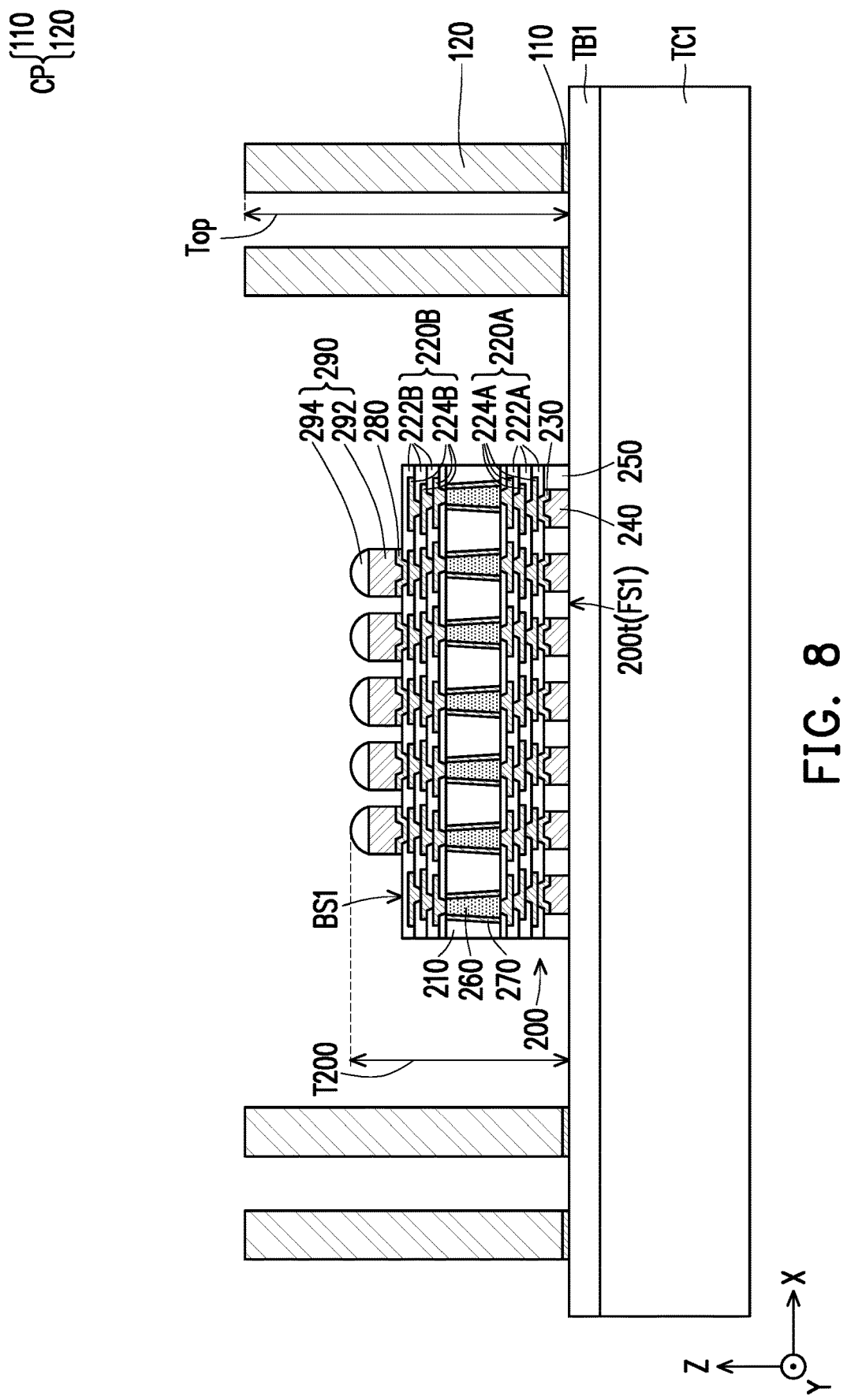

Referring to FIG. 5, in some embodiments, a patterned photoresist layer PR1 is formed on the seed layer material SLm, where the patterned photoresist layer PR1 includes at least one opening hole OP1 exposing a portion of the seed layer material SLm, in accordance with step S11 of FIG. 16. In some embodiments, a plurality of opening holes OP1 are formed in the patterned photoresist layer PR1 and over the thinned semiconductor die 200″. In one embodiment, the patterned photoresist layer PR1 may be formed by coating and photolithography processes or the like. However, the disclosure is not limited thereto. The number of the opening holes OP1 may, for example, correspond to the number of later-formed conductive structure(s) (such as connecting connectors 290 individually including a connecting vias 292 and a metal cap 292 disposed thereon, as depicted in FIG. 8). As shown in FIG. 5, portions of the seed layer material SLm corresponding to (e.g. covering) the openings O1 formed in the topmost layer of the dielectric layers 222B are exposed by the opening holes OP1 formed in the patterned photoresist layer PR1, respectively. In some embodiments, a material of the patterned photoresist layer PR1, for example, includes a positive resist material or a negative resist material, that is suitable for a patterning process such as a photolithography process with a mask or a mask-less photolithography process (for instance, an electron-beam (e-beam) writing or an ion-beam writing). The disclosure is not limited thereto.

In some embodiments, in each of the opening holes OP1, one connecting via 292 and one pre-metal cap 294′ are sequentially formed (in accordance with step S12 of FIG. 16), where the pre-metal cap 294′ is electrically connected to the connecting via 292. The formation and material of the connecting vias 292 are identical to or similar to the formation and material of the connecting vias 240 as described in FIG. 1, and thus are omitted for simplicity. In some embodiments, the pre-metal cap 294′ are respectively formed on top surfaces (not labeled) of the connecting vias 292 by, for example, plating, printing, or the like. For example, a material of the pre-metal cap 294′ includes nickel, tin, tin-lead, gold, silver, palladium, nickel-palladium-gold, nickel-gold, the like, or any combination of these. For simplification, only five connecting vias 292 and five pre-metal caps 294′ are presented in FIG. 5 for illustrative purposes, however, it should be noted that more than five connecting vias 292 and five pre-metal caps 294′ may be formed; the disclosure is not limited thereto. The numbers of the connecting vias 292 and the pre-metal caps 294′ can be selected based on the demand, and adjusted by changing the number of the opening holes OP1.

Figure 6:
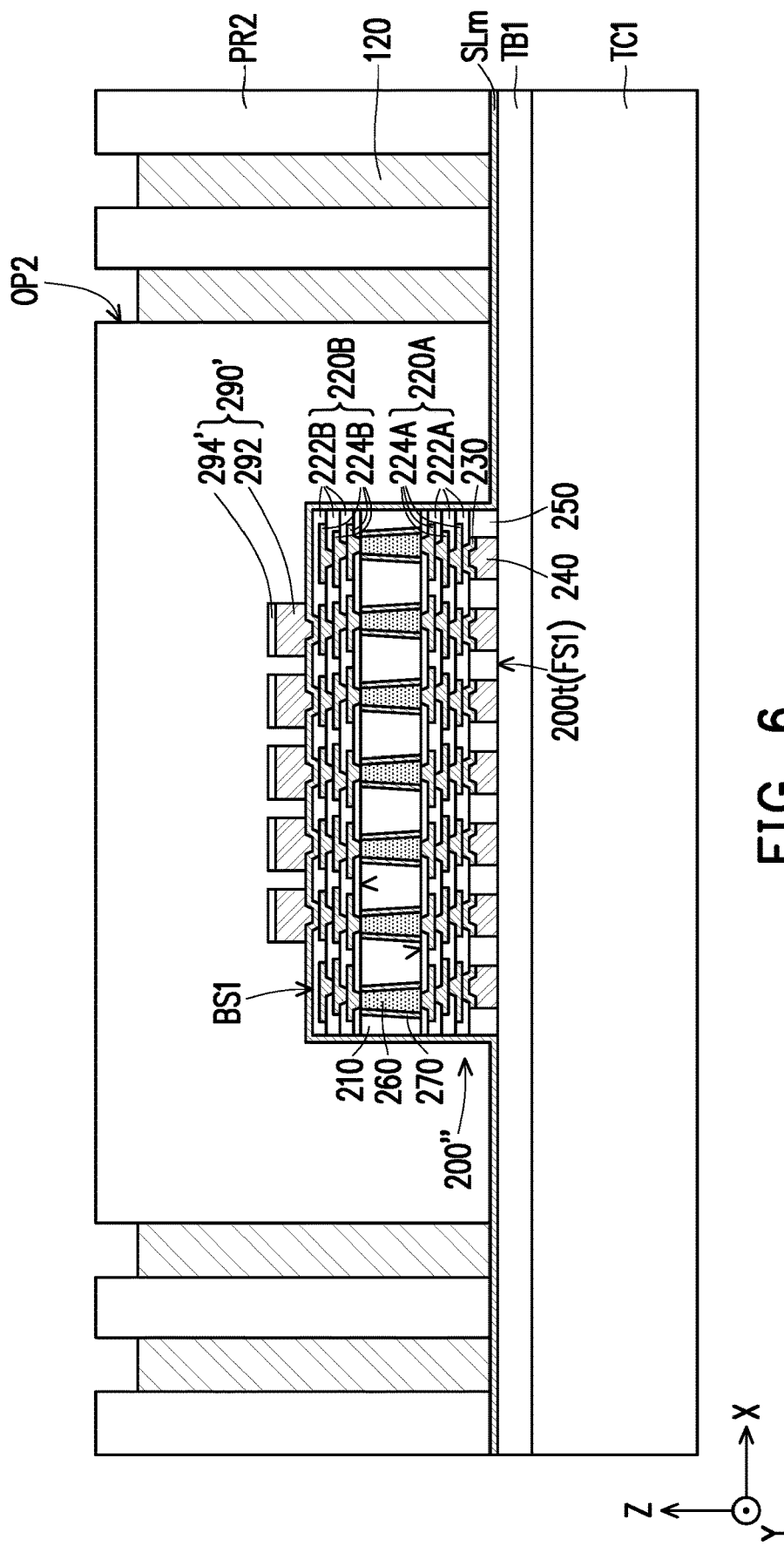

Referring to FIG. 5 and FIG. 6, in some embodiments, after the connecting vias 292 and the pre-metal caps 294′ are formed, the patterned photoresist layer PR1 is removed from the structure depicted in FIG. 5, in accordance with step S13 of FIG. 16. In some embodiments, the patterned photoresist layer PR1 is removed to expose the seed layer material SLm not covered by the connecting vias 292 and the pre-metal caps 294′. In one embodiment, the patterned photoresist layer PR1 is removed by acceptable ashing process and/or photoresist stripping process, such as using an oxygen plasma or the like, and the disclosure is not limited thereto.

Thereafter, a patterned photoresist layer PR2 is formed on the seed layer material SLm, where the patterned photoresist layer PR2 includes at least one opening hole OP2 exposing another portion of the seed layer material SL, in accordance with step S14 of FIG. 16. In some embodiments, a plurality of opening holes OP2 are formed in the patterned photoresist layer PR2 and surround the thinned semiconductor die 200″, where the thinned semiconductor die 200″, the connecting vias 292 and the pre-metal cap 294′ are completely covered by the patterned photoresist layer PR2. The formation and material of the patterned photoresist layer PR2 may be similar to or the same as the formation and material of the patterned photoresist layer PR1; thus, are not repeated therein. The number of the opening holes OP2 may, for example, correspond to the number of later-formed conductive structure(s) (such as connecting pillars 120).

Continued on FIG. 6, in some embodiments, the conductive pillars 120 are formed in the opening holes OP2 formed in the patterned photoresist layer PR2 and stand on the seed layer material SLm, in accordance with step S15 of FIG. 16. In certain embodiments, the conductive pillars 120 may be referred to as through integrated fan-out (InFO) vias. In some embodiments, the conductive pillars 120 are arranged along but not on a cutting line (not shown) between two adjacent semiconductors packages (e.g., 10 depicted in FIG. 14). In some embodiments, the conductive pillars 120 are formed by plating process or any other suitable method, which the plating process may include electroplating or electroless plating, or the like. In one embodiment, the conductive pillars 120 may be formed by forming a metallic material filling the openings OP2 to form the conductive pillars 120 by electroplating or deposition. In one embodiment, the material of the conductive pillars 120 may include a metal material such as copper or copper alloys, or the like. For simplification, only four conductive pillars 120 are presented in FIG. 6 for illustrative purposes, however, it should be noted that more than four conductive pillars 120 may be formed; the disclosure is not limited thereto. The number of the conductive pillars 120 can be selected based on the demand, and adjusted by changing the number of the opening holes OP2.

After the conductive pillars 120 are formed, the patterned photoresist layer PR2 are removed, in accordance with step S16 of FIG. 16. In one embodiment, the patterned photoresist layer PR2 is removed by acceptable ashing process and/or photoresist stripping process, such as using an oxygen plasma or the like. The disclosure is not limited thereto.

Figure 7:
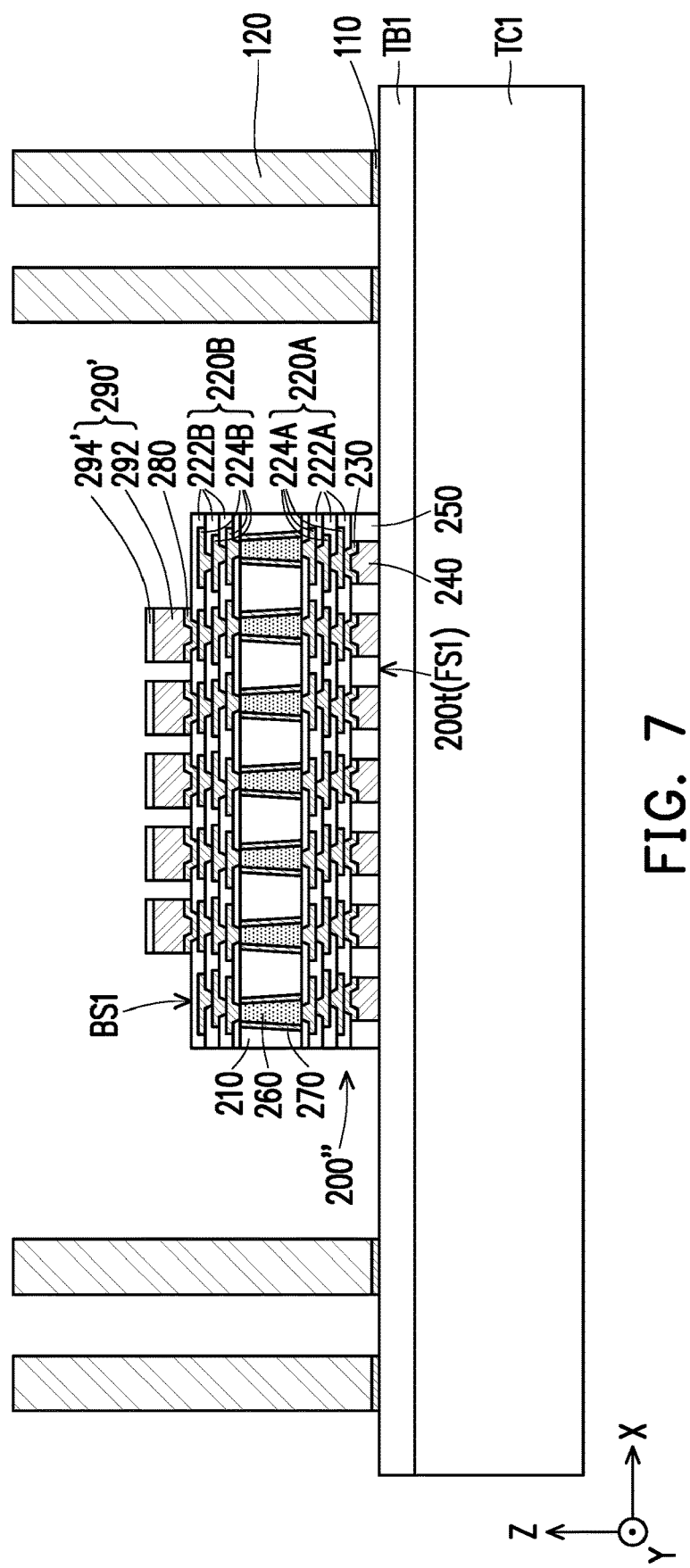

Referring to FIG. 7, in some embodiments, the seed layer material SLm is patterned to form a seed layer SL having a plurality of first patterns 110 and a plurality of second patterns 280 surrounded by the first patterns 110, in accordance with step S17 of FIG. 16. For example, the first patterns 110 is located between the temporary bonding layer TB1 and the conductive pillars 120, and electrically connect to the conductive pillars 120, for example. On the other hand, the second patterns 280 are located between the connecting vias 292 and the topmost layer of the metallization layers 224B, and electrically connect to the connecting vias 292 and the interconnect structure 220B. In some embodiments, the first patterns 110 and the second patterns 280 are individually referred to as a seed layer pattern, which together constitute one seed layer (e.g., the seed layer SL).

The seed layer SL may be formed, but not limited to, by removing portions of the seed layer material SLm not covered by the conductive pillars 120 and the connecting vias 292. For example, the seed layer material SLm is etched to form the seed layer SL by using the conductive pillars 120 and the connecting vias 292 as an etching mask. For example, the etching process may include a dry etching process, a wet etching process or a combination thereof. As shown in FIG. 7, the seed layer SL includes one or more conductive segments (e.g. the first patterns 110 and second patterns 280) being mechanically and electrically isolated from one another, for example. In some embodiments, the seed layer SL each are mechanically and electrically connected to a respective one of the conductive pillars 120 or a respective one of the connecting vias 292, as shown in FIG. 7. In some embodiments, sidewalls of the seed layer SL (e.g. the first patterns 110 and second patterns 280) are aligned with sidewalls of a respective one of the conductive pillars 120 or sidewalls of a respective one of the connecting vias 292. In the disclosure, one conductive pillar 120 and a respective first pattern 110 connected thereto may be referred to as a through via CP.

Referring to FIG. 8, in some embodiments, a reflow process is performed on the pre-metal caps 294' to form metal caps 294 on the connecting vias 292 (in accordance with step S18 of FIG. 16); thereby forming a semiconductor die 200 with a plurality of connecting connectors 290. For example, the connecting connectors 290 each include one connecting via 292 and one metal cap 294, where the metal cap 294 is electrically connected to the interconnect structure 220B through the connecting via 240 and a respective one of the second patterns 280 of the seed layer SL. For simplification, only five connecting connectors 290 are presented in FIG. 8 for illustrative purposes, however, it should be noted that more than five connecting connectors 290 may be formed; the disclosure is not limited thereto. The number of the connecting connectors 290 can be selected based on the demand, and adjusted by changing the number of the opening holes OP1. In some embodiments, the connecting connectors 290 are referred to as micro-bumps.

For example, the connecting connectors 290 and the conductive pillars 120 are formed by sharing a same seed layer (e.g., SLm), where the connecting connectors 290 are formed in one plating step while the conductive pillars 120 are formed in other plating step, so that the forming method of the connecting connectors 290 and the conductive pillars 120 may be referred to as a two-step formation as shown in FIG. 16. For example, as shown in FIG. 8, a thickness T200 of the semiconductor die 200 is approximately ranging from 50 μm to 300 μm. In some embodiments, the thickness T200 is less than a thickness Tcp of each of the through vias CP.

Figure 9:
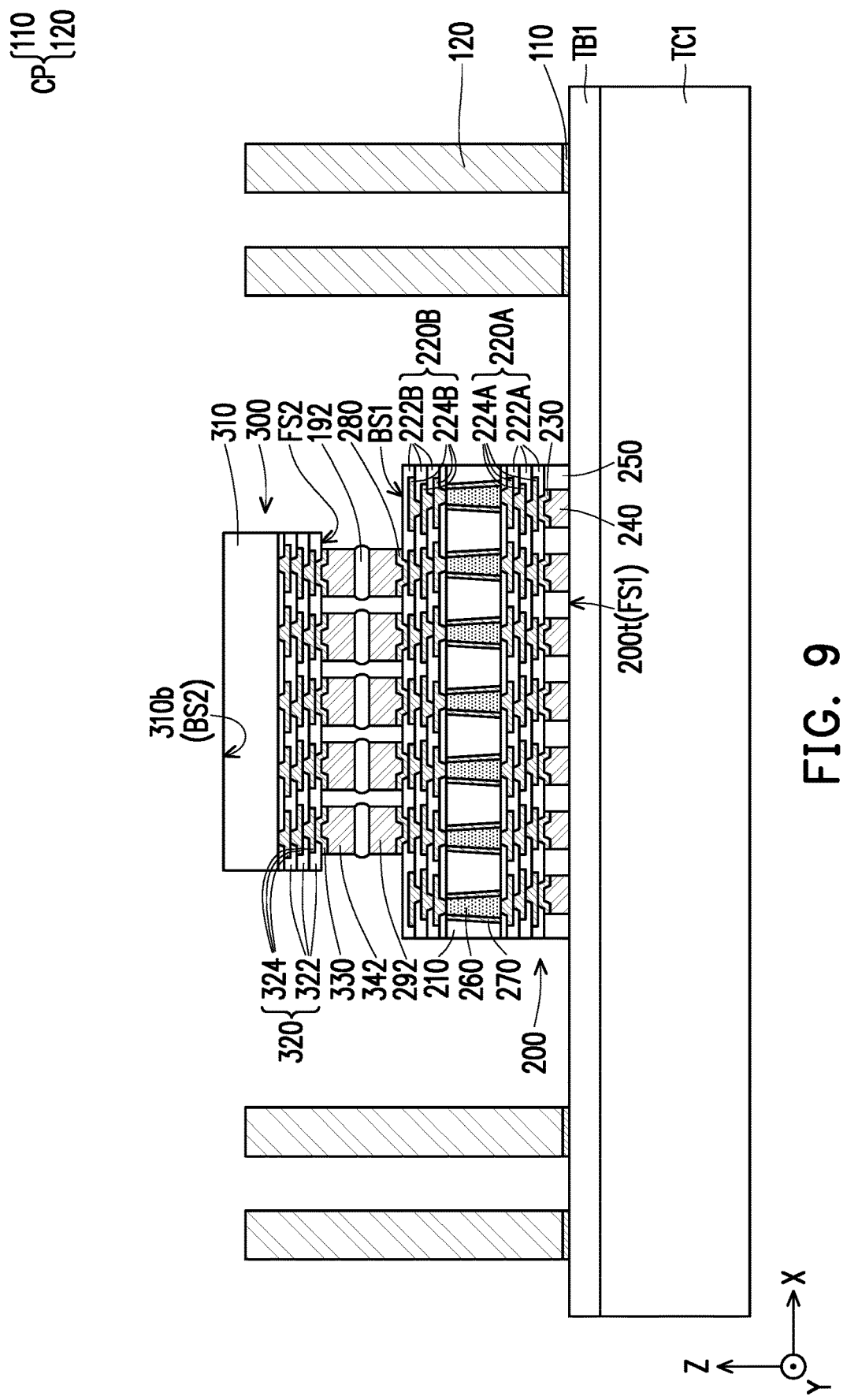

Referring to FIG. 9, in some embodiments, the semiconductor die 300 depicted in FIG. 2 is picked and placed on the semiconductor die 200, where the semiconductor die 300 is bonded to the semiconductor die 200 by flip chip bonding. For example, the semiconductor die 300 is mounted to the semiconductor die 200, where the metal caps 344 of the semiconductor die 300 are physically connected to the metal caps 294 of the semiconductor die 200 to form a plurality of joints 192 connecting the connecting vias 342 of the semiconductor die 300 and the connecting vias 292 of the semiconductor die 200. Through the joints 192, the semiconductor die 200 and the semiconductor die 300 are electrically coupled and electrically communicated to each other. As shown in FIG. 9, for example, the semiconductor die 300 is mounted to the semiconductor die 200 in a manner of face-to-back configuration (e.g., the front-side surface FS2 of the semiconductor die 300 facing toward the backside surface BS1 of the semiconductor die 200). In some embodiments, as shown in FIG. 9, the semiconductor die 300 is overlapped with the semiconductor die 200 in the stacking direction Z of the temporary carrier TC1 and the semiconductor die 200 (or saying, the stacking direction of the semiconductor die 200 and the semiconductor die 300).

Figure 10:
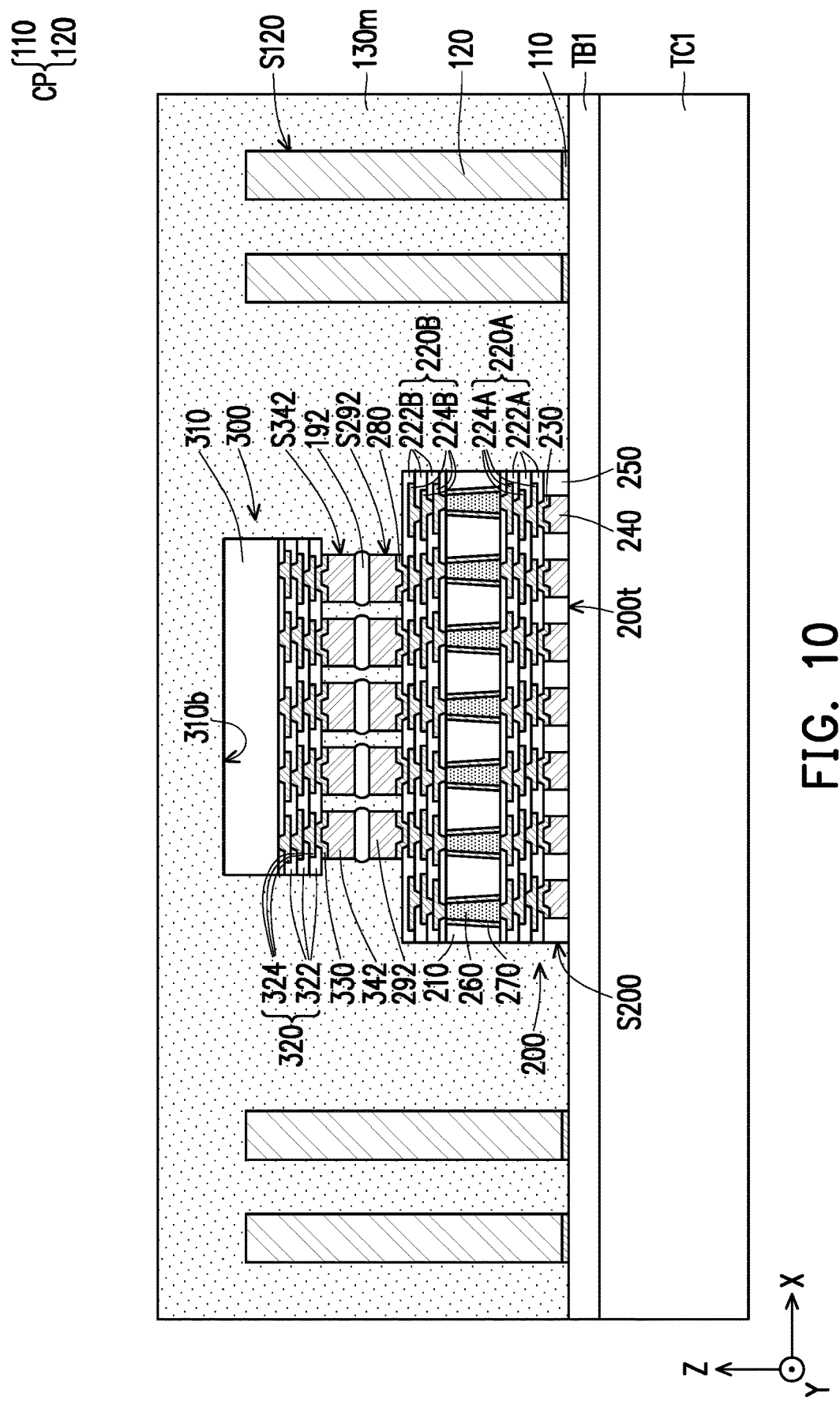

Referring to FIG. 10, in some embodiments, an insulating encapsulant 130*m* is formed over the temporary carrier TC1 to encapsulate the semiconductor die 200, the semiconductor die 300 and the through vias CP. In some embodiments, the insulating encapsulant 130*m* at least fills up the gaps between the semiconductor dies 200, 300 and the through vias CP and between the semiconductor dies 200 and 300. In other words, the semiconductor die 200, the semiconductor die 300, the joints 192 and the through vias CP (including the conductive pillars 120 and the first patterns 110) are covered by and embedded in the insulating encapsulant 130*m*. As shown in FIG. 10, for example, sidewalls S192 of the joints 192, sidewalls of the connecting vias 342 and sidewalls of the connecting vias 292 are covered by the insulating encapsulant 130*m*. On the other hands, a sidewall S200 of the semiconductor die 200, a sidewall S300 and the bottom surface 310*b* of the semiconductor die 300 and illustrated top surfaces and sidewalls S120 of the conductive pillars 120 are completely covered by the insulating encapsulant 130*m*.

In some embodiments, the insulating encapsulation 130*m* is a molding compound formed by a molding process. In some embodiments, the insulating encapsulation 130*m*, for example, may include polymers (such as epoxy resins, phenolic resins, silicon-containing resins, or other suitable resins), dielectric materials, or other suitable materials. In an alternative embodiment, the insulating encapsulation 130*m* may include an acceptable insulating encapsulation material. In some embodiments, the insulating encapsulation 130*m* may further include inorganic filler or inorganic compound (e.g. silica, clay, and so on) which can be added therein to optimize coefficient of thermal expansion (CTE) of the insulating encapsulation 130*m*. The disclosure is not limited thereto. For example, the insulating encapsulation 130*m* is made of a molded underfill (MUF) material.

Figure 11:
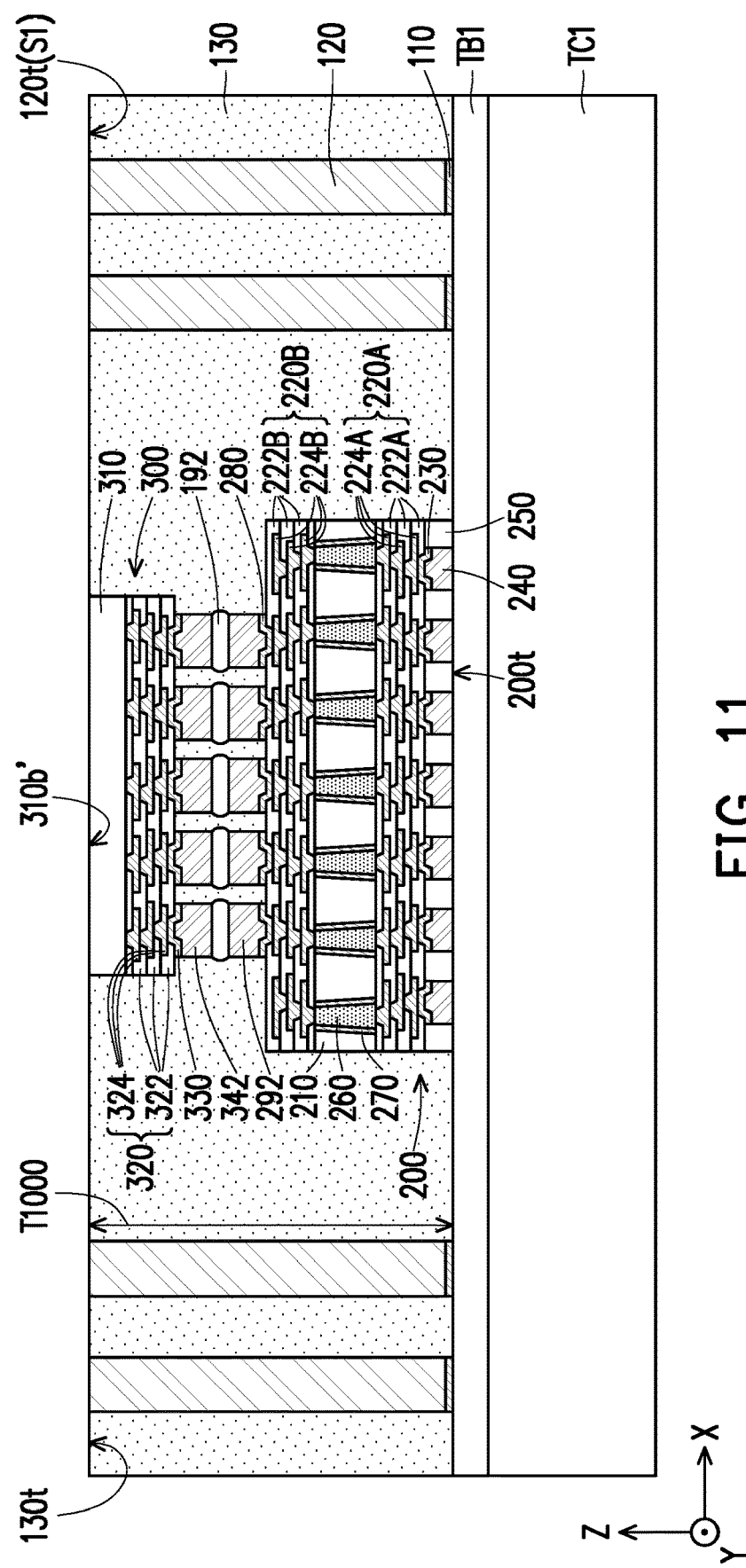

Referring to FIG. 10 and FIG. 11 together, in some embodiments, the insulating encapsulant 130*m* is planarized to form an insulating encapsulant 130 exposing the semiconductor die 300 and the conductive pillars 120. In some embodiments, after the planarization, a bottom surface 310*b*' (e.g. the backside surface BS2) of the semiconductor die 300 and top surfaces 120*t* of the conductive pillars 120 (e.g., surfaces S1 of the through vias CP) are exposed by a surface 130*t* of the insulating encapsulation 130. For example, the bottom surface 310*b*' of the semiconductor die 300 and the top surfaces 120*t* (e.g. S1) of the conductive pillars 120 become substantially leveled with the surface 130*t* of the insulating encapsulation 130. That is, the bottom surface 310*b*' of the semiconductor die 300 and the top surfaces 120*t* (e.g. S1) of the conductive pillars 120 are substantially coplanar to the surface 130*t* of the insulating encapsulation 130. In some embodiments, as shown in FIG. 11, the semiconductor die 300 and the conductive pillars 120 are accessibly revealed by the insulating encapsulation 130. Due to the semiconductor dies 200, 300 and the joints 192 therebetween are encapsulated by the insulating encapsulation 130 simultaneously encapsulating the conductive pillars 120, a manufacturing cost and time of the semiconductor package 10 are greatly reduced. Due to there is no interface between the insulating encapsulation 130 and an additional encapsulant (e.g., another molding compound or underfill), a better reliability of the semiconductor package 10 is achieved.

The insulating encapsulation 130*m* may be planarized by mechanical grinding, chemical mechanical polishing (CMP) or a combination thereof. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 130*m*, the semiconductor substrate 310 of the semiconductor die 300 and/or the conductive pillars 120 may also be planarized. In certain embodiments, the planarizing step may be, for example, performed on the overmolded insulating encapsulation 130*m* to level the surface 130*t* of the insulating encapsulation 130, the bottom surface 310*b*' of the semiconductor die 300 and the top surfaces 120*t* of the conductive pillars 120. In some embodiments, as shown in FIG. 11, the through vias CP penetrate through the insulating encapsulation 130 and surround a stack structure 1000 having the semiconductor dies 200 and 300. For example, as shown in FIG. 11, a thickness T1000 of the stack structure 1000 is approximately ranging from 100 μm to 300 μm.

Figure 12:
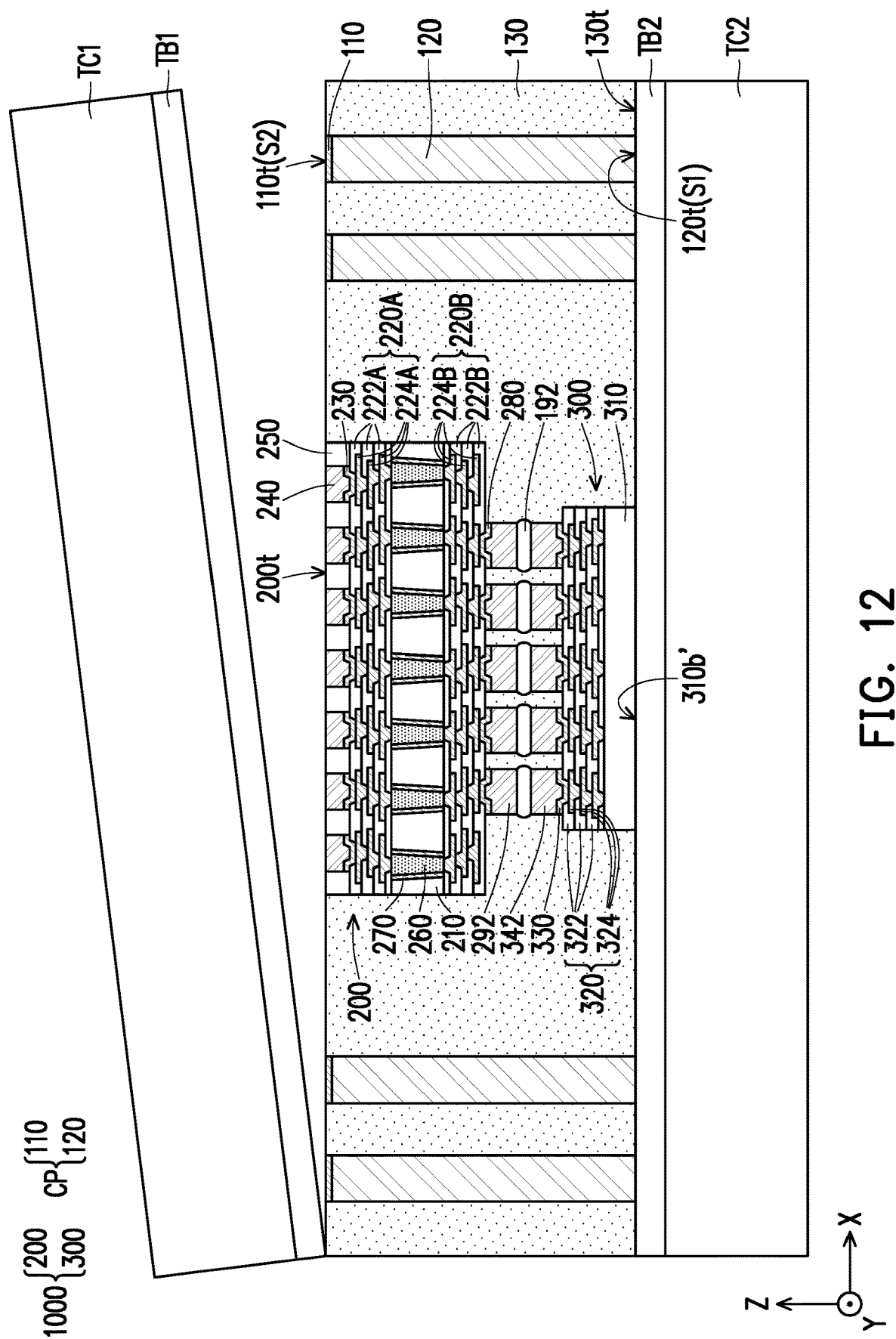

Referring to FIG. 12, in some embodiments, the whole structure depicted in FIG. 11 along with the temporary carrier TC1 is flipped (turned upside down), where the surface 130*t* of the insulating encapsulation 130, the bottom surface 310*b*' of the semiconductor die 300 and the surfaces S1 of the through vias CP (e.g., the top surfaces 120*t* of the conductive pillars 120) are placed on a temporary carrier TC2 by a temporary bonding layer TB2. Thereafter, the temporary carrier TC1 is debonded from a surface 130*b* of the insulating encapsulation 130 (opposing to the surface 130*t* in the stacking direction Z), the top surface 200*t* of the semiconductor die 200 (e.g., the top surfaces of the connecting vias 240 and the protection layer 250) and surfaces 110*t* of the first patterns 110 (e.g., surfaces S2 of the through vias CP) disposed on the conductive pillars 120.

In some embodiments, the surface 130*t* of the insulating encapsulation 130, the bottom surface 310*b*' of the semiconductor die 300 and the top surfaces 120*t* (e.g. S1) of the conductive pillars 120 are easily separated from the temporary carrier TC1 due to the temporary bonding layer TB1. In some embodiments, the temporary carrier TC1 is detached from the surface 130*t* of the insulating encapsulation 130, the bottom surface 310*b*' of the semiconductor die 300 and the top surfaces 120*t* (e.g. S1) of the conductive pillars 120 through a debonding process, and the temporary carrier TC1 and the temporary bonding layer TB1 are removed. In certain embodiments, the semiconductor die 200 and the through vias CP (e.g. the first patterns 110) are accessibly reveal, as show in FIG. 12. In one embodiment, the debonding process is a laser debonding process. As shown in FIG. 12, for example, the surface 130*b* of the insulating encapsulation 130, the top surface 200*t* of the semiconductor die 200 and the top surfaces 110*t* (e.g. S2) of the first patterns 110 disposed on the conductive pillars 120 are substantially coplanar to each other.

Figure 13:
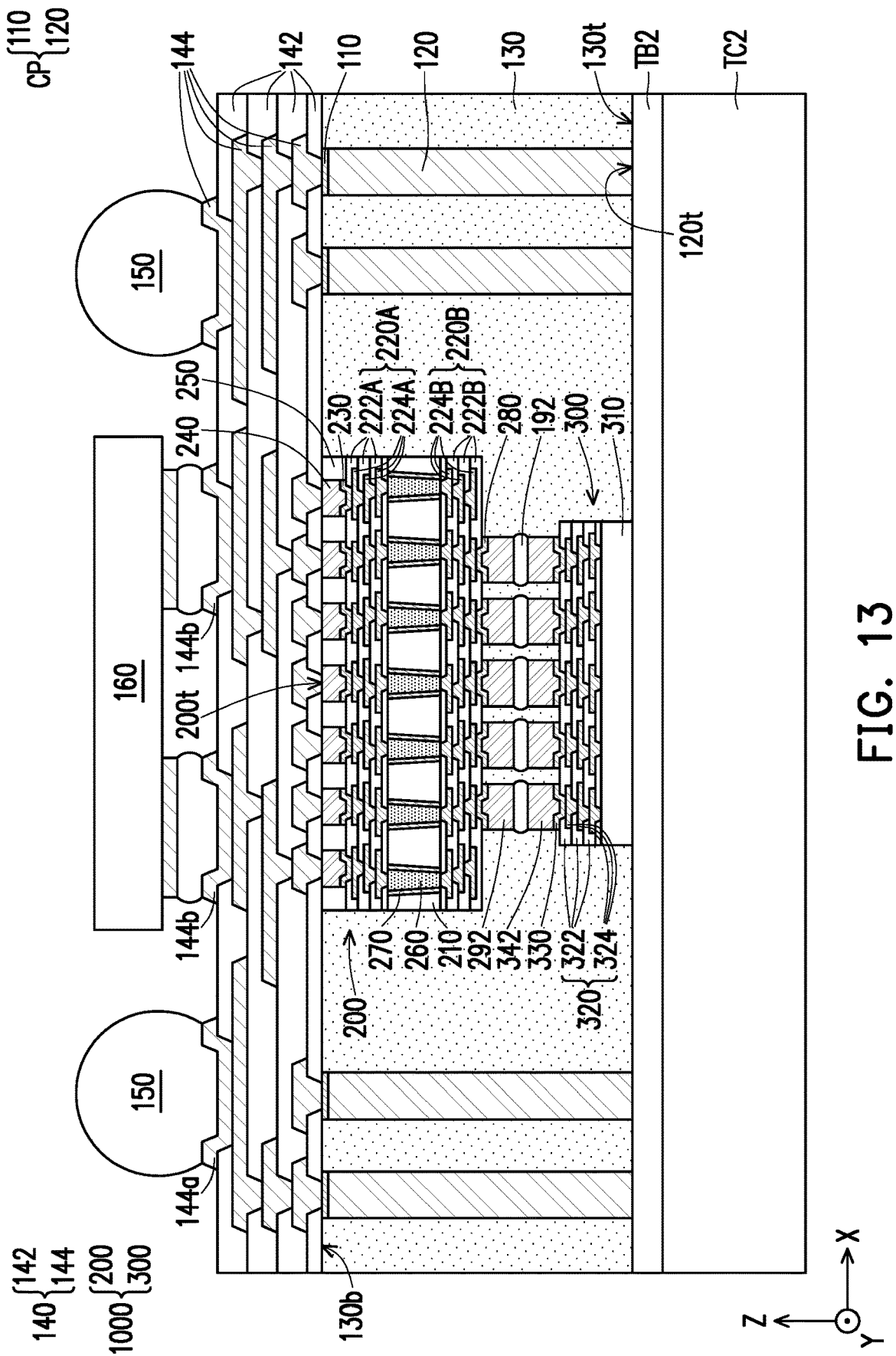

Referring to FIG. 13, in some embodiments, a redistribution circuit structure 140 is formed on the insulating encapsulation 130. In some embodiments, the redistribution circuit structure 140 is formed on the surface 130*b* of the insulating encapsulation 130, the surfaces S2 of the through vias CP (e.g., the top surfaces 110*t* of the first patterns 110), and the top surface 200*t* of the semiconductor die 200. In certain embodiments, the redistribution circuit structure 140 is fabricated to electrically connect with one or more connectors underneath. Here, the afore-said connectors may be the connecting vias 240 of the semiconductor die 200 and the through vias CP embedded in the insulating encapsulation 130, for example.

In some embodiments, the redistribution circuit structure 140 includes a plurality of inter-dielectric layers 142 and a plurality of patterned redistribution conductive layers 144 stacked alternately. In certain embodiments, the patterned redistribution conductive layers 144 are sandwiched between the inter-dielectric layers 142, where a top surface of a topmost layer of the patterned redistribution conductive layers 144 is exposed by a topmost layer of the inter-dielectric layers 142 and physically connected to with one or more overlying connectors (e.g. later-formed conductive terminal(s) or semiconductor device(s) such as passive element(s)), and a bottommost layer of the patterned redistribution conductive layers 144 exposed by a bottommost layer of the inter-dielectric layers 142 are electrically connected to with one or more underlying connectors (e.g. the connecting vias 240 and the conductive pillars 120). As shown in FIG. 13, in some embodiments, the top surfaces of the connecting vias 240 of the semiconductor die 200 and the surfaces S2 of the through vias CP (e.g. the tp surfaces 110*t* of the first patterns 110) are in direct contact with the redistribution circuit structure 140 (e.g. the bottommost layer of the patterned redistribution conductive layers 144 exposed by the bottommost layer of the inter-dielectric layers 142). In such embodiments, the connecting vias 240 of the semiconductor die 200 and the through vias CP are in physical contact with the bottommost layer of the patterned redistribution conductive layers 144. In some embodiments, as shown in FIG. 13, the connecting vias 240 of the semiconductor die 200 and the through vias CP are partially covered by the bottommost layer of the inter-dielectric layers 142. The numbers of the inter-dielectric layers 142 and of the patterned redistribution conductive layers 144 are not limited according to the disclosure. In some embodiments, the patterned redistribution conductive layers 144 may be individually referred to as a redistribution layer, while the inter-dielectric layers 142 may together be referred to as a dielectric structure.

In certain embodiments, the topmost layer of the patterned redistribution conductive layers 144 may include a plurality of pads. In such embodiments, the above-mentioned pads may include a plurality of under-ball metallurgy (UBM) patterns 144*a* for ball mount and/or a plurality of connection pads 144*b* for mounting of passive components. The numbers of the under-ball metallurgy patterns 144*a* and the number of the connection pads 144*b* are not limited according to the disclosure.

As shown in FIG. 13, in some embodiments, after the redistribution circuit structure 140 is formed, a plurality of conductive terminals 150 are placed on the under-ball metallurgy (UBM) patterns 144*a*, and at least one semiconductor device 160 is mounted on the connection pads 144*b*. For example, the conductive terminals 150 may be placed on the UBM patterns 144*a* through ball placement process, The conductive terminals 150 may include a micro-bump, a metal pillar, an electroless nickel-electroless palladium-immersion gold (ENEPIG) formed bump, a controlled collapse chip connection (C4) bump, a ball grid array (BGA) bump, or the like. For example, the semiconductor device 160 may be mounted on the connection pads 144*b* through soldering process. The semiconductor device 160 may be a surface device. The surface device may include a surface mount device (SMD) or an integrated passive device (IPD) that comprise passive devices such as resistors, inductors, capacitors, jumpers, combinations of these, or the like that are desired to be connected to and utilized in conjunction with the semiconductor die 200 and/or the semiconductor die 300. The number of the conductive terminals 150 and the number of the semiconductor device 160 are not limited according to the disclosure, and may be selected based on the demand.

In some embodiments, through the UBM patterns 144*a*, some of the conductive terminals 150 are electrically connected to the semiconductor die 200. Through the UBM patterns 144*a* and the semiconductor die 200, the some of the conductive terminals 150 are electrically connected to the semiconductor die 300. In some embodiments, through the UBM patterns 144*a*, some of the conductive terminals 150 are electrically connected to the conductive pillars 120. In some embodiments, through the connection pads 144*b*, the semiconductor device 160 is electrically connected to the semiconductor die 200. In some embodiments, through the connection pads 144*b* and the semiconductor die 200, the semiconductor device 160 is electrically connected to the semiconductor die 300. In some embodiments, through the connection pads 144*b*, the semiconductor device 160 is electrically connected to the conductive pillars 120. In some embodiments, through the UBM patterns 144*a* and the connection pads 144*b*, some of the conductive terminals 150 are electrically connected to the semiconductor device 160. In certain embodiments, some of the conductive terminals 150 may be electrically floated or grounded, the disclosure is not limited thereto. In some embodiments, some of the conductive terminals 150 may be electrically connected to a power (e.g. a power source) or a signal (e.g., a signal source, such external electrical device/component).

Referring to FIG. 13 and FIG. 14 together, in some embodiments, the temporary carrier TC2 is debonded from the surface 130*t* of the insulating encapsulation 130, the top surfaces 120*t* of the conductive pillars 120 and the bottom surface 310*b'* of the semiconductor die 300. In one embodiment, the debonding process is a laser debonding process. During the debonding step, the structure depicted in FIG. 13 is flipped (turned upside down) and secured by a holding device (not shown) before debonding the temporary carrier TC2 and the temporary bonding layer TB2. For example, the conductive terminals 150 are held by the holding device. In some embodiments, the holding device may be an adhesive tape, a carrier film or a suction pad. The disclosure is not limited thereto.

Referring back to FIG. 14, in some embodiments, a package 800 is provided and mounted to the structure of FIG. 13 that the temporary carrier TC2 being debonded therefrom to form the semiconductor package 10. In some embodiments, the package 800 has a substrate 810, semiconductor dies 820*a* and 820*b*, bonding wires 830*a* and 830*b*, conductive pads 840, conductive pads 850, and an insulating encapsulation 860.

For example, the semiconductor die 820*a* with a connecting film DA1 disposed thereon and the semiconductor die 820*b* with a connecting film DA2 are provided and are disposed on the substrate 810. In some embodiments, the connecting film DA1 is located between the semiconductor die 820*a* and the substrate 810, and the connecting film DA2 is located between the semiconductor die 820*a* and the semiconductor die 820*b*. In some embodiments, due to the connecting films DA1 and DA2 respectively provided between the semiconductor die 820*a* and the substrate 810 and between the semiconductor dies 820*a* and 820*b*, the semiconductor dies 820*a*, 820*b* are stably adhered to the substrate 810. In some embodiments, the connecting films DA1, DA2 may be, for example, a die attach film, a layer made of adhesives or epoxy resin, or the like.

For example, the semiconductor dies 820*a* and 820*b* are mounted on one surface (e.g. a surface S3) of the substrate 810. In some embodiments, the semiconductor dies 820*a* and 820*b* may be logic chips (e.g., central processing units, microcontrollers, etc.), memory chips (e.g., dynamic random access memory (DRAM) chips, static random access memory (SRAM) chips, etc.), power management chips (e.g., power management integrated circuit (PMIC) chips), radio frequency (RF) chips, sensor chips, signal processing chips (e.g., digital signal processing (DSP) chips), front-end chips (e.g., analog front-end (AFE) chips, the like, or a combination thereof). The semiconductor dies 820*a* and 820*b* are DRAM chips, as shown in FIG. 14, for example. In one embodiment, the semiconductor dies 820*a* and 820*b* may be the same. However, the disclosure is not limited thereto; in an alternative embodiment, the semiconductor dies 820*a* and 820*b* may be different from each other.

In some embodiments, the bonding wires 830*a* are respectively used to provide electrical connections between contacts 822*a* of the semiconductor dies 820*a* and some of the conductive pads 840 (such as bonding pads) located on the surface S3 of the substrate 810. In some embodiments, the bonding wires 830*b* are respectively used to provide electrical connections between contacts 822*b* of the semiconductor dies 820*b* and some of the conductive pads 840 (such as bonding pads) located on the surface S3 of the substrate

810. Owing to the bonding wires 830a and 830b, the semiconductor dies 820a and 820b are electrically connected to the substrate 810.

In some embodiments, the insulating encapsulation 860 is formed on the surface S3 of the substrate 810 to encapsulate the semiconductor dies 820a, 820b, the bonding wires 830a, 830b, and the conductive pads 840 to protect these components. In some embodiments, the material of the insulating encapsulation 860 is the same as the materials the insulating encapsulations 130*m*/130. In alternative embodiments, the material of the insulating encapsulation 860 is different from the materials the insulating encapsulations 130*m*/130.

The disclosure is not limited thereto.

In some embodiments, interconnects (not shown) or through insulator vias (not shown) embedded in the substrate 810 may be used to provide electrical connection between the conductive pads 840 and the conductive pads 850 (such as bonding pads) that are located on another surface (e.g. a surface S4 opposite to the surface S3) of the substrate 810. In certain embodiments, some of the conductive pads 850 are electrically connected to the semiconductor dies 820a and 820b through these insulator vias or interconnects (not shown) in addition to some of the conductive pads 840 and the bonding wires 830a, 830b.

In some embodiments, the conductive pads 850 of the package 800 are physically connected to the conductive pillars 120 through joints 194, and the package 800 is electrically coupled to the semiconductor die 200 and/or 300 through the conductive pillars and the redistribution circuit structure 140. For example, the semiconductor dies 820a, 820b are electrically communicated to the semiconductor dies 200 and/or 300. In some embodiments, some of the conductive terminals 150 are electrically coupled to the semiconductor dies 820a, 820b through the UBM patterns 144a, the conductive pillars 120, and the joints 194.

In addition, as shown in FIG. 14, an underfill (not shown) may be optionally formed to fill the gaps between the insulating encapsulation 130 and the substrate 810 and cover sidewalls of the joint 194, for example. Owing to the underfill, the bonding strength is enhanced, thereby improving the reliability of the semiconductor package 10. In one embodiment, the underfill may be any acceptable material, such as a polymer, epoxy, molding underfill, or the like, for example. In one embodiment, the underfill may be formed by underfill dispensing or any other suitable method.

After mounting the package 800 and before releasing the conductive terminals 150 from the holding device, a dicing (singulation) process is performed to cut a plurality of the semiconductor packages 10 interconnected therebetween into individual and separated semiconductor packages 10. In one embodiment, the dicing (singulation) process is a wafer dicing process including mechanical blade sawing or laser cutting, however the disclosure is not limited thereto. After the dicing (singulation) process, the conductive terminals 150 are released from the holding device. Up to here, the manufacture of the semiconductor package 10 is completed.

In some embodiments, as shown in FIG. 14, a sidewall S140 of the redistribution circuit structure 140 is substantially aligned with a sidewall S130 of the insulating encapsulation 130. In some embodiments, the conductive pillars 120 are disposed in the insulating encapsulation 130 and next to the semiconductor die 200 and the semiconductor die 300. As shown in FIG. 14 and FIG. 15, for example, the area of the semiconductor die 300 is less than an area of the semiconductor die 200 in a vertical projection on the redistribution circuit structure 140 along the stacking direction Z. In alternative embodiments, the area of the semiconductor die 300 may be greater than an area of the semiconductor die 200 in the vertical projection on the redistribution circuit structure 140 along the stacking direction Z. In further alternative embodiments, the area of the semiconductor die 300 may be equal to an area of the semiconductor die 200 in the vertical projection on the redistribution circuit structure 140 along the stacking direction Z.

Figure 17:
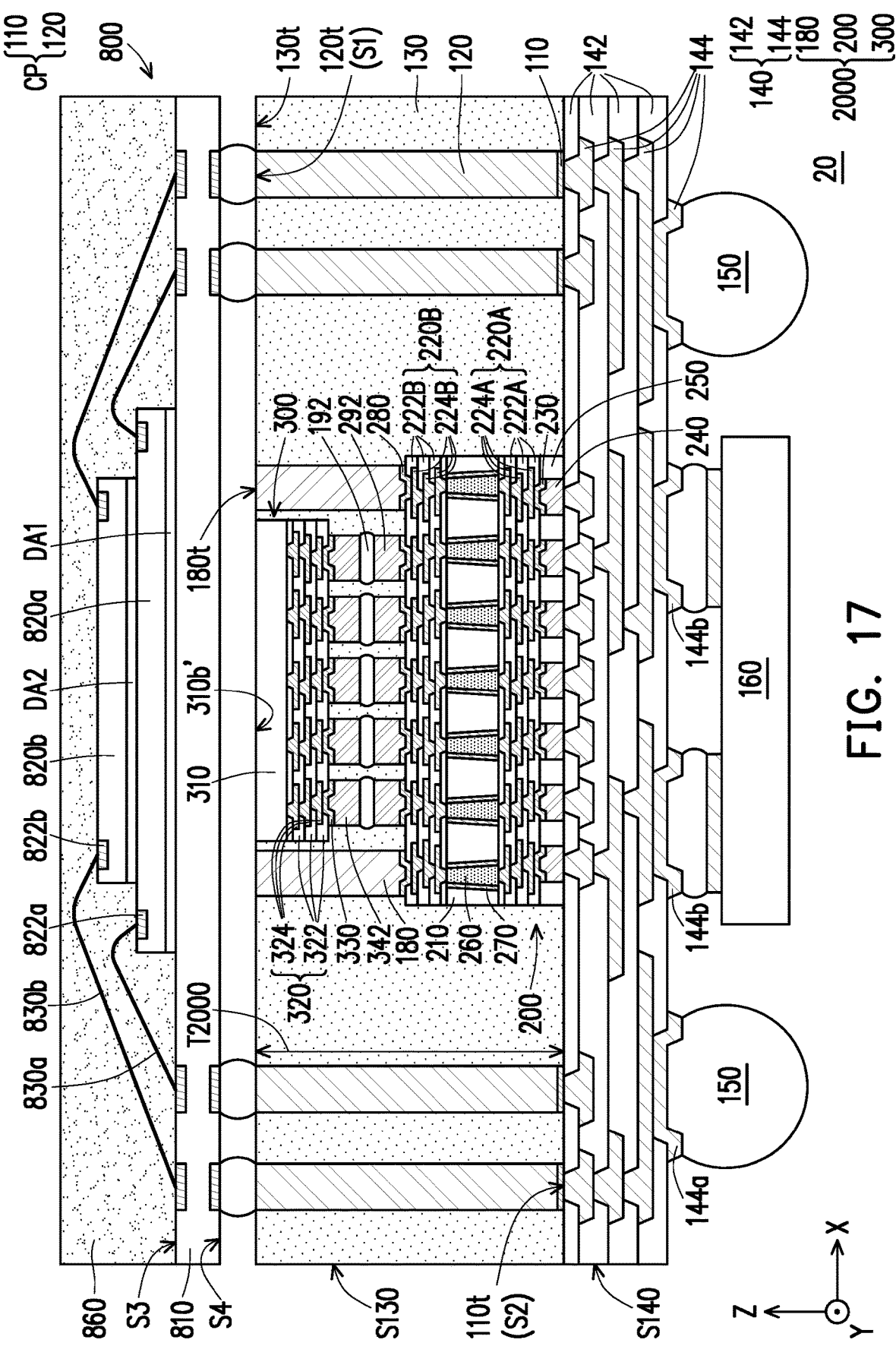
FIG. 17 is a schematic cross-sectional view showing a semiconductor package in accordance with some embodiments of the disclosure.
Figure 18:
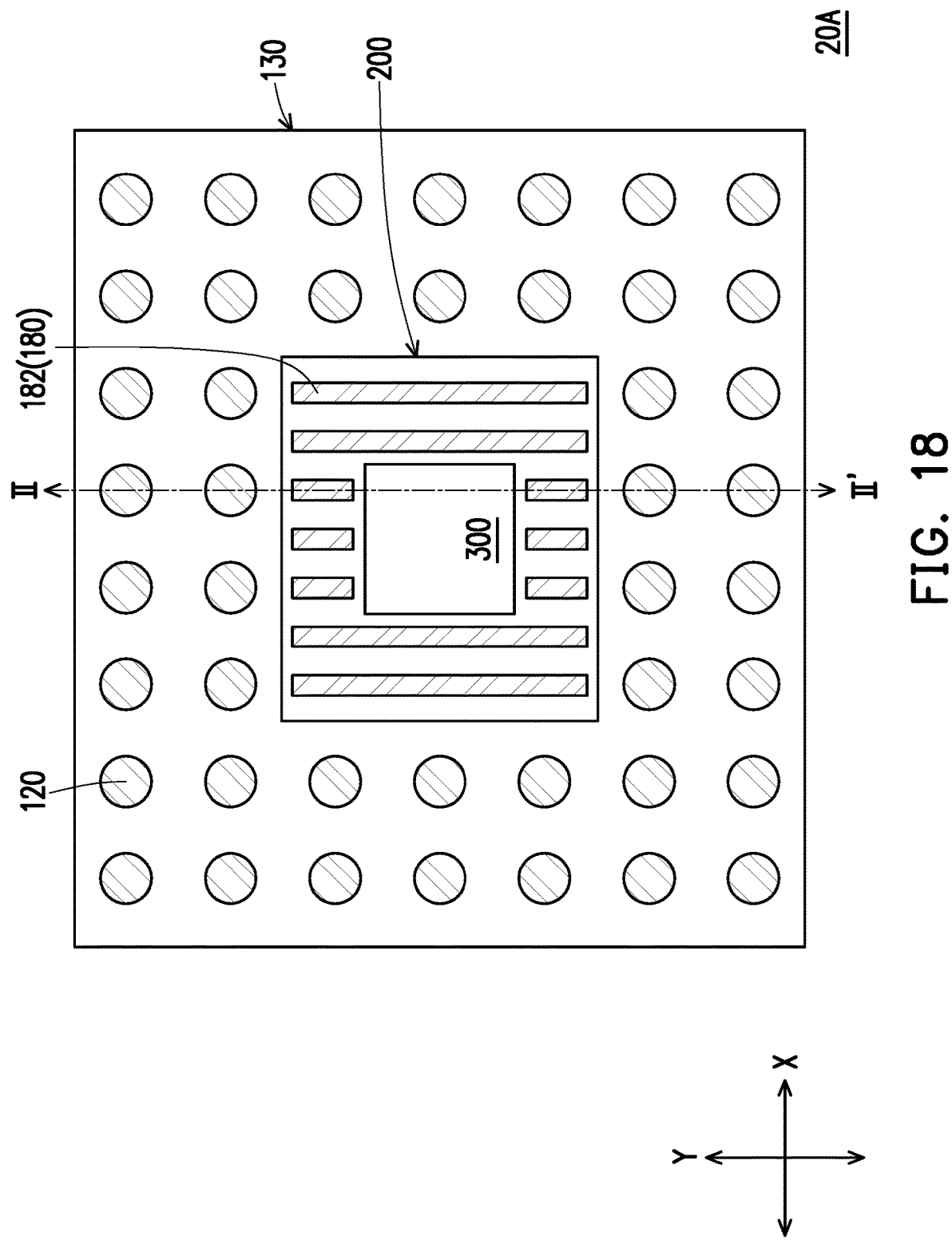
FIG. 18 is a schematic top view illustrating a relative position of semiconductor dies, conductive pillars, thermal dissipating elements and an insulating encapsulation in a semiconductor package in accordance with some embodiments of the disclosure.
Figure 19:
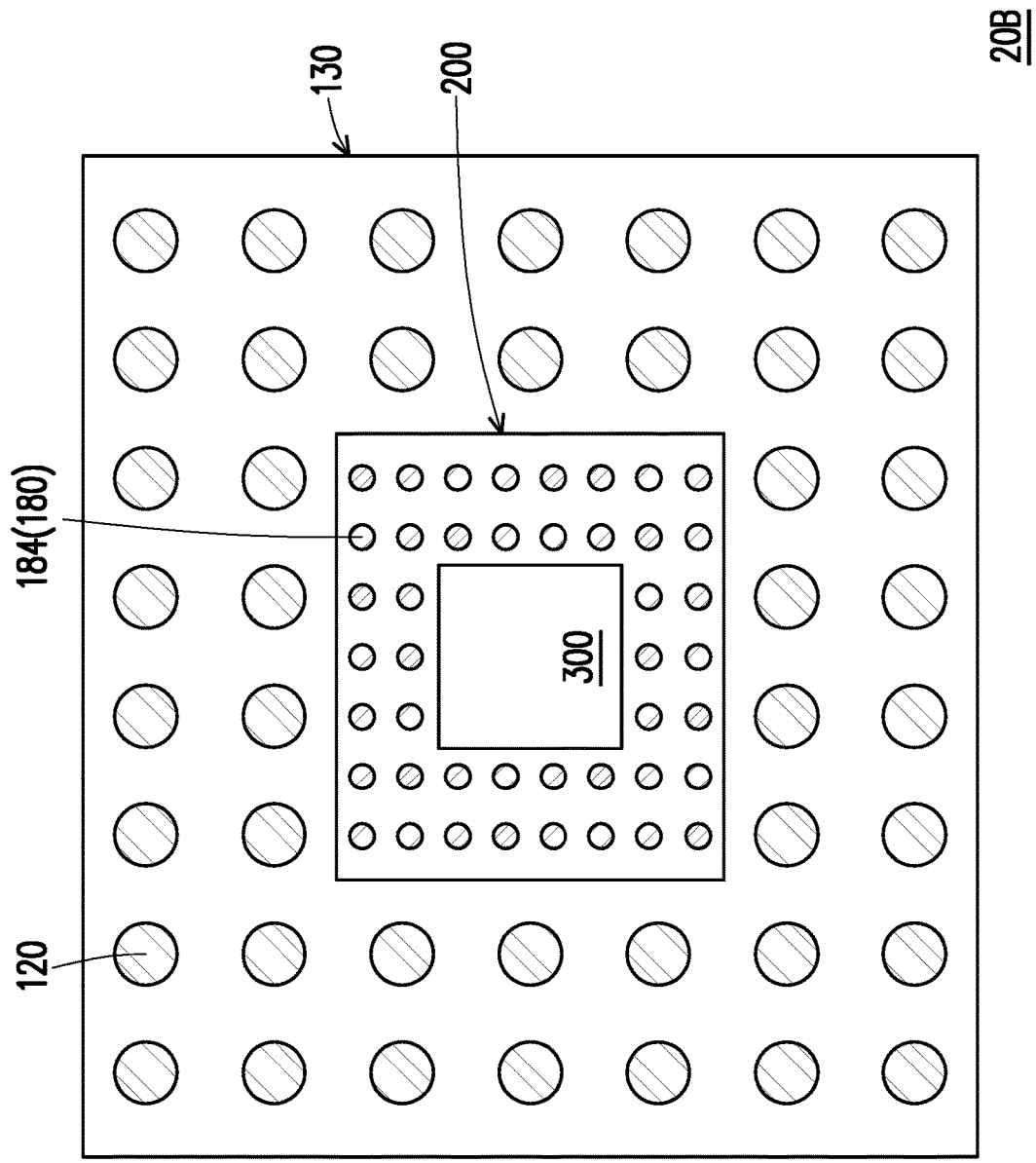
FIG. 19 is a schematic top view illustrating a relative position of semiconductor dies, conductive pillars, thermal dissipating elements and an insulating encapsulation in a semiconductor package in accordance with some embodiments of the disclosure.
Figure 20:
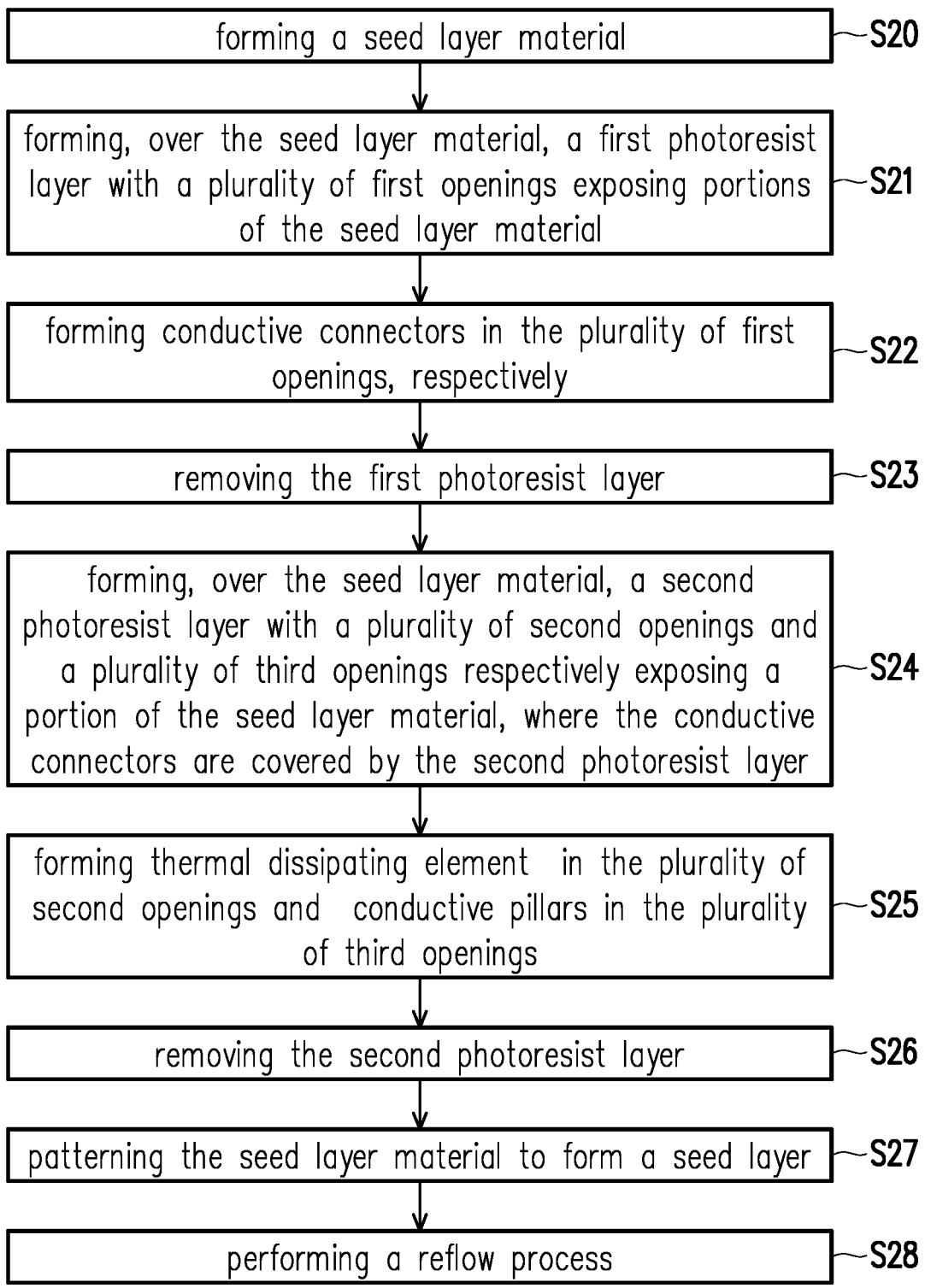
FIG. 20 is a flow chart illustrating a part of a method of manufacturing a semiconductor package in accordance with some embodiments of the disclosure.

FIG. 17 is a schematic cross-sectional view showing a semiconductor package in accordance with some embodiments of the disclosure. FIG. 18 and FIG. 19 are schematic top views respectively illustrating a relative position of semiconductor dies, conductive pillars, thermal dissipating elements and an insulating encapsulation in a semiconductor package in accordance with some embodiments of the disclosure. FIG. 20 is a flow chart illustrating a portion of a method of manufacturing (conductive pillars, thermal dissipating elements, and connecting terminals of) a semiconductor package in accordance with some embodiments of the disclosure. Like elements are designated with the same reference numbers for ease of understanding and the details thereof are not repeated herein. For example, FIG. 17 is the schematic cross-sectional view of a semiconductor package 20 taken along a cross-sectional line II-II' depicted in FIG. 18. The semiconductor package 20 depicted in FIG. 17 is similar to the semiconductor package 10 depicted in FIG. 14, the difference is that, the semiconductor package 20 further includes a thermal dissipating element 180. In some embodiments, a thermal dissipating element 180 includes a plurality of thermal dissipating elements 180, such as a plurality of metallic fins 182 (depicted in FIG. 18), a plurality of metallic micro-pillars (depicted in FIG. 19), or a combination thereof.

As shown in FIG. 17, for example, the thermal dissipating elements 180 are formed on the semiconductor die 200 and next to the semiconductor die 300. In some embodiments, the thermal dissipating elements 180 are thermally coupled to the semiconductor die 200 through physically connecting to the connecting pads 280, where these connecting pads 280 is in contact with the topmost layer of the metallization layers 224B of the interconnect structure 220B. As shown in FIG. 17, top surface 180*t* of the thermal dissipating elements 180 are substantially coplanar to and leveled with the surface 130*t* of the insulating encapsulation 130, for example. Owing to such thermal dissipating elements 180, the heat generated from the semiconductor die 200 is able to easily dissipate to the external environment through the thermal dissipating elements 180, thereby helping to maintain a lower temperature in the semiconductor package 20. In some embodiments, the thermal dissipating elements 180 are formed in an arrangement of completely surrounding the semiconductor die 300. Alternatively, the thermal dissipating elements 180 may be arranged at one side of the semiconductor die 300, two sides of the semiconductor die 300, or three sides of the semiconductor die 300, the disclosure is not limited thereto. In some embodiments, as shown in FIG. 17 and FIG. 18, the through vias CP penetrate through the insulating encapsulation 130 and surround a stack structure 2000 (having the semiconductor dies 200 and 300) with the thermal dissipating elements 180 stacked thereon. For example, as shown in FIG. 17, a thickness T2000 of the stack structure 2000 is approximately ranging from 100 μm to 300 μm. In some embodiments, the sidewall S140 of the redistribution circuit structure 140 is substantially aligned with the sidewall S130 of the insulating encapsulation 130.

As shown in FIG. 18, the thermal dissipating elements 180 may be metallic fins 182, where a top view of each of the metallic fins 182 includes a rectangular shape. However, the disclosure is not limited thereto. In alternative embodiments, the top view of each of the metallic fins 182 may include a shape having a comb-like profile (or contour), a shape having a wave-profile, or the like, or combinations thereof. As shown in FIG. 19, the thermal dissipating elements 180 may be metallic micro-pillars 184, where a top view of each of the metallic micro-pillars 184 includes a circular shape. However, the disclosure is not limited thereto. In alternative embodiments, the top view of each of the metallic micro-pillars 184 may include an elliptical shape, an oval shape, a rectangular shape, a square shape, a polygonal shape, or combinations thereof.

The thermal dissipating elements 180 may be formed by the method of FIG. 20, which replaces the method of FIG. 16 in conjunction with FIG. 4 through FIG. 8. That is, the semiconductor package 20 is formed by a method similar to the forming process and material of the semiconductor package 10; the difference is that, the processing steps of FIG. 16 in conjunction with FIG. 4 through FIG. 8 is substituted by the processing steps of FIG. 20. The method of FIG. 20 includes at least steps S21 to S28. For example, the method of FIG. 20 is performed to form the semiconductor die 200 having the connecting terminals 290, the thermal dissipating elements 180 located on the semiconductor die 200 and the conductive pillars 120 next to the semiconductor dies 200 and 300, following the process as described in FIG. 3.

The method shown in FIG. 20 begins with step S20, which forms a seed layer material over the temporary carrier and on the thinned semiconductor die, following the process as described in FIG. 3; step S21, which forms a first patterned photoresist layer on the seed layer material, where the first patterned photoresist layer includes a plurality of first opening holes exposing first portions of the seed layer material over the thinned semiconductor die; step S22, which forming conductive connectors (each including a connecting via and a pre-metal cap) in first opening holes, respectively; step S23, which removes the first patterned photoresist layer; step S24, which forms a second patterned photoresist layer on the seed layer material, where the second patterned photoresist layer includes a plurality of second opening holes exposing second portions of the seed layer material over the thinned semiconductor die and a plurality of third opening holes exposing third portions of the seed layer material over the temporary carrier exposed by the thinned semiconductor die, where the conductive connectors are covered by the second patterned photoresist layer; step S25, which forms the thermal dissipating elements in the second opening holes and forms conductive pillars in the thirds opening holes; step S26, which removes the second patterned photoresist layer; step S27, which patterns the seed layer material by using the connecting vias, the thermal dissipating elements and the conductive pillars as the etching mask to form a seed layer having a plurality of first patterns, a plurality of second patterns and a plurality of second patterns, where the first patterns connect to the connecting vias, the second patterns connect to the thermal dissipating elements, and the third patterns connect to the conductive pillars; and step S28, which performs a reflow process to form a semiconductor die 200 with connecting connector having each including a connecting via and a metal cap.

For example, the connecting connectors 290, the thermal dissipating elements 180 and the conductive pillars 120 are formed by sharing a same seed layer (e.g., the seed layer material), where the connecting connectors 290 are formed in one plating step while the thermal dissipating elements 180 and the conductive pillars 120 are formed in other plating step, so that the forming method of the connecting connectors 290, thermal dissipating elements 180 and the conductive pillars 120 may be referred to as a two-step formation as shown in FIG. 20. However, the disclosure is not limited thereto. As shown in the semiconductor package 20 of FIG. 17, for example, the semiconductor die 300 is mounted to the semiconductor die 200 in a manner of face-to-back configuration (e.g., the front-side surface FS2 of the semiconductor die 300 facing toward the backside surface BS1 of the semiconductor die 200).

Figure 21:
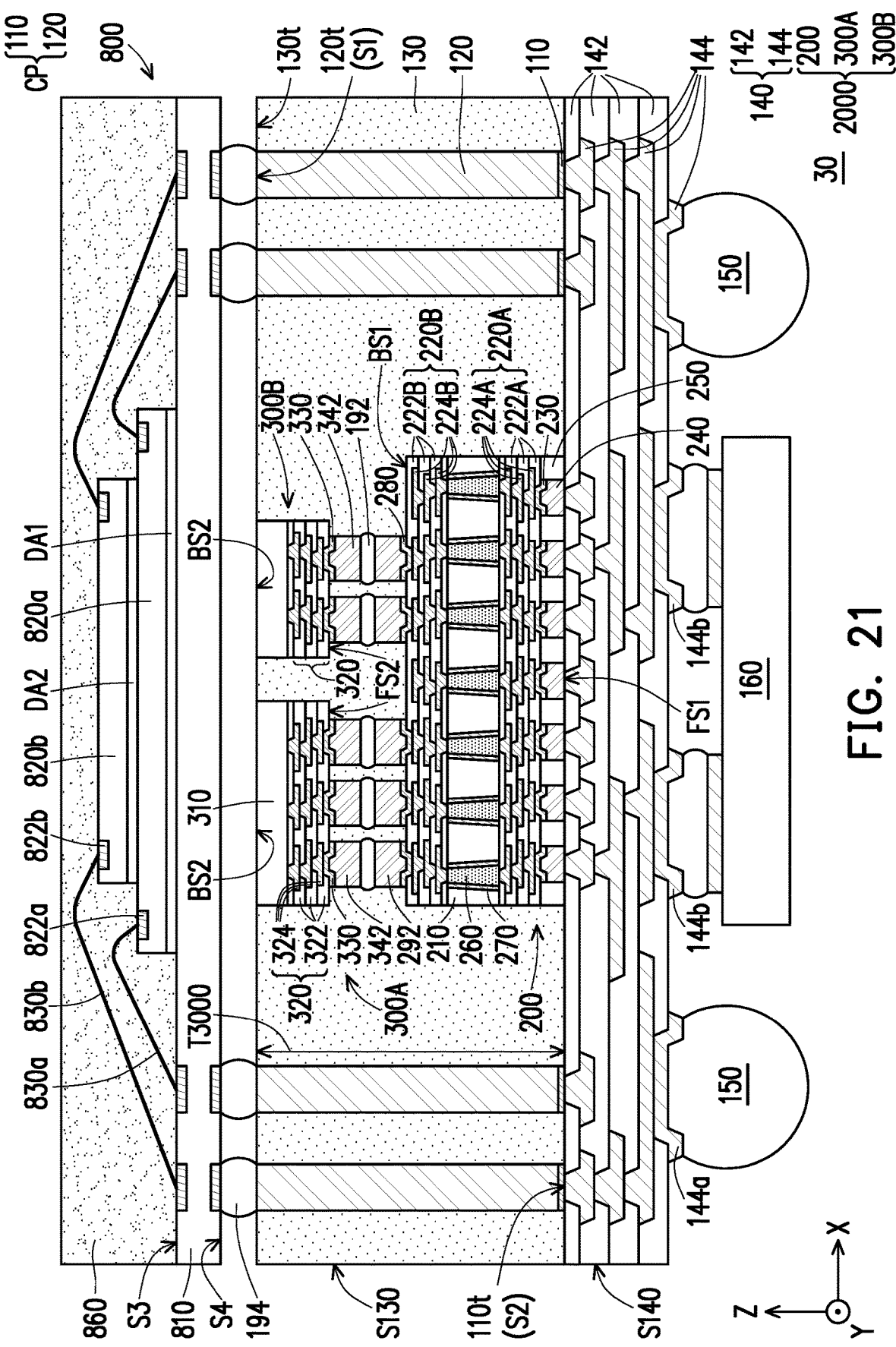
FIG. 21 is a schematic cross-sectional view showing a semiconductor package in accordance with some embodiments of the disclosure.
Figure 22:
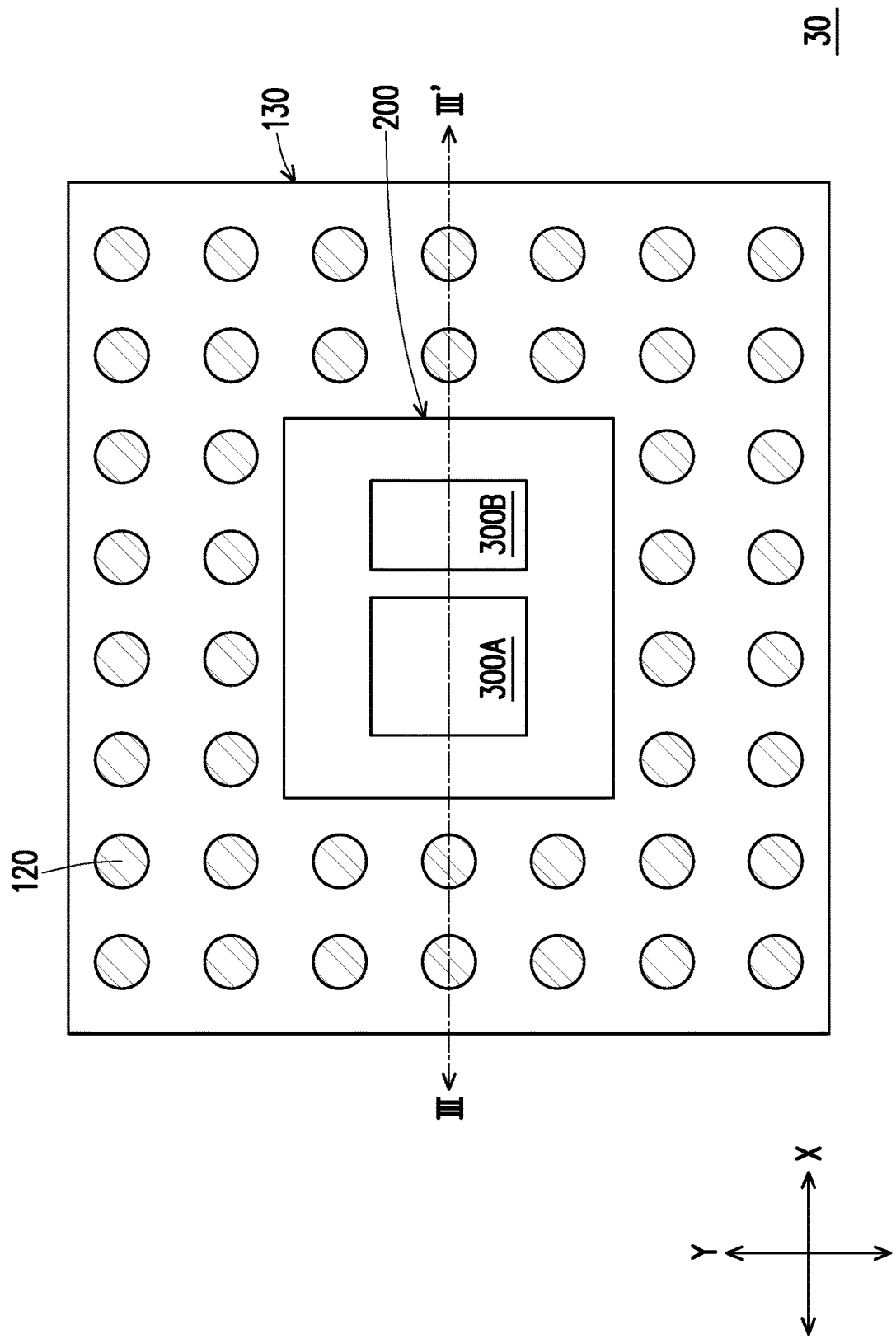
FIG. 22 is a schematic top view illustrating a relative position of semiconductor dies, conductive pillars, thermal dissipating elements and an insulating encapsulation in a semiconductor package in accordance with some embodiments of the disclosure.

FIG. 21 is a schematic cross-sectional view showing a semiconductor package in accordance with some embodiments of the disclosure. FIG. 22 is a schematic top view illustrating a relative position of semiconductor dies, conductive pillars, thermal dissipating elements and an insulating encapsulation in a semiconductor package in accordance with some embodiments of the disclosure. Like elements are designated with the same reference numbers for ease of understanding and the details thereof are not repeated herein. For example, FIG. 21 is the schematic cross-sectional view of a semiconductor package 30 taken along a cross-sectional line III-III' depicted in FIG. 22. The semiconductor package 30 depicted in FIG. 21 is similar to the semiconductor package 10 depicted in FIG. 14, the difference is that, the semiconductor package 30 includes a plurality of semiconductor dies 300 disposed on a semiconductor die 200 in a manner of side-by-side.

As shown in FIG. 21 and FIG. 22, in some embodiments, the semiconductor dies 300 includes semiconductor dies 300A and 300B, where the semiconductor dies 300A and 300B are mounted to the semiconductor die 200 through joints 192, and the semiconductor dies 300A and 300B are arranged side-by-side over the semiconductor die 200. In some embodiments, through the joints 192, the semiconductor die 200 and the semiconductor dies 300A and 300B are electrically coupled and electrically communicated to each other. The detail of the semiconductor die 200 has been described in FIG. 1 and FIG. 3 through FIG. 8, and the semiconductor dies 300A and 300B are identical to the semiconductor die 300 as described in FIG. 2; thus, are not repeated herein for brevity. In some embodiments, in a vertical projection on the redistribution circuit structure 140 along the stacking direction Z, an area of the semiconductor die 200 is greater than an area of the semiconductor die 300A and an area of the semiconductor die 300B, and the area of the semiconductor die 300A is greater than the area of the semiconductor die 300B, as shown in FIG. 21 and FIG. 22. That is, the area of the semiconductor die 300A is different from the area of the semiconductor die 300B. Alternatively, in the vertical projection on the redistribution circuit structure 140 along the stacking direction Z, the area of the semiconductor die 300A may be equal to the area of the semiconductor die 300, the disclosure is not limited thereto. In some embodiments, as shown in FIG. 21 and FIG. 22, the through vias CP penetrate through the insulating encapsulation 130 and surround a stack structure 3000 (having the semiconductor dies 200, 300A and 300B). For example, as shown in FIG. 21, a thickness T3000 of the stack structure 3000 is approximately ranging from 100 μm to 300 μm. In some embodiments, the sidewall S140 of the redistribution circuit structure 140 is substantially aligned with the sidewall S130 of the insulating encapsulation 130.

Only two semiconductor dies 300 (e.g. 300A and 300B) are shown in FIG. 21 and FIG. 22 for illustrative purposes and for simplicity; the disclosure is not limited therein. In other embodiments, the number of the semiconductor dies 300 may be more than two depending on the design requirement and demand. For example, the number of the semiconductor die 300A is the same as the number of the semiconductor die 300B.

Alternatively, the number of the semiconductor die 300A may be different from the number of the semiconductor die 300B. In embodiments of which the more than two semiconductor dies 300, the semiconductor dies 300 are arranged in the form of a matrix, such as a N'×N' array or a N'×M' array (N', M'>0, N' may or may not be equal to M') along the direction X and the direction Y. Owing to the configuration having multiple semiconductor dies 300 over the semiconductor die 200, the performance of the semiconductor package 30 can be improved while maintaining its overall thickness in the direction Z. As shown in the semiconductor package 30 of FIG. 21, for example, the semiconductor dies 300 are mounted to the semiconductor die 200 in a manner of face-to-back configuration (e.g., the front-side surfaces FS2 of the semiconductor dies 300 facing toward the backside surface BS1 of the semiconductor die 200). In addition, the thermal dissipating elements 180 may also be adopted in the semiconductor package 30; the disclosure is not limited thereto.

In some embodiments, the semiconductor dies 300A and 300B, individually, are the same as the semiconductor die 200. For example, the semiconductor dies 200, 300A and 300B can all be a logic die. In alternative embodiments, at least one of the semiconductor dies 300A and 300B is different from the semiconductor die 200. For example, the semiconductor die 200 can a logic die while at least one of the semiconductor dies 300A and 300B can be one of a memory die, an AI engine or the like, an electrical and/or optical I/O interface die, an integrated passive die or the like. In such alternative embodiments, the semiconductor dies 300A and 300B may be the same to each other. Or, the semiconductor dies 300A and 300B may be different from each other; the disclosure is not limited thereto.

Figure 24:
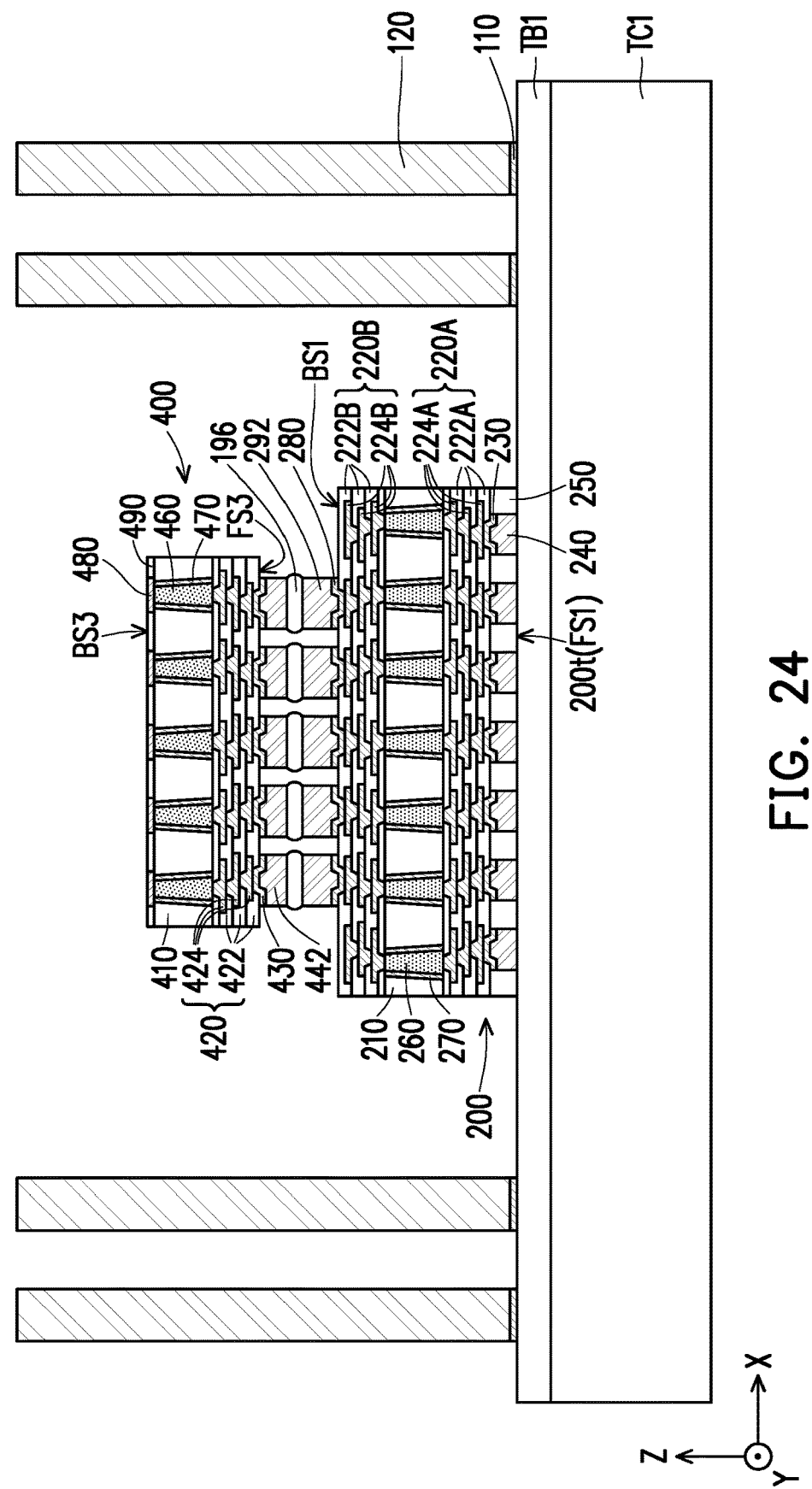
Figure 25:
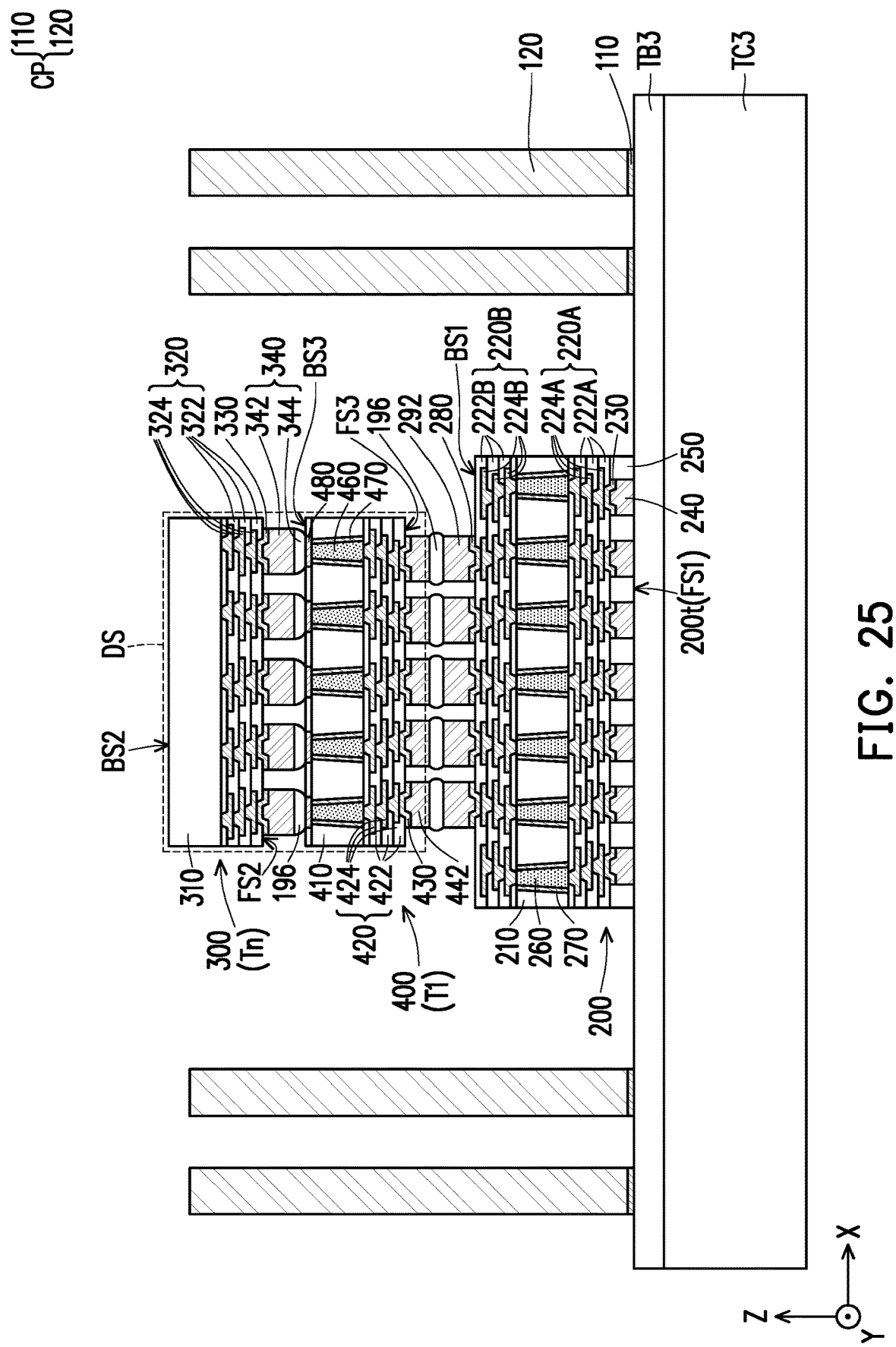
Figure 26:
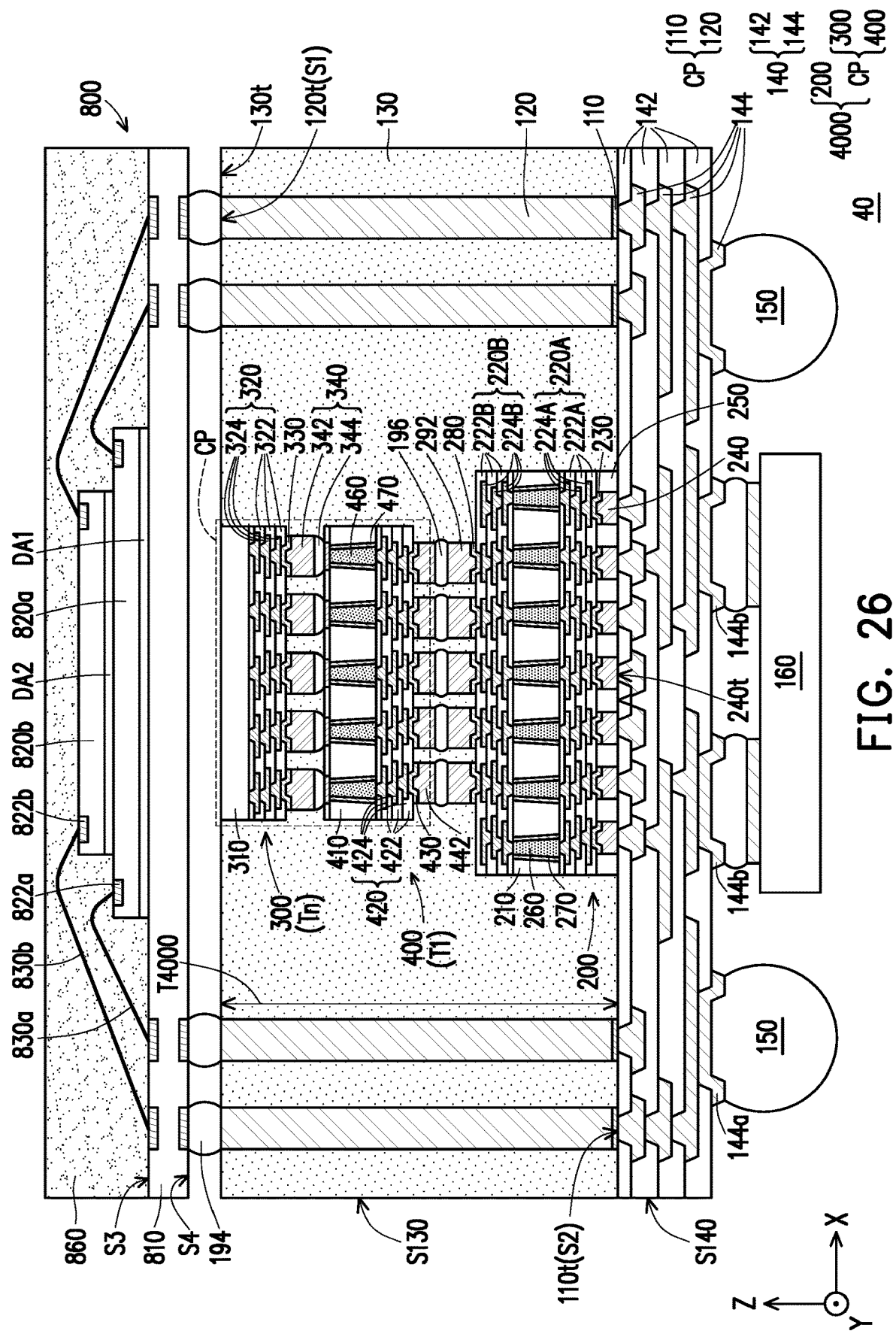
Figure 27:
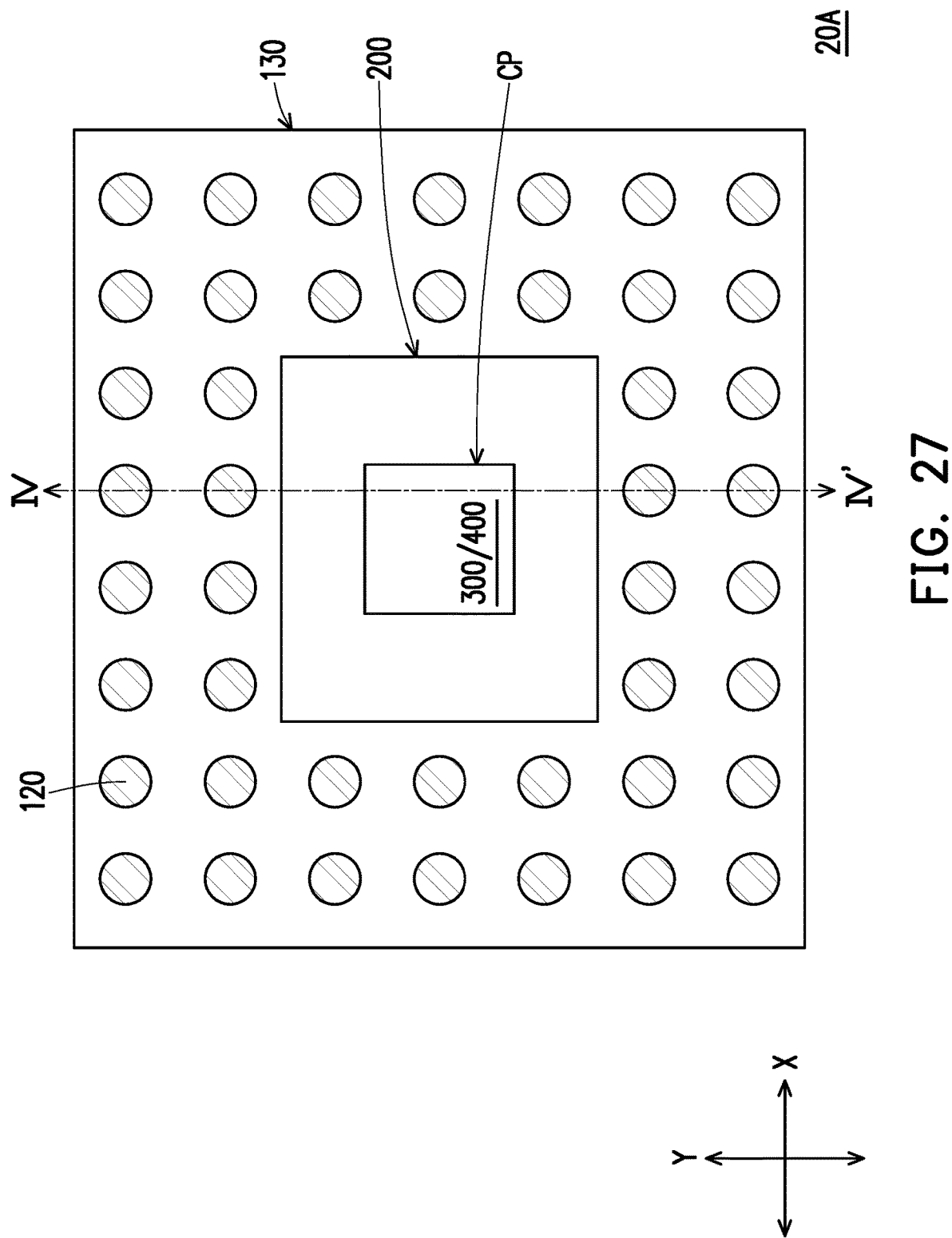
FIG. 27 is a schematic top view illustrating a relative position of semiconductor dies, conductive pillars and an insulating encapsulation in a semiconductor package in accordance with some embodiments of the disclosure.

FIG. 23 through FIG. 26 are schematic cross-sectional views showing a method of manufacturing a semiconductor package in accordance with some embodiments of the disclosure. FIG. 27 is a schematic top view illustrating a relative position of semiconductor dies, conductive pillars and an insulating encapsulation in a semiconductor package in accordance with some embodiments of the disclosure. Like elements are designated with the same reference numbers for ease of understanding and the details thereof are not repeated herein. For example, FIG. 26 is the schematic cross-sectional view of a semiconductor package 40 taken along a cross-sectional line IV-IV' depicted in FIG. 27.

Figure 23:
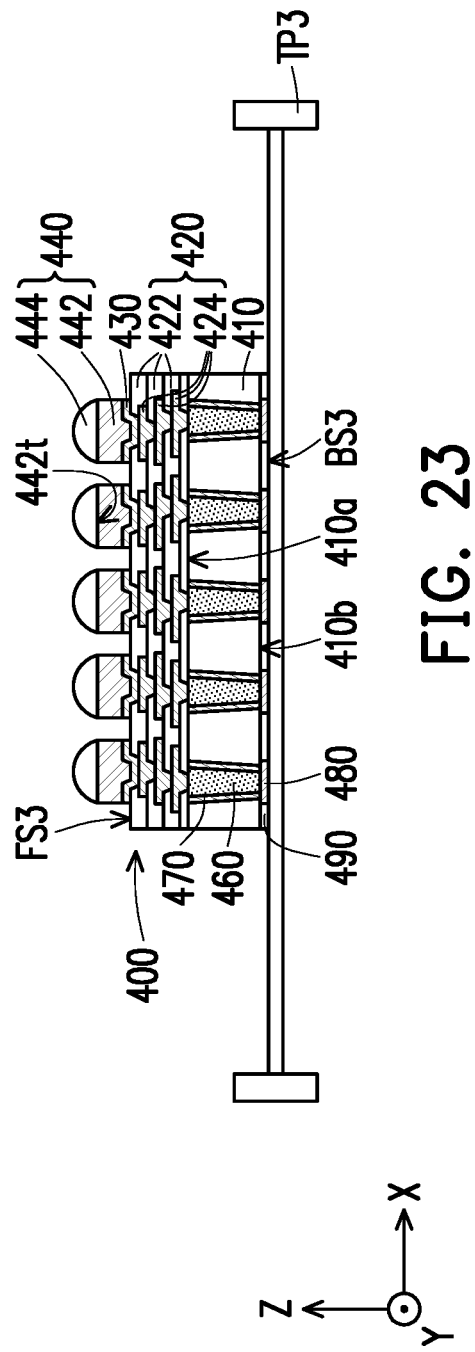
FIG. 23 through FIG. 26 are schematic cross-sectional views showing a method of manufacturing a semiconductor package in accordance with some embodiments of the disclosure.

Referring to FIG. 23, in some embodiments, a third wafer (not shown) including a plurality of semiconductor dies 400 is provided over a tape frame TP3, and a dicing process is performed to cut the third wafer along a cutting line (shown as the dotted line in FIG. 23) into individual and separated semiconductor dies 400. Only one semiconductor die 400 is shown in FIG. 23 for illustrative purposes and for simplicity; the disclosure is not limited thereto. In one embodiment, the dicing process is a wafer dicing process including mechanical blade sawing or laser cutting. In some embodiments, before dicing/singulating, the semiconductor dies 400 included in the third wafer are tested for functionality and performance by probing, and only known good dies (KGDs) from the tested semiconductor dies 400 are selected and used for subsequently processing. The semiconductor dies 400 included in the third wafer may have an arrangement similar to or the same as the arrangement of the semiconductor dies 200' included in the first wafer as described in FIG. 1, and thus are not repeated herein.

In some embodiments, as shown in FIG. 23, the semiconductor die 400 includes a semiconductor substrate 410 having semiconductor devices (not shown) formed therein, an interconnect structure 420 formed on the semiconductor substrate 410, a plurality of connecting pads 430 formed on the interconnect structure 420, a plurality of connecting connectors 440 formed on the connecting pads 430, a plurality of conductive pillars 460 formed (embedded) in the semiconductor substrate 410, a plurality of connecting pads 480 formed on the conductive pillars 460, and a protection layer 490 covering sidewalls of the connecting pads 480. In some embodiments, each of the conductive pillars 460 is covered by a liner 470. In some embodiments, the semiconductor substrate 410 includes the semiconductor devices formed therein or thereon, where the semiconductor devices include active devices (e.g., transistors, diodes, etc.) and/or passive devices (e.g., capacitors, resistors, inductors, etc.), or other suitable electrical components. In some embodiments, the semiconductor devices are formed at an active surface 410a of the semiconductor substrate 410 proximal to the interconnect structure 420.

In some embodiments, as shown in FIG. 23, the semiconductor substrate 410 has the active surface 410a and a bottom surface 410b opposite to the active surface 410a along the stacking direction Z of the interconnect structure 420 and the semiconductor substrate 410. For example, the interconnect structure 420 is disposed on and covers the active surface 410a of the semiconductor substrate 410. In some embodiments, the interconnect structure 420 includes one or more dielectric layers 422 and one or more metallization layers 424 in alternation. In some embodiments, the connecting pads 430 are disposed over and electrically coupled to the topmost layer of the metallization layers 424 of the interconnect structure 420 exposed by the passivation layer (e.g. the uppermost layer of the dielectric layers 422) of the interconnect structure 420. In some embodiments, as illustrated in FIG. 23, the connecting connectors 440 are respectively disposed on and electrically connected to the connecting pads 430 for providing an external electrical connection to the circuitry and semiconductor devices. In some embodiments, each of the connecting connectors 440 includes a connecting via 442 and a metal cap 444 disposed on a top surface 442t of the connecting via 442, where the metal cap 444 is electrically connected to the connecting via 442. For example, the connecting pads 480 are disposed on the bottom surface 410b of the semiconductor substrate 410 and connected to the conductive pillars 460 exposed by the bottom surface 410b, and the protection layer 490 is disposed on and covers the bottom surface 410b of the semiconductor substrate 410. In some embodiments, as illustrated in FIG. 23, the connecting pads 480 are respectively disposed on and electrically connected to the conductive pillars 460 for providing an external electrical connection to the circuitry and semiconductor devices.

The formation and material of the semiconductor substrate 410 are similar to or identical to the formation and material of the semiconductor substrate 210 as described in FIG. 1, the formation and material of the interconnect structure 420 are similar to or identical to the formation and material of the interconnect structure 220A as described in FIG. 1, the formations and materials of the connecting pads 430, 480 are similar to or identical to the formation and material of the connecting pads 230 as described in FIG. 1, the formation and material of the connecting connectors 440 are similar to or identical to the formation and material of the connecting connectors 340 as described in FIG. 2, and the formation and material of the protection layer 490 are similar to or identical to the formation and material of the protection layer 250 as described in FIG. 1; thus are not repeated herein for brevity. In some embodiments, a backside surface BS3 of the semiconductor die 400 is constituted by outermost surfaces of the connecting pads 480 and an outermost surface of the protection layer 490 being coplanar thereto, and an outer surface of the topmost layer of the dielectric layer 422 and an outer surface of the topmost layer of the metallization layers 424 exposing by the connecting pads 430 and the connecting connectors 440 may be referred to as a front-side surface FS3 of the semiconductor die 400. In some embodiments, the connecting connectors 440 are referred to as micro-bumps.

Referring to FIG. 24, in some embodiments, the semiconductor die 400 depicted in FIG. 23 is picked and placed on the structure depicted in FIG. 8, following the process as described in FIG. 8. For example, the semiconductor die 400 is mounted to the semiconductor die 200 by flip chip bonding, where the metal caps 444 of the semiconductor die 400 are physically connected to the metal caps 294 of the semiconductor die 200 to form a plurality of joints 196 connecting the connecting vias 442 of the semiconductor die 400 and the connecting vias 292 of the semiconductor die 200. Through the joints 196, the semiconductor die 200 and the semiconductor die 400 are electrically coupled and electrically communicated to each other. As shown in FIG. 24, for example, the semiconductor die 400 is mounted to the semiconductor die 200 in a manner of face-to-back configuration (e.g., the front-side surface FS3 of the semiconductor die 400 facing toward the backside surface BS1 of the semiconductor die 200). In some embodiments, as shown in FIG. 24, the semiconductor die 400 is overlapped with the semiconductor die 200 in the stacking direction Z of the temporary carrier TC1 and the semiconductor die 200 (or saying, the stacking direction of the semiconductor die 200 and the semiconductor die 400).

Referring to FIG. 25, in some embodiments, the semiconductor die 300 depicted in FIG. 2 is picked and placed on the semiconductor die 400, and the semiconductor die 300 is bonded to the semiconductor die 400 by flip chip bonding. For example, the semiconductor die 300 is mounted to the semiconductor die 400, where the metal caps 344 of the semiconductor die 300 are physically connected to the connecting pads 480 of the semiconductor die 400. The metal caps 344 may be referred to as a plurality of joints connecting the connecting vias 342 of the semiconductor die 300 and the connecting pads 480 of the semiconductor die 400. Through the joints 192, the semiconductor die 300 and the semiconductor die 400 are electrically coupled and electrically communicated to each other. In the disclosure, the stacked semiconductor dies 300 and 400 may be referred to a die stack DS. As shown in FIG. 25, for example, the semiconductor die 300 is mounted to the semiconductor die 400 in a manner of face-to-back configuration (e.g., the front-side surface FS2 of the semiconductor die 300 facing toward the backside surface BS3 of the semiconductor die 400). That is, the die stack DS is mounted to the semiconductor die 200 in a manner of face-to-back configuration, for example.

In some embodiments, as shown in FIG. 25, the semiconductor die 300 is overlapped with the semiconductor dies 200 and 400 in the stacking direction Z. In some embodiments, along the stacking direction Z, an area of the die stack DS (including the semiconductor dies 300 and 400) is less than an area of the semiconductor die 200 in a vertical projection on a plane where the semiconductor die 200 located at, as shown in FIG. 25. In some alternative embodiments, along the stacking direction Z, the area of the die stack DS (including the semiconductor dies 300 and 400) is equal to the area of the semiconductor die 200 in the vertical projection. On the other hand, as shown in FIG. 25, in some embodiments, in the die stack SD, an area of the semiconductor die 300 is equal to an area of the semiconductor die 400 in the vertical projection. Alternatively, in the die stack SD, the area of the semiconductor die 300 may be less than the area of the semiconductor die 400 in the vertical projection. Or, in the die stack SD, the area of the semiconductor die 400 may be less than the area of the semiconductor die 300 in the vertical projection. The disclosure is not limited thereto Referring to FIG. 26, in some embodiments, the steps described in FIG. 10 through FIG. 14 are performed on the structure depicted in FIG. 25 to form a semiconductor package 40. In some embodiments, as shown in FIG. 26 and FIG. 27, in the semiconductor package 40, the through vias CP, the semiconductor die 200, the die stack SD and the joints 196, 344 are encapsulated in the insulating encapsulation 130, where the through vias CP penetrate through the insulating encapsulation 130 and surround a die stack 4000 (having the semiconductor die 200 and the die stack SD including the semiconductor die 300 and 400), and the insulating encapsulation 130 has two opposite side disposing with the redistribution circuit structure 140 (with the conductive terminals 150 and the semiconductor device 160 disposed on) and the package 800 (including the semiconductor dies 820a, 820b). For example, as shown in FIG. 26, a thickness T4000 of the die stack 4000 is approximately ranging from 100 µm to 300 µm. In some embodiments, the sidewall S140 of the redistribution circuit structure 140 is substantially aligned with the sidewall S130 of the insulating encapsulation 130.

Only one die stack SD is shown in FIG. 26 for illustrative purposes; the disclosure is not limited thereto. The number of the die stack SD located on the semiconductor die 200 may be more than one depending on the design requirement and demand. In some embodiments, the die stacks SD includes a topmost tier Tn including the semiconductor die 300 and an inner topmost tier T1 including the semiconductor die 400 located between the semiconductor die 200 and the topmost tier Tn (where the semiconductor die 300 located at), as shown in FIG. 26. However, it should be appreciated that the symbol 'T' indicates tiers for the die stack DS while the symbol 'n' indicates the number of the tiers, and the die stack DS disposed on the semiconductor die 200 may include one or more than one inner tiers. For example, n is an integer greater than 1.

The semiconductor dies 300 and 400 may be different from the semiconductor die 200. For example, as shown in FIG. 26, the semiconductor die 200 can a logic die while the semiconductor dies 300 and 400 can be memory dies, where the die stack SD may be referred to as a memory stack. In alternative embodiments, the semiconductor dies 200, 300 and 400 are all different from each other. For example, the semiconductor die 200 can a logic die, while the semiconductor die 300 can be an electrical and/or optical I/O interface die and the semiconductor die 400 can be a memory die. In further alternative embodiments, the semiconductor dies 200, 300 and 400 are all the same. The disclosure is not limited thereto, the combination of the semiconductor dies 200, 300 and 400 may be varied depending on the design requirement and demand. Owing to the configuration having the die stack SD including multiple semiconductor dies 300, 400 disposed on the semiconductor die 200, the performance of the semiconductor package 40 can be improved while maintaining its occupied area on the X-Y plane. In addition, the thermal dissipating elements 180 may also be adopted in the semiconductor package 40; the disclosure is not limited thereto.

Figure 33:
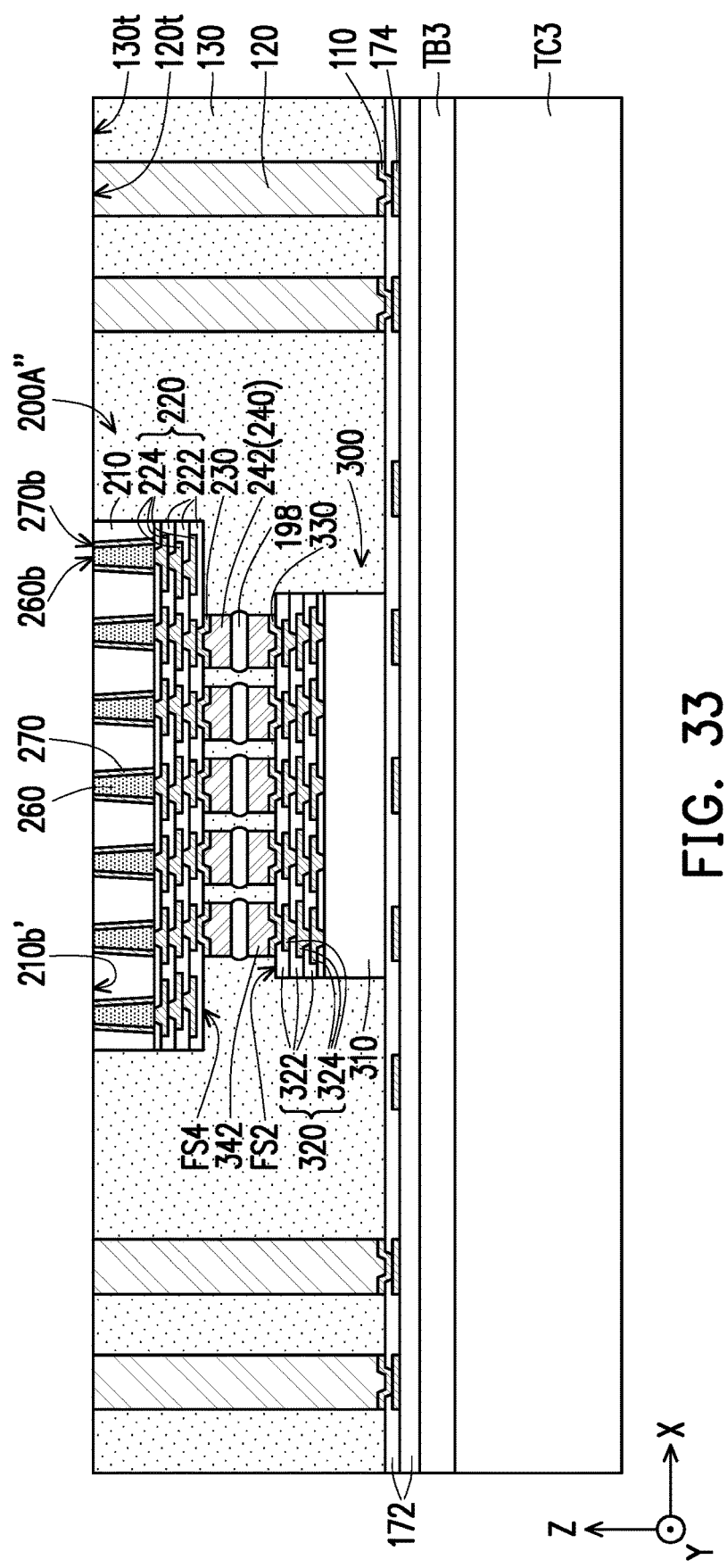
Figure 34:
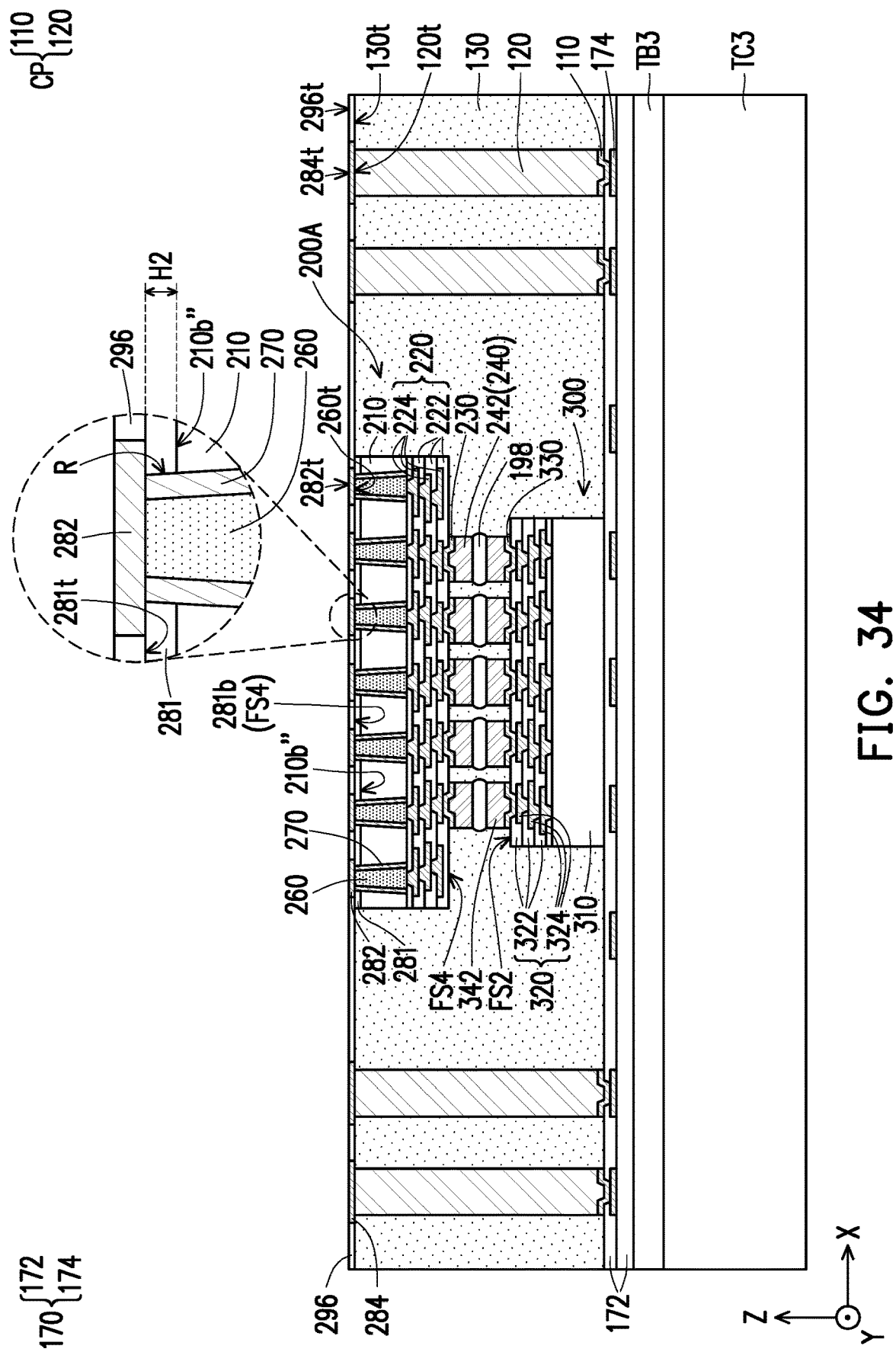
Figure 35:
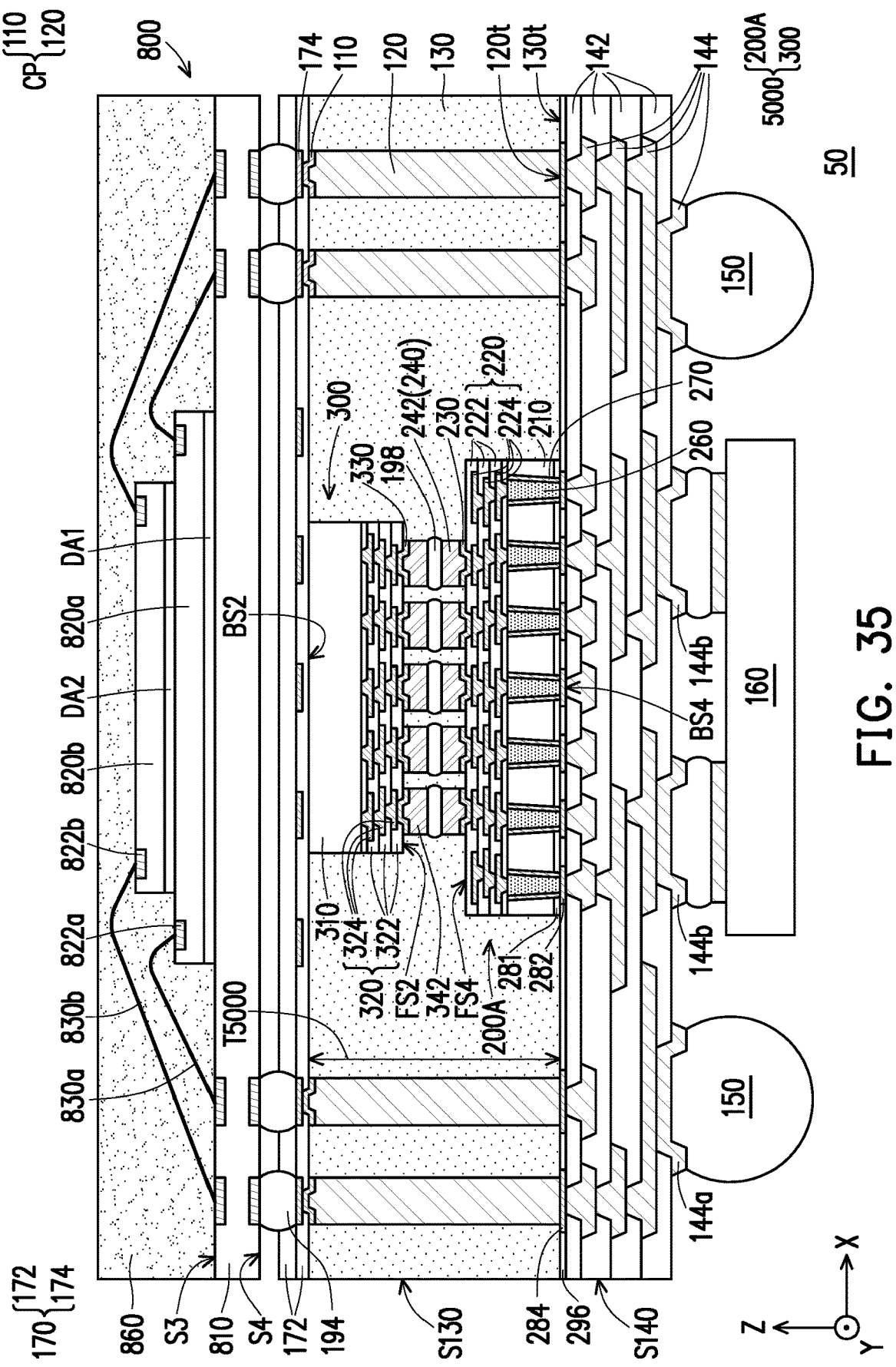
Figure 36:
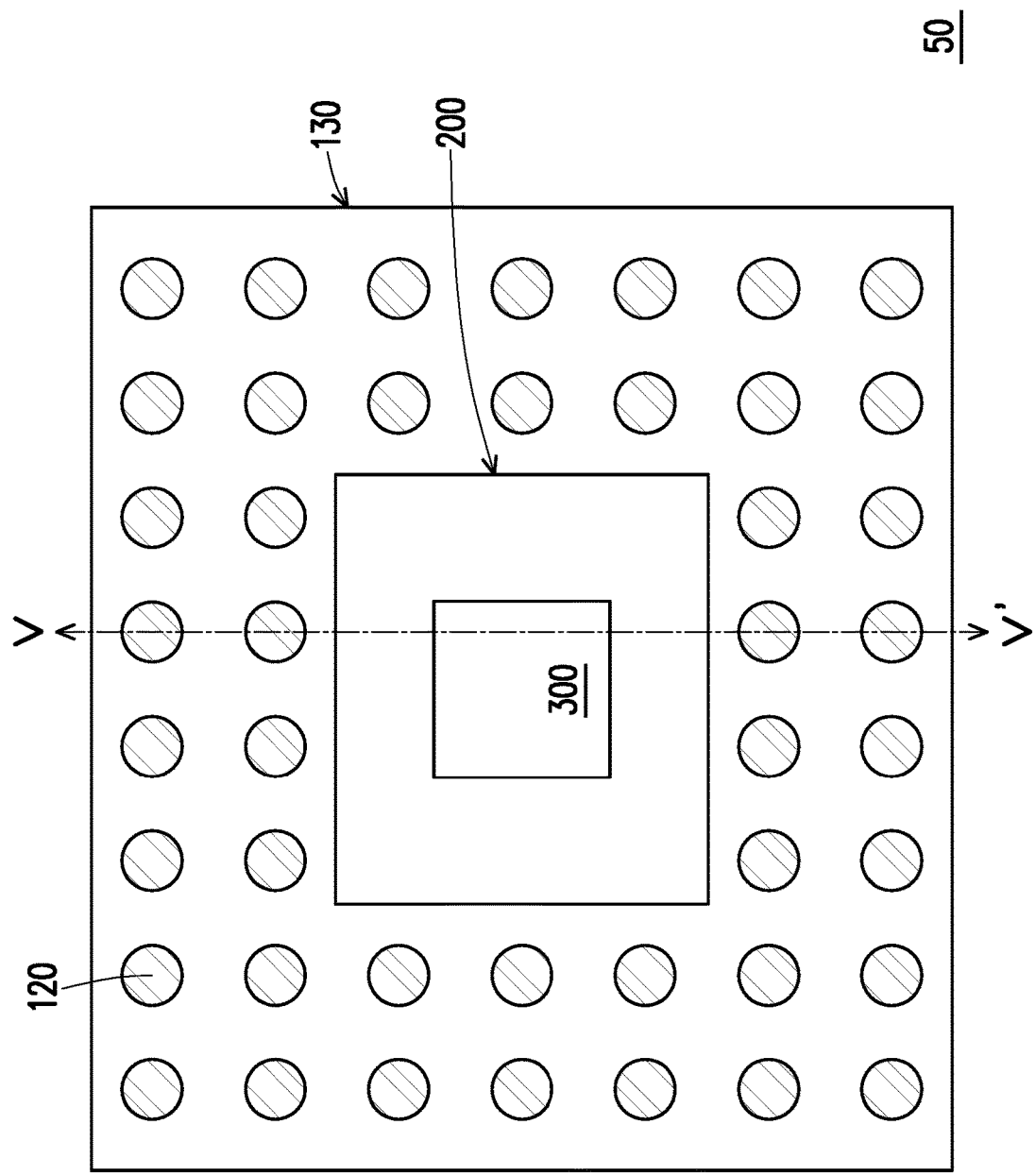
FIG. 36 is a schematic top view illustrating a relative position of semiconductor dies, conductive pillars and an insulating encapsulation in a semiconductor package in accordance with some embodiments of the disclosure.
Figure 37:
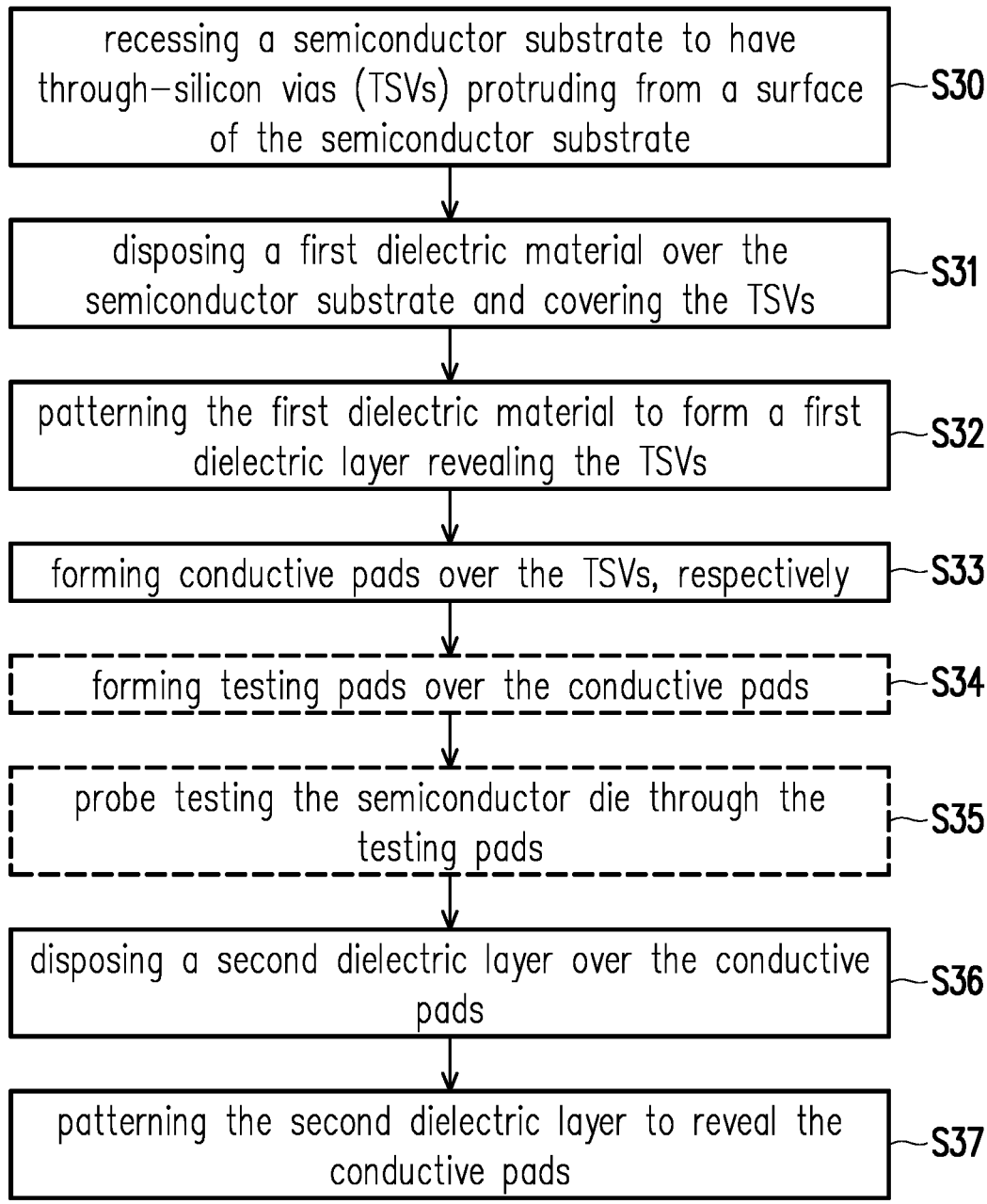
FIG. 37 is a flow chart illustrating a part of a method of manufacturing a semiconductor package in accordance with some embodiments of the disclosure.

FIG. 28 through FIG. 35 are schematic cross-sectional views showing a method of manufacturing a semiconductor package in accordance with some embodiments of the disclosure. FIG. 36 is a schematic top view illustrating a relative position of semiconductor dies, conductive pillars and an insulating encapsulation in a semiconductor package in accordance with some embodiments of the disclosure. FIG. 37 is a flow chart illustrating a portion of a method of manufacturing a semiconductor package in accordance with some embodiments of the disclosure. Like elements are designated with the same reference numbers for ease of understanding and the details thereof are not repeated herein. For example, FIG. 35 is the schematic cross-sectional view of a semiconductor package 40 taken along a cross-sectional line V-V' depicted in FIG. 36.

Figure 28:
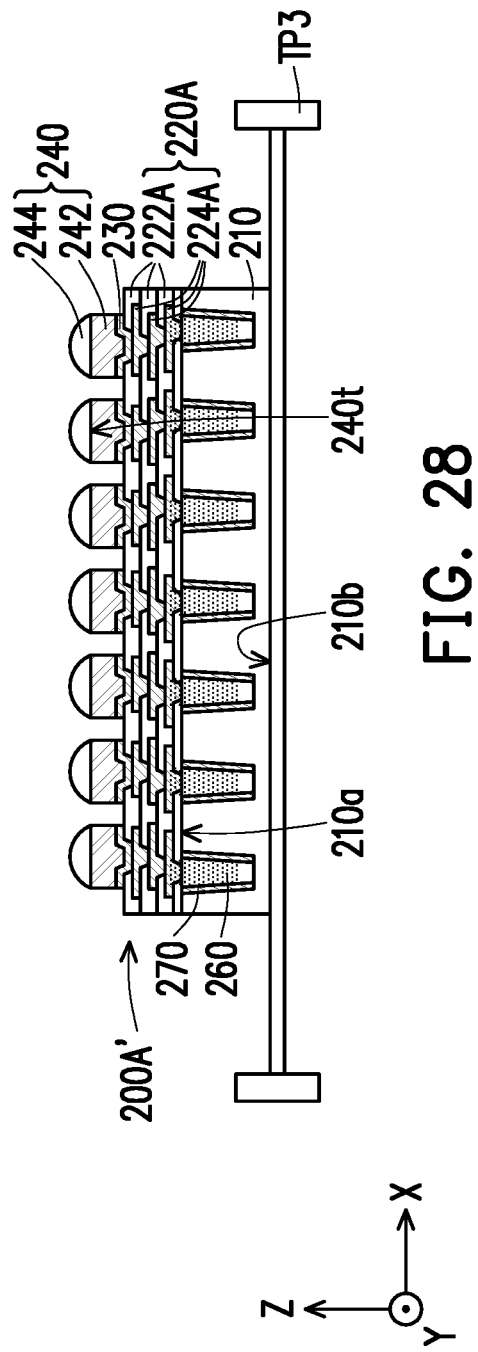
FIG. 28 through FIG. 35 are schematic cross-sectional views showing a method of manufacturing a semiconductor package in accordance with some embodiments of the disclosure.

Referring to FIG. 28, in some embodiments, a fourth wafer (not shown) including a plurality of semiconductor dies 200A' is provided over a tape frame TP4, and a dicing process is performed to cut the third wafer along a cutting line (shown as the dotted line in FIG. 28) into individual and separated semiconductor dies 200A'. Only one semiconductor die 200A' is shown in FIG. 28 for illustrative purposes and for simplicity; the disclosure is not limited thereto. In one embodiment, the dicing process is a wafer dicing process including mechanical blade sawing or laser cutting. In some embodiments, before dicing/singulating, the semiconductor dies 400 included in the third wafer are tested for functionality and performance by probing, and only known good dies (KGDs) from the tested semiconductor dies 200A' are selected and used for subsequently processing. The semiconductor dies 200A' included in the third wafer may have an arrangement similar to or the same as the arrangement of the semiconductor dies 200' included in the first wafer as described in FIG. 1, and thus are not repeated herein.

In some embodiments, as shown in FIG. 28, the semiconductor die 200A' includes a semiconductor substrate 210 having semiconductor devices (not shown) formed therein, an interconnect structure 220 formed on the semiconductor substrate 210, a plurality of connecting pads 230 formed on the interconnect structure 220, a plurality of connecting connectors 240 formed on the connecting pads 230, a plurality of conductive pillars 260 formed (embedded) in the semiconductor substrate 210. In some embodiments, each of the conductive pillars 260 is covered by a liner 270. In some embodiments, the semiconductor substrate 210 includes the semiconductor devices formed therein or thereon, where the semiconductor devices include active devices (e.g., transistors, diodes, etc.) and/or passive devices (e.g., capacitors, resistors, inductors, etc.), or other suitable electrical components. In some embodiments, the semiconductor devices are formed at an active surface 210a of the semiconductor substrate 210 proximal to the interconnect structure 220.

In some embodiments, the semiconductor substrate 210 has the active surface 210a and a bottom surface 210b opposite to the active surface 210a along the stacking direction Z of the interconnect structure 220 and the semiconductor substrate 210. For example, the interconnect structure 220 is disposed on and covers the active surface 210a of the semiconductor substrate 210. In some embodiments, the interconnect structure 220 includes one or more dielectric layers 222 and one or more metallization layers 224 in alternation. In some embodiments, the connecting pads 230 are disposed over and electrically coupled to the topmost layer of the metallization layers 224 of the interconnect structure 220 exposed by the passivation layer (e.g. the uppermost layer of the dielectric layers 222) of the interconnect structure 220. In some embodiments, as illustrated in FIG. 28, the connecting connectors 240 are respectively disposed on and electrically connected to the connecting pads 230 for providing an external electrical connection to the circuitry and semiconductor devices. In some embodiments, each of the connecting connectors 240 includes a connecting via 242 and a metal cap 244 disposed on a top surface 242t of the connecting via 242, where the metal cap 244 is electrically connected to the connecting via 242. In some embodiments, the conductive pillars 260 are embedded in the semiconductor substrate 210, and the liner 270 respectively at least cover sidewalls of the conductive pillars 260.

The formation and material of the semiconductor substrate 210, the interconnect structure 220, the connecting pads 230, the conductive pillars 260 and the liners 270 have been described in FIG. 1, and the formation and material of the connecting connectors 240 are similar to or identical to the formation and material of the connecting connectors 340 as described in FIG. 2; thus, are not repeated herein for brevity. In some embodiments, an outer surface of the topmost layer of the dielectric layer 222 and an outer surface of the topmost layer of the metallization layers 224 exposing by the connecting pads 230 and the connecting connectors 240 may be referred to as a front-side surface FS4 of the semiconductor die 200A'. In some embodiments, the connecting connectors 240 are referred to as micro-bumps.

Figure 29:
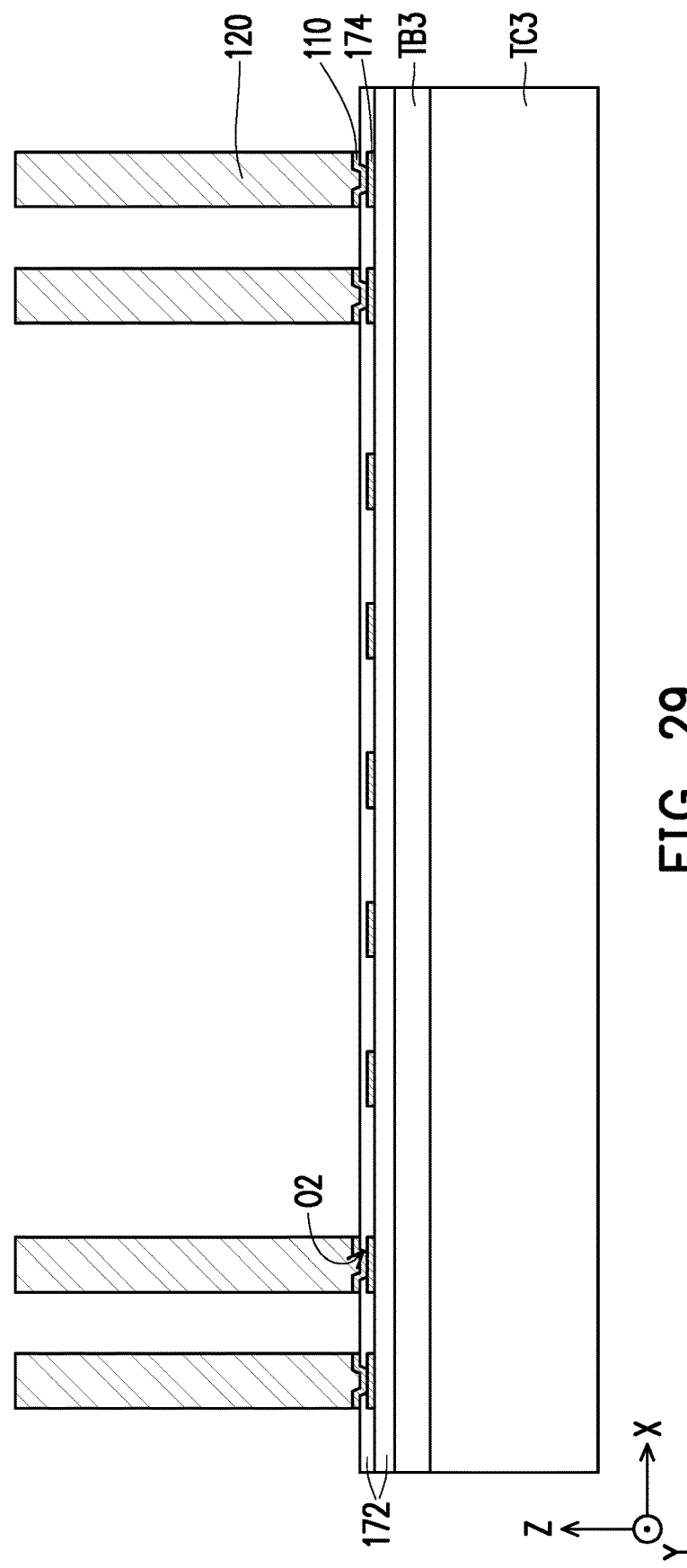

Referring to FIG. 29, in some embodiments, a temporary carrier TC3 having a temporary bonding layer TB3 and a redistribution circuits structure 170 formed thereon is provided. The formation and material of the temporary carrier TC3 are identical to the formation and material of the temporary carrier TC1 as described in FIG. 3, and the formation and material of the temporary bonding layer TB3 are identical to the formation and material of the temporary bonding layer TB1 as described in FIG. 3, and thus are not repeated herein for simplicity. In some embodiments, the redistribution circuit structure 170 is formed on the temporary bonding layer TB3. In some embodiments, the redistribution circuit structure 170 is fabricated to electrically connect with one or more connectors overlying thereon.

In some embodiments, the redistribution circuit structure 170 includes one or more inter-dielectric layers 172 and one or more patterned redistribution conductive layers 174 arranged in alteration. Only one patterned redistribution conductive layer 174 and two inter-dielectric layers 172 are shown in FIG. 29 for illustrative purposes, however the disclosure is not limited thereto. For example, as shown in FIG. 29, the patterned redistribution conductive layer 174 is sandwiched between the inter-dielectric layers 172, where a top surface of the patterned redistribution conductive layer 174 is exposed by a topmost layer of the inter-dielectric layers 172 and physically connected to with one or more overlying connectors, and a bottom surface of the patterned redistribution conductive layer 174 is covered by a bottommost layer of the inter-dielectric layers 172. The numbers of the inter-dielectric layer 172 and of the patterned redistribution conductive layer 174 are not limited according to the disclosure, and may selected and designated based on the demand and design layout. In some embodiments, the patterned redistribution conductive layer 174 may be referred to as a redistribution layer, while the inter-dielectric layers 172 may together be referred to as a dielectric structure. The formation and material of the inter-dielectric layers 172 are identical to the formation and material of the inter-dielectric layers 142 as described in FIG. 13, and the formation and material of the patterned redistribution conductive layer 174 are identical to the formation and material of the patterned redistribution conductive layers 144 as described in FIG. 13, and thus are not repeated herein for simplicity.

Continued on FIG. 29, after the formation of the redistribution circuit structure 170, a plurality of through vias 120 are formed on and electrically connected the redistribution circuit structure 170. For example, the through vias 120 each includes a first pattern 110 and a conductive pillar 120 connected thereto, where the conductive pillar 120 is electrically connected to the patterned redistribution conductive layer 174 through the first pattern 110. The first patterns 110 may be referred to as seed layer patterns of the conductive pillars 120.

The formation of the through vias CP may include, but not limited to, by forming a seed layer material (not shown, but it's formation and material is similar to the process step and material of the seed layer material SLm as described in FIG. 4) over the redistribution circuit structure 170, where the seed layer material is in contact with portions of the patterned redistribution conductive layer 174 exposed by the topmost layer of the inter-dielectric layers 172; forming a patterned photoresist layer (not show, but it's formation and material is similar to the process step and material of the patterned photoresist layer PR1 as described in FIG. 5) having opening holes, where the opening holes overlap the seed layer material being in contact with the portions of the patterned redistribution conductive layer 174; forming a metallic material filling the opening holes to form the conductive pillars 120 by electroplating or deposition, where the material of the conductive pillars 120 has been described in FIG. 6; removing the patterned photoresist layer from the seed layer material; and patterning the seed layer material to form the first patterns 110 using the conductive pillars 120, where portions of the seed layer material not being covered by the conductive pillars 120 are removed. The patterned photoresist layer may be removed by acceptable ashing process and/or photoresist stripping process, such as using an oxygen plasma or the like. For example, the patterning process may include an etching process, such as a dry etching, a wet etching or a combination thereof.

Figure 30:
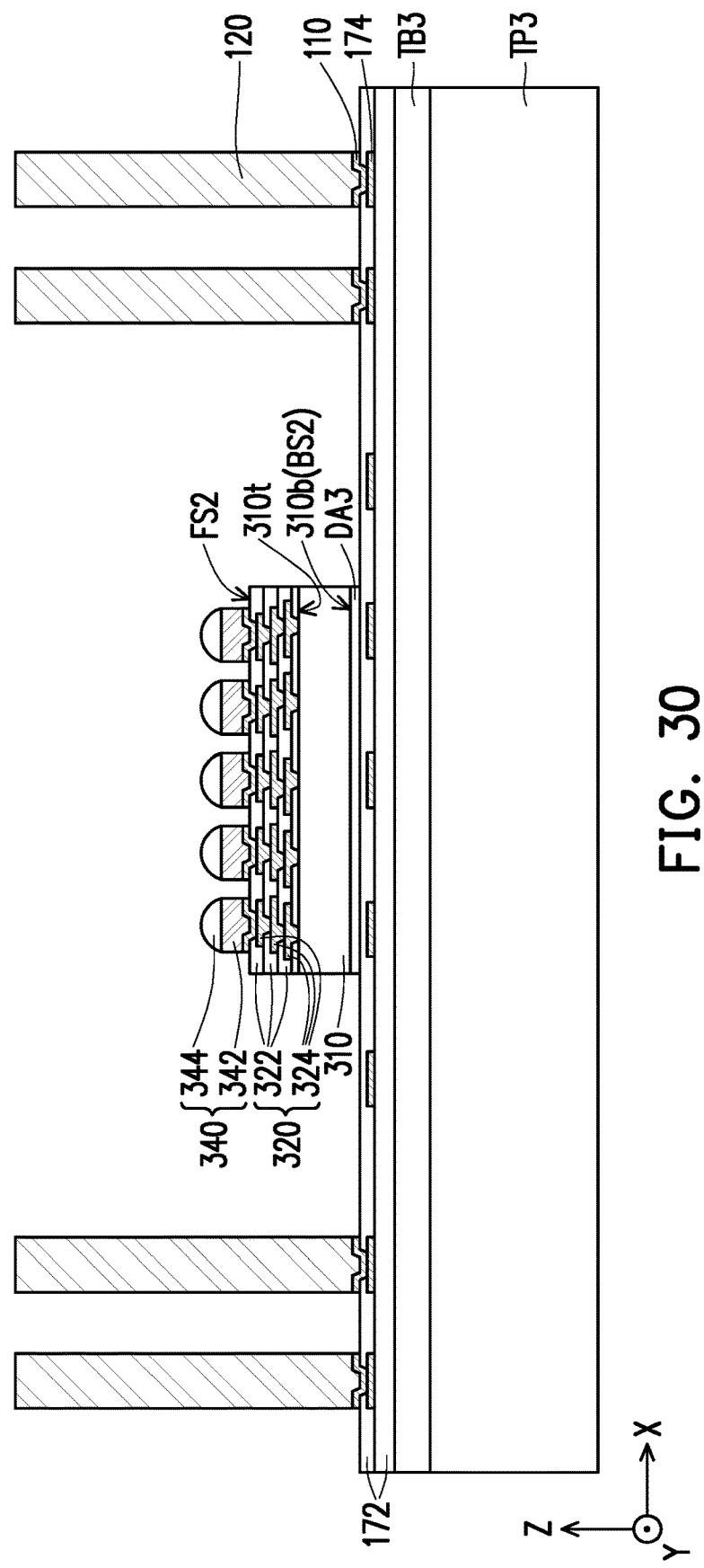

Referring to FIG. 30, in some embodiments, the semiconductor die 300 depicted in FIG. 2 is picked and placed on the redistribution circuit structure 170 and next to the through vias CP. In some embodiments, the semiconductor die 300 is disposed on the redistribution circuit structure 170 with a connecting film DA3. In other words, the bottom surface 310b of the semiconductor die 300 is adhered to the redistribution circuit structure 170 by the connecting film DA3. That is, the connecting film DA3 is sandwiched between the bottom surface 310b of the semiconductor die 300 and the redistribution circuit structure 170. Owing to the connecting film DA3, the semiconductor die 300 is stably adhered to the redistribution circuit structure 170. In some embodiments, the connecting film DA3 may be, but not limited to, a die attach film or a layer made of adhesives, epoxy-based resin, acrylic polymer, other suitable insulating material, or the like, and which may be with or without fillers filled therein (such as silica, alumina, or the like). In alternative embodiments, the connecting film DA3 may be omitted, the disclosure is not limited thereto. In some embodiments, the semiconductor die 300 are surrounded by the through vias CP, as shown in FIG. 30 and FIG. 37.

Figure 31:
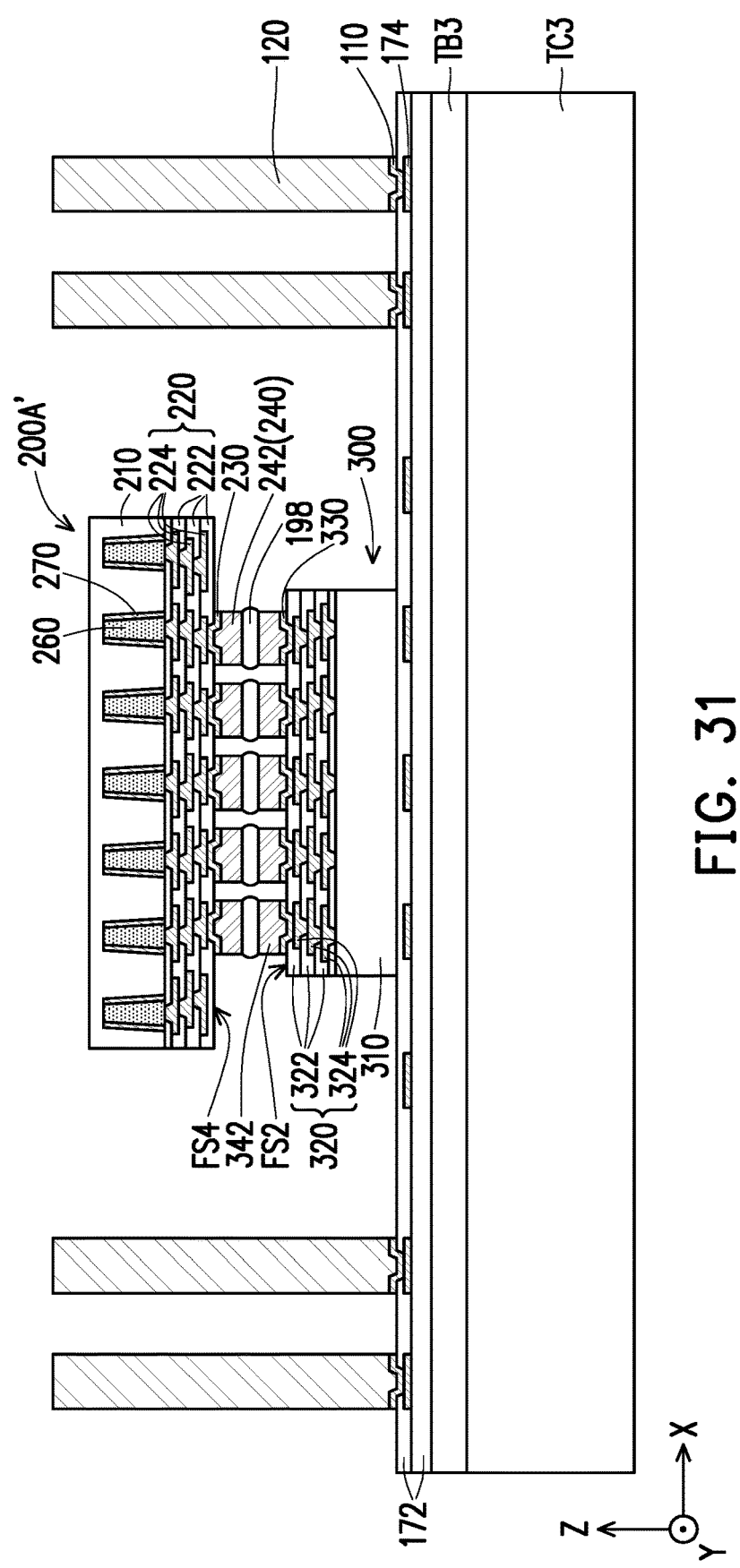

Referring to FIG. 31, in some embodiments, the semiconductor die 200A' depicted in FIG. 28 is picked and placed on the semiconductor die 300, where the semiconductor die 200A' is bonded to the semiconductor die 300 by flip chip bonding. For example, the semiconductor die 200A' is mounted to the semiconductor die 300, where the metal caps 244 of the semiconductor die 200 are physically connected to the metal caps 344 of the semiconductor die 300 to form a plurality of joints 198 connecting the connecting vias 242 of the semiconductor die 200A' and the connecting vias 342 of the semiconductor die 300. Through the joints 198, the semiconductor die 200A' and the semiconductor die 300 are electrically coupled and electrically communicated to each other. As shown in FIG. 31, for example, the semiconductor die 200A' is mounted to the semiconductor die 300 in a manner of face-to-face configuration (e.g., the front-side surface FS4 of the semiconductor die 200A' facing toward the front-side surface FS2 of the semiconductor die 300). In some embodiments, as shown in FIG. 31, the semiconductor die 200A' is overlapped with the semiconductor die 300 in the stacking direction Z of the temporary carrier TC3 and the semiconductor die 300 (or saying, the stacking direction of the semiconductor die 200A' and the semiconductor die 300).

Figure 32:
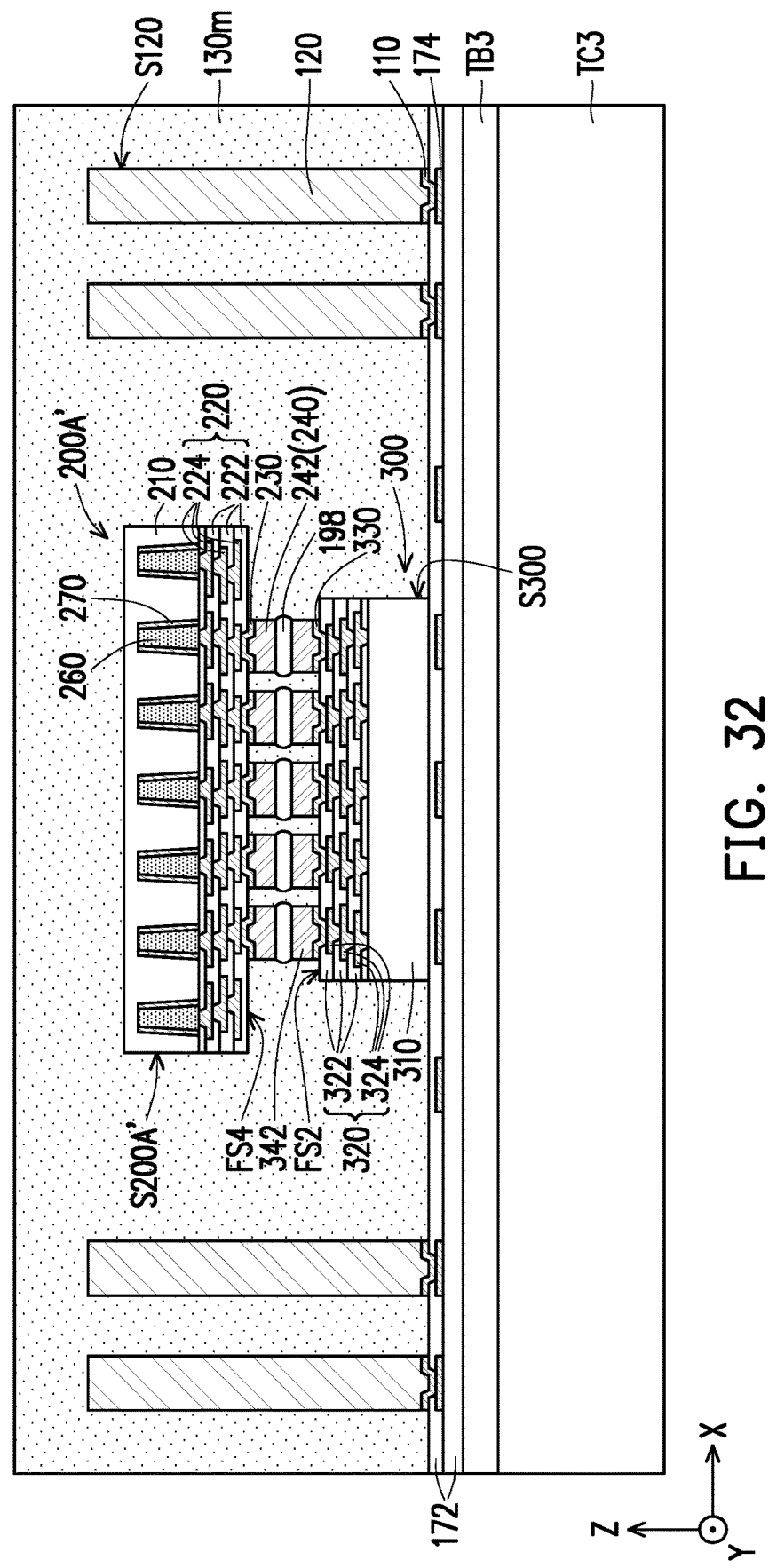

Referring to FIG. 32, in some embodiments, an insulating encapsulant 130m is formed over the temporary carrier TC3 to encapsulate the semiconductor die 200A', the semiconductor die 300 and the through vias CP. In some embodiments, the insulating encapsulant 130m at least fills up the gaps between the semiconductor dies 200A', 300 and the through vias CP and between the semiconductor dies 200A' and 300. In other words, the semiconductor die 200A', the semiconductor die 300, the joints 198 and the through vias CP (including the conductive pillars 120 and the first patterns 110) are covered by and embedded in the insulating encapsulant 130m. As shown in FIG. 32, for example, sidewalls of the joints 198, sidewalls of the connecting vias 242 and sidewalls of the connecting vias 342 are covered by the insulating encapsulant 130m. On the other hands, a sidewall S200A' of the semiconductor die 200A', a sidewall S300 and the bottom surface 310b of the semiconductor die 300 and illustrated top surfaces and sidewalls S120 of the conductive pillars 120 are completely covered by the insulating encapsulant 130m. The detail of the insulating encapsulant 130m has been described in FIG. 10, and thus is omitted herein for brevity.

Referring to FIG. 33, in some embodiments, the insulating encapsulant 130m and the semiconductor die 200A' are planarized to form an insulating encapsulant 130 and a thinned semiconductor die 200A", where the insulating encapsulant 130 exposes the thinned semiconductor die 200A" and the through vias CP (e.g., the conductive pillars 120). In some embodiments, after the planarization, a bottom surface 210b' of the thinned semiconductor die 200A" and the top surfaces 120t of the conductive pillars 120 are exposed by the surface 130t of the insulating encapsulation 130. For example, the bottom surface 210b' of the thinned semiconductor die 200A" and the top surfaces 120t of the conductive pillars 120 become substantially leveled with the surface 130t of the insulating encapsulation 130. That is, the bottom surface 210b' of the thinned semiconductor die 200A" and the top surfaces 120t of the conductive pillars 120 are substantially coplanar to the surface 130t of the insulating encapsulation 130. In some embodiments, as shown in FIG. 33, the thinned semiconductor die 200A" and the conductive pillars 120 (of the through vias CP) are accessibly revealed by the insulating encapsulation 130.

The insulating encapsulation 130m and the semiconductor die 200A' may be planarized by mechanical grinding, CMP or a combination thereof, for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 130m and the semiconductor die 200A', the conductive pillars 120 may also be planarized. In certain embodiments, the planarizing step may be, for example, performed on the over-molded insulating encapsulation 130m to level the surface 130t of the insulating encapsulation 130, the bottom surface 210b' of the thinned semiconductor die 200A" (along with the bottom surfaces 260b of the conductive pillars 260 and the bottom surface 270b of the liners 270) and the top surfaces 120t of the conductive pillars 120. In the thinned semiconductor die 200A", the conductive pillars 260, which penetrate through the semiconductor substrate 210, are referred to as through semiconductor vias (TSVs) or through silicon vias when the semiconductor substrate 210 is a silicon substrate.

Referring to FIG. 34, in some embodiments, a semiconductor die 200A is formed in the insulating encapsulation 130 and next to the through vias CP, and a plurality of conductive pads 282, 284 and a dielectric layer 296 are formed on the semiconductor die 200A, the through vias CP and the insulating encapsulation 130. For example, the conductive pads 282 are electrically connected to the semiconductor die 200A through connecting to the conductive pillars 260, and the conductive pads 284 are electrically connected to the through vias CP through the conductive pillars 260, where the dielectric layer 296 laterally covers sidewalls of the conductive pads 282 and sidewalls of conductive pads 284. In some embodiments, as shown in FIG. 34, top surfaces 282t conductive pads 282, top surfaces 284t conductive pads 284 and a top surface 296t of the dielectric layer 296 are substantially coplanar to and leveled with each other. In addition, there is a high degree of coplanarity between the top surfaces 282t conductive pads 282, the top surfaces 284t conductive pads 284 and the top surface 296t of the dielectric layer 296, which is beneficial for the later-formed layers (such as a redistribution circuit structure).

The formation of the semiconductor die 200A, the conductive pads 282, 284 and the dielectric layer 296 may include, but not limited to, by patterning the semiconductor substrate 210 so as to from a recess R (step S30 of FIG. 37), such that the conductive pillars 260 partially protrude from a patterned bottom surface 210b" of the semiconductor substrate 210, where portions of each of the conductive pillars 260 protruding from the patterned bottom surface 210b" of the semiconductor substrate 210 is in the recess R and has a height H2 equivalent to the depth of the recess R; disposing a first dielectric layer material (not shown) over the semiconductor substrate 210 of the thinned semiconductor die 200A" and the insulating encapsulation 130 to cover the conductive pillars 260 (step S31 of FIG. 37); patterning the first dielectric layer material to form a dielectric layer 281 in the recess R to reveals the conductive pillars 260 (step S32 of FIG. 37), where the bottom surface 260b of the conductive pillars 260, the top surfaces 120t of the conductive pillars 120 (of the through vias CP) and the surface 130t of the insulating encapsulation 130 are exposed by the dielectric layer 281, thereby forming the semiconductor die 200A having a backside surface BS4 (e.g. the surface 281t of the dielectric layer 281); forming conductive pads 282, 284 over the conductive pillars 260 (step S33 of FIG. 37), where the conductive pads 282 respectively disposed on the conductive pillars 260 being exposed by the dielectric layer 281 and the conductive pads 284 respectively disposed on the conductive pillars 120 being exposed by the dielectric layer 281; disposing a second dielectric layer material (not shown) over the conductive pads 282, 284 (step S36 of FIG. 37), where the conductive pads 282, 284, the dielectric layer 281 and the insulating encapsulation 130 are covered by the second dielectric layer material; patterning the second dielectric layer material to form a dielectric layer 296 revealing the conductive pads 282, 284 (step S37 of FIG. 37), where sidewalls of the conductive pads 282, 284 and the surface 130t of the insulating encapsulation 130 and the surface 281t of the dielectric layer 281 exposed by the conductive pads 282, 284 are covered by the dielectric layer 296. As shown in FIG. 37, before step 36, steps S34 through S35 may be optionally performed to test the electrical connections between the conductive pads 282 and the semiconductor die 200A and between the conductive pads 284 and the through vias CP by probing. For example, in the method shown in FIG. 37, step S34 which forms testing pads (not shown) on the conductive pads 282, 284, following the process of step S33; and step S35, which probe-testing the semiconductor die 200A through the testing pads (and the conductive pads 284), where the through vias CP may also be tested (via the testing pads the conductive pads 284) during testing the semiconductor die 200A. In addition, the testing pads may be removed during patterning the second dielectric material layer.

In some embodiments, the height H2 of the portion of each of the conductive pillars 260 protruding from the patterned bottom surface 210b" of the semiconductor substrate 210 may approximately range from 1 μm to 15 μm. In an alternative embodiment, the height H2 may approximately range from 10 μm to 25 μm. As shown in FIG. 34, the liners 270 cover the entire sidewalls of the conductive pillars 260; however, the disclosure is not limited thereto. The liners 270 may be partially cover the sidewalls of the conductive pillars 260. In an embodiment (not shown), the liners 270 cover the sidewalls portions of the conductive pillars 260 being embedded in the semiconductor substrate 210. That is, for example, the liners 270, which are disposed on the sidewalls of the portions of the conductive pillars 260 protruding from the patterned bottom surface 210b of the semiconductor substrate 210, are removed during the patterning process. The disclosure is not limited thereto.

In some embodiments, the first and/or second dielectric layer material may be a dielectric material layer. In some embodiments, the first and/or second dielectric layer material may be a polymer layer which made of polyimide, polybenzoxazole (PBO), benzocyclobutene (BCB), or any other suitable polymer-based dielectric material. In some embodiments, the first and/or second dielectric layer material may be Ajinomoto Buildup Film (ABF), Solder Resist film (SR), or the like. In some embodiments, the first and/or second dielectric layer material may be formed by a suitable fabrication technique such as spin-coating, lamination, deposition, or the like. The patterning processes may include mechanical grinding, CMP or a combination thereof.

Referring to FIG. 35, in some embodiments, the steps described in FIG. 12 through FIG. 14 are performed on the structure depicted in FIG. 34 to form a semiconductor package 50. In some embodiments, as shown in FIG. 35 and FIG. 36, in the semiconductor package 50, the through vias CP, the semiconductor die 200A, the semiconductor die 300 and the joints 198 are encapsulated in the insulating encapsulation 130, where the through vias CP penetrate through the insulating encapsulation 130 and surround a die stack 5000 (having the semiconductor die 200A and the semiconductor die 300, and the insulating encapsulation 130 has two opposite side disposing with the redistribution circuit structure 140 (with the conductive terminals 150 and the semiconductor device 160 disposed on) and the package 800 (including the semiconductor dies 820a, 820b). For example, as shown in FIG. 35, a thickness T5000 of the die stack 5000 is approximately ranging from 100 μm to 300 μm. In some embodiments, the sidewall S140 of the redistribution circuit structure 140 is substantially aligned with the sidewall S130 of the insulating encapsulation 130. Owing to the configuration between the semiconductor dies 200A and 300 (e.g., face-to-face bonding), the manufacturing cost of the semiconductor package 50 can be further reduced as the process steps are less as compared to the configuration having face-to-back bonding. In addition, the thermal dissipating elements 180 may also be adopted in the semiconductor package 50; the disclosure is not limited thereto.

Figure 38:
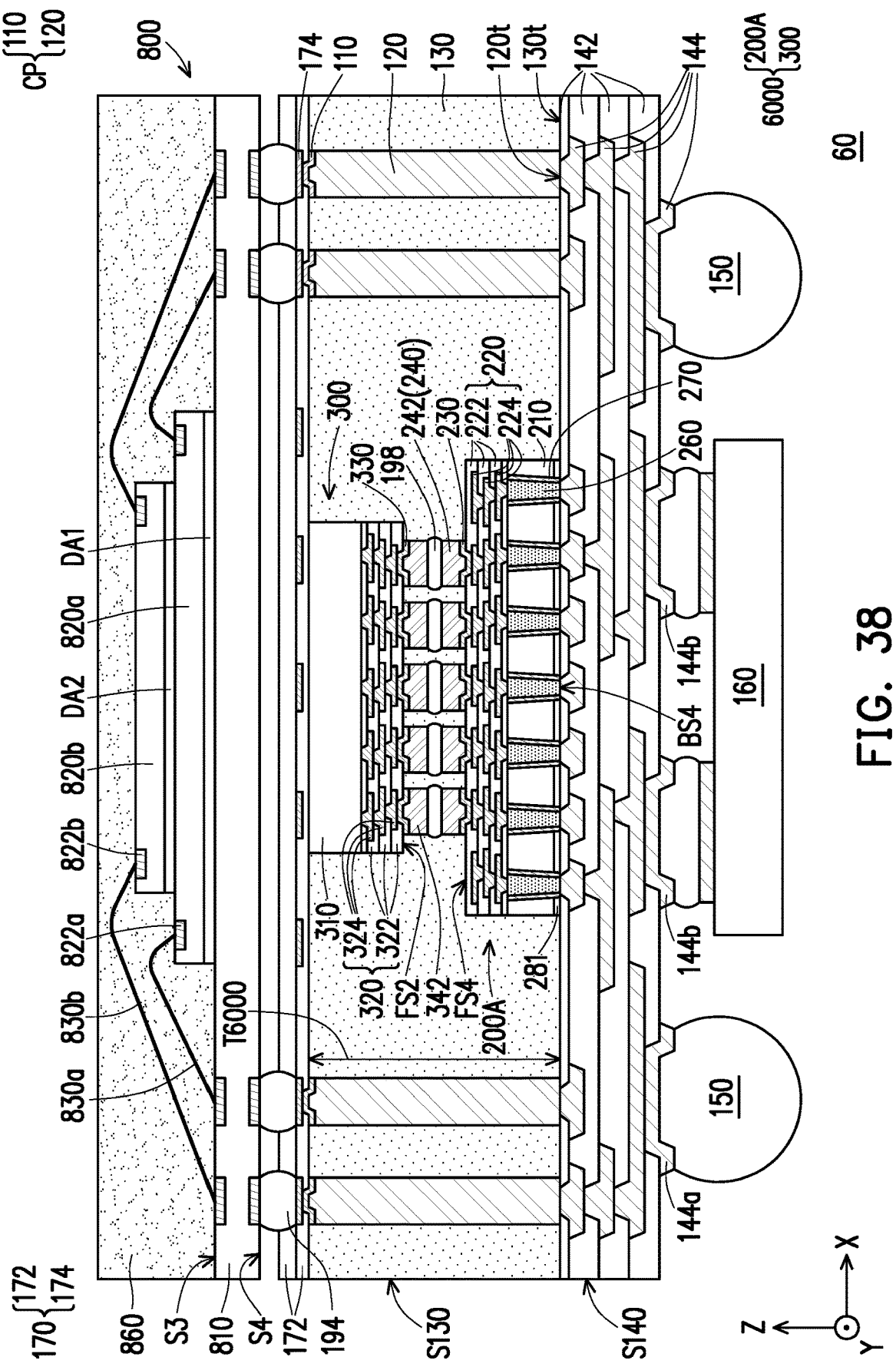
FIG. 38 is a schematic cross-sectional view showing a semiconductor package in accordance with some embodiments of the disclosure.

FIG. 38 is a schematic cross-sectional view showing a semiconductor package in accordance with some embodiments of the disclosure. Like elements are designated with the same reference numbers for ease of understanding and the details thereof are not repeated herein. The semiconductor package 60 depicted in FIG. 38 is similar to the semiconductor package 50 depicted in FIG. 35, the difference is that, the semiconductor package 60 excludes the presences of the conductive pads 282, 284 and the dielectric layer 296. As shown in FIG. 38, for example, in semiconductor package 60, the redistribution circuit structure 140 is directly formed on the semiconductor die 200A (e.g., the backside surface BS4), the through vias CP and the insulating encapsulation 130. In some embodiments, as shown in FIG. 38, the through vias CP penetrate through the insulating encapsulation 130 and surround a stack structure 6000 (having the semiconductor dies 200A and 300). For example, as shown in FIG. 38, a thickness T6000 of the stack structure 6000 is approximately ranging from 100 μm to 300 μm. In some embodiments, the sidewall S140 of the redistribution circuit structure 140 is substantially aligned with the sidewall S130 of the insulating encapsulation 130. In addition, the thermal dissipating elements 180 may also be adopted in the semiconductor package 60; the disclosure is not limited thereto.

In embodiments above, there is only one stacking structure included in one semiconductor package. However, the disclosure is not limited thereto; alternatively, more than one stacking structure (e.g. 1000, 2000, 3000, 4000, 5000 and 6000) may be included in one semiconductor package, such as more than one 1000 in one 10, more than one 2000 in one 20, more than one 3000 in one 30, more than one 4000 in one 40, more than one 5000 in one 50 and/or more than one 6000 in one 60. Similar to the semiconductor package 10, due to there is no interface between the insulating encapsulation 130 and an additional encapsulant (e.g., another molding compound or underfill), a better reliability of each of the semiconductor packages 20, 30, 40, 50, 60 can be achieved.

In accordance with some embodiments, a semiconductor package includes a first semiconductor die, a second semiconductor die, an insulating encapsulation and a plurality of conductive pillars. The second semiconductor die is located on and electrically communicated to the first semiconductor die through joints therebetween. The insulating encapsulation encapsulates the first semiconductor die and the second semiconductor die and covering the joints. The conductive pillars are located next to and electrically connected to the first semiconductor die and the second semiconductor die and are covered by the insulating encapsulation.

In accordance with some embodiments, a semiconductor package includes a first semiconductor die, a first redistribution circuit structure, a second semiconductor die, conductive pillars, an insulating encapsulation, a second redistribution circuit structure, and a sub-package. The first semiconductor die is located on the first redistribution circuit structure. The second semiconductor die is located on and electrically communicated to the first semiconductor die through conductive joints, where the second semiconductor die comprises a substrate and through-silicon vias penetrating therethrough. The conductive pillars are located next to and electrically connected to the first semiconductor die and the second semiconductor die. The insulating encapsulation encapsulates the first semiconductor die, the second semiconductor die and the conductive pillars, where the insulating encapsulation covers sidewalls of the conductive joints, and a surface of the insulating encapsulation is substantially coplanar with surfaces of the through-silicon vias and surfaces of plurality of conductive pillars. The second redistribution circuit structure is located at the surface of the insulating encapsulation and in contact with the through-silicon vias and the conductive pillars, where the insulating encapsulation is located between the first redistribution circuit structure and the second redistribution circuit structure. The sub-package comprises a memory die and is located on and connected to the second redistribution circuit structure, where the memory die is electrically communicated to the first semiconductor die and the second semiconductor die.

In accordance with some embodiments, a method of manufacturing a semiconductor package includes the following steps: forming a first semiconductor die having first connectors and conductive pillars over a carrier; disposing and mounting a second semiconductor die on the first semiconductor die through joints, the second semiconductor die electrically communicating the first semiconductor die; encapsulating the first semiconductor die, the conductive pillars and the second semiconductor die in an insulating encapsulation, the insulating encapsulation covering the joints; and forming a first redistribution circuit structure on a first side of the insulating encapsulation, the conductive pillars being electrically connected to the first semiconductor die and the second semiconductor die through the first redistribution circuit structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:
1. A semiconductor package, comprising:
   a first semiconductor die and a second semiconductor die, wherein the second semiconductor die is located on and electrically communicates to the first semiconductor die through joints therebetween;

a plurality of metallic fins, disposed on and thermally coupled to the first semiconductor die through seed layer patterns and next to the second semiconductor die;
an insulating encapsulation, encapsulating the first semiconductor die and the second semiconductor die and physically covering the joints; and
a plurality of conductive pillars, next to and electrically connected to the first semiconductor die and the second semiconductor die and covered by the insulating encapsulation,
wherein in a vertical projection along a stacking direction of the first semiconductor die and the second semiconductor die, the second semiconductor die is entirely overlapped with the first semiconductor die.

2. The semiconductor package of claim 1, wherein sidewalls of the plurality of conductive pillars are in contact with the insulating encapsulation.

3. The semiconductor package of claim 1, wherein sidewalls of the joints, a sidewall of the first semiconductor die and a sidewall of the second semiconductor die are in contact with the insulating encapsulation.

4. The semiconductor package of claim 1, wherein a surface of the first semiconductor die opposite to the second semiconductor die is substantially coplanar to a first surface of the insulating encapsulation, a surface of the second semiconductor die opposite to the first semiconductor die is substantially coplanar to a second surface of the insulating encapsulation, and the first surface is opposite to the second surface along the stacking direction of the first semiconductor die and the second semiconductor die.

5. The semiconductor package of claim 1, further comprising:
a first redistribution circuit structure, located at a first side of the insulating encapsulation and electrically connected to the first semiconductor die, the second semiconductor die and the plurality of conductive pillars, wherein a sidewall of the insulating encapsulation is substantially aligned with a sidewall of the first redistribution circuit structure;
conductive terminals, located on and electrically connected to the first redistribution circuit structure, wherein the first redistribution circuit structure is located between the insulating encapsulation and the conductive terminals; and
a sub-package comprising a third semiconductor die, located at a second side of the insulating encapsulation and electrically connected to the plurality of conductive pillars, wherein the first side is opposite to the second side.

6. The semiconductor package of claim 5, further comprising:
a second redistribution circuit structure, located between the sub-package and the insulating encapsulation and connected to the plurality of conductive pillars and the sub-package, wherein the sidewall of the insulating encapsulation is substantially aligned with a sidewall of the second redistribution circuit structure.

7. The semiconductor package of claim 1, wherein the plurality of metallic fins are arranged to surround the second semiconductor die.

8. The semiconductor package of claim 1, wherein the second semiconductor die comprises a die stack comprising at least two semiconductor dies electrically connected to and stacked on one another.

9. The semiconductor package of claim 1, wherein the second semiconductor die comprises a plurality of second semiconductor die disposed on the first semiconductor die in a configuration of side-by-side.

10. A semiconductor package, comprising:
a first semiconductor die, located on a first redistribution circuit structure;
a second semiconductor die, located on and electrically communicating to the first semiconductor die through conductive joints;
a plurality of metallic fins, disposed on and thermally coupled to the second semiconductor die and next to the first semiconductor die;
conductive pillars, next to and electrically connected to the first semiconductor die and the second semiconductor die;
an insulating encapsulation, encapsulating the first semiconductor die, the second semiconductor die and the conductive pillars, wherein the insulating encapsulation covers sidewalls of the conductive joints, and a surface of the insulating encapsulation is substantially coplanar with surfaces of the conductive pillars; and
a sub-package comprising a memory die, located on and connected to the first redistribution circuit structure, wherein the memory die electrically communicates to the first semiconductor die and the second semiconductor die,
wherein in a vertical projection along a stacking direction of the first semiconductor die and the second semiconductor die, the first semiconductor die is entirely overlapped with the second semiconductor die.

11. The semiconductor package of claim 10, wherein a sidewall of the insulating encapsulation is substantially aligned with a sidewall of the first redistribution circuit structure, and the first redistribution circuit structure is disposed between the memory die and the first semiconductor die.

12. The semiconductor package of claim 11, wherein the second semiconductor die comprises a substrate and through-silicon vias penetrating therethrough, and the surface of the insulating encapsulation is substantially coplanar with surfaces of the through-silicon vias, wherein the semiconductor package further comprises:
a second redistribution circuit structure, located at the surface of the insulating encapsulation and in contact with the through-silicon vias and the conductive pillars, wherein the insulating encapsulation is located between the first redistribution circuit structure and the second redistribution circuit structure, wherein the substrate of the second semiconductor die comprises a semiconductor substrate and is separated from the second redistribution circuit structure through a polyimide layer;
conductive pads, disposed between the second redistribution circuit structure and the insulating encapsulation and between the second redistribution circuit structure and the polyimide layer, wherein the conductive pads are respectively connected to the through-silicon vias and the conductive pillars; and
a dielectric layer, laterally wrapping sidewalls of the conductive pads,
wherein the second redistribution circuit structure is electrically connected to the through-silicon vias and the conductive pillars through the conductive pads, and
wherein the sidewall of the insulating encapsulation is substantially aligned with a sidewall of the second redistribution circuit structure.

13. The semiconductor package of claim 10, further comprising:

a plurality of metallic micro-pillars, disposed on and thermally coupled to the second semiconductor die and next to the first semiconductor die.

14. The semiconductor package of claim 10, wherein sidewalls of the plurality of metallic fins are in contact with the insulating encapsulation.

15. A semiconductor package, comprising:
a first semiconductor die;
a plurality of second semiconductor dies, stacked on and electrically communicates to the first semiconductor die, wherein in a plane view of the semiconductor package along a stacking direction of the first semiconductor die and the plurality of second semiconductor dies, the plurality of second semiconductor dies are confined within a perimeter of the first semiconductor die and are laterally arranged next to each other;
a plurality of metallic fins, disposed on and thermally coupled to the first semiconductor die and next to the plurality of second semiconductor dies; and
an insulating encapsulation, encapsulating the plurality of metallic fins, the first semiconductor die and the plurality of second semiconductor dies.

16. The semiconductor package of claim 15, further comprising:
a routing structure, disposed on a side of the insulating encapsulation and electrically coupled to the first semiconductor die and the plurality of second semiconductor dies,
wherein a sidewall of the insulating encapsulation is substantially aligned with a sidewall of the routing structure.

17. The semiconductor package of claim 16, further comprising:
a plurality of conductive pillars, standing on and electrically coupled to the routing structure and next to the first semiconductor die and the plurality of second semiconductor dies, the plurality of conductive pillars penetrating through the insulating encapsulation; and
a sub-package comprising a memory die, disposed over and electrically coupled to the routing structure through the plurality of conductive pillars, wherein the memory die electrically communicates to the first semiconductor die and the plurality of second semiconductor dies.

18. The semiconductor package of claim 15, further comprising:
a first routing structure, disposed on a first side of the insulating encapsulation and electrically coupled to the first semiconductor die and the plurality of second semiconductor dies; and
a second routing structure, disposed on a second side of the insulating encapsulation and electrically coupled to the first semiconductor die and the plurality of second semiconductor dies, the first side being opposing to the second side,
wherein a sidewall of the insulating encapsulation is substantially aligned with a sidewall of the first routing structure and a sidewall of the second routing structure.

19. The semiconductor package of claim 18, further comprising:
a plurality of conductive pillars, interposed between and electrically coupling the first routing structure and the second routing structure, the plurality of conductive pillars being next to the first semiconductor die and the plurality of second semiconductor dies and penetrating through the insulating encapsulation; and
a sub-package comprising a memory die, disposed on and electrically coupled to the second routing structure, wherein the memory die electrically communicates to the first semiconductor die and the plurality of second semiconductor dies.

20. The semiconductor package of claim 15, wherein the plurality of metallic fins are arranged to surround the plurality of second semiconductor dies.

* * * * *